United States Patent
Imai et al.

(10) Patent No.: US 12,324,150 B2
(45) Date of Patent: Jun. 3, 2025

(54) METHOD OF MAKING A MULTI-TIER MEMORY DEVICE WITH ROUNDED JOINT STRUCTURES

(71) Applicant: SANDISK TECHNOLOGIES LLC, Addison, TX (US)

(72) Inventors: Tsutomu Imai, Yokkaichi (JP); Nao Nagase, Yokkaichi (JP); Chiko Kudo, Yokkaichi (JP); Sadao Fukuno, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 433 days.

(21) Appl. No.: 17/660,265

(22) Filed: Apr. 22, 2022

(65) Prior Publication Data
US 2023/0345716 A1  Oct. 26, 2023

(51) Int. Cl.
*H10B 41/27* (2023.01)
*H01L 23/528* (2006.01)
*H10B 41/10* (2023.01)
*H10B 41/35* (2023.01)
*H10B 41/50* (2023.01)
*H10B 43/10* (2023.01)
*H10B 43/27* (2023.01)
*H10B 43/35* (2023.01)
*H10B 43/50* (2023.01)

(52) U.S. Cl.
CPC ......... *H10B 41/27* (2023.02); *H01L 23/5283* (2013.01); *H10B 41/10* (2023.02); *H10B 41/35* (2023.02); *H10B 41/50* (2023.02); *H10B 43/10* (2023.02); *H10B 43/27* (2023.02); *H10B 43/35* (2023.02); *H10B 43/50* (2023.02)

(58) Field of Classification Search
CPC ........ H10B 41/10; H10B 41/27; H10B 41/35; H10B 41/50; H10B 43/10; H10B 43/27; H10B 43/35; H10B 43/50
See application file for complete search history.

(56) References Cited

U.S. PATENT DOCUMENTS 5,915,167 A   6/1999  Leedy
8,884,357 B2  11/2014 Wang et al.
(Continued)

FOREIGN PATENT DOCUMENTS

JP   2010-161305   7/2010

OTHER PUBLICATIONS

USPTO Office Communication, Non Final Office Action for U.S. Appl. No. 17/660,278, mailed on Sep. 23, 2024, 21 pages.
(Continued)

*Primary Examiner* — Yara B Green
*Assistant Examiner* — Christopher M Roland
(74) *Attorney, Agent, or Firm* — THE MARBURY LAW GROUP PLLC

(57) ABSTRACT

A sacrificial memory opening fill structure for a multi-tier memory device may include a semiconductor fill material portion a metallic fill material portion to enhance control of a vertical cross-sectional profile of an inter-tier memory opening. Multiple inter-tier dielectric layers may be employed to reduce sharp corners in a memory opening fill structure. Alternatively or additionally, a combination of an isotropic etch process followed by an anisotropic etch process may be used to form a first-tier memory opening.

6 Claims, 74 Drawing Sheets

(56) References Cited

U.S. PATENT DOCUMENTS

| | | |
|---|---|---|
| 8,946,023 B2 | 2/2015 | Makala et al. |
| 9,224,752 B1 | 12/2015 | Lee et al. |
| 9,230,987 B2 | 1/2016 | Pachamuthu et al. |
| 9,343,358 B1 | 5/2016 | Xu |
| 9,502,471 B1 | 11/2016 | Lu et al. |
| 9,570,463 B1 | 2/2017 | Zhang et al. |
| 9,627,403 B2 | 4/2017 | Liu et al. |
| 9,728,551 B1 | 8/2017 | Lu et al. |
| 9,768,192 B1 | 9/2017 | Nakamura |
| 9,780,034 B1 | 10/2017 | Tsutsumi et al. |
| 9,871,052 B2 | 1/2018 | Lee |
| 9,991,280 B2 | 6/2018 | Nakamura et al. |
| 10,056,399 B2 | 8/2018 | Costa et al. |
| 10,355,012 B2 | 7/2019 | Shimabukuro et al. |
| 10,381,434 B1 | 8/2019 | Pachamuthu et al. |
| 10,475,879 B1 | 11/2019 | Pachamuthu et al. |
| 10,600,802 B2 | 3/2020 | Nakamura et al. |
| 10,658,377 B2 | 5/2020 | Kubo et al. |
| 10,700,089 B1 | 6/2020 | Hojo et al. |
| 10,748,925 B1 | 8/2020 | Tsutsumi et al. |
| 10,964,715 B2 | 3/2021 | Kakazu et al. |
| 11,296,101 B2 | 4/2022 | Lee et al. |
| 2004/0042323 A1 | 3/2004 | Moshayedi |
| 2007/0259570 A1 | 11/2007 | Moshayedi |
| 2007/0296021 A1 | 12/2007 | Sugiyama et al. |
| 2011/0287612 A1 | 11/2011 | Lee et al. |
| 2012/0001247 A1 | 1/2012 | Alsmeier |
| 2012/0001252 A1 | 1/2012 | Alsmeier et al. |
| 2012/0003800 A1 | 1/2012 | Lee et al. |
| 2012/0198591 A1 | 8/2012 | Ohnesorge |
| 2013/0010558 A1 | 1/2013 | Chang et al. |
| 2013/0130468 A1 | 5/2013 | Higashitani et al. |
| 2014/0252454 A1 | 9/2014 | Rabkin et al. |
| 2014/0273373 A1 | 9/2014 | Makala et al. |
| 2015/0016242 A1 | 1/2015 | Ernstrom et al. |
| 2015/0155296 A1 | 4/2015 | Yoon |
| 2015/0294978 A1 | 10/2015 | Lu et al. |
| 2017/0062454 A1 | 3/2017 | Lu et al. |
| 2017/0229472 A1 | 8/2017 | Lu et al. |
| 2017/0236835 A1 | 8/2017 | Nakamura et al. |
| 2017/0243879 A1 | 8/2017 | Yu et al. |
| 2017/0271261 A1 | 9/2017 | Tsutsumi et al. |
| 2017/0271352 A1 | 9/2017 | Nakamura |
| 2017/0358593 A1 | 12/2017 | Yu et al. |
| 2018/0006049 A1 | 1/2018 | Inomata et al. |
| 2018/0182771 A1 | 6/2018 | Costa et al. |
| 2018/0331117 A1 | 11/2018 | Titus et al. |
| 2018/0374865 A1 | 12/2018 | Shimabukuro et al. |
| 2019/0280000 A1 | 9/2019 | Nakamura et al. |
| 2020/0006373 A1 | 1/2020 | Kubo et al. |
| 2020/0119038 A1* | 4/2020 | Hopkins ................ H10B 43/27 |
| 2020/0251486 A1 | 8/2020 | Tsutsumi et al. |
| 2020/0295040 A1 | 9/2020 | Tobioka |
| 2021/0159149 A1 | 5/2021 | Kitazawa |
| 2021/0249261 A1* | 8/2021 | Hopkins ........... H01L 21/02164 |
| 2021/0305266 A1 | 9/2021 | Lee et al. |
| 2024/0371761 A1* | 11/2024 | Zhou ................... H01L 23/5283 |

OTHER PUBLICATIONS

Nagase, N. et al., "Multi-Tier Memory Device With Rounded Joint Structures and Methods of Making the Same," U.S. Appl. No. 17/660,278, filed Apr. 22, 2022.

Endoh et al., "Novel Ultra High Density Memory with a Stacked-Surrounding Gate Transistor (S-SGT) Structured Cell," IEDM Proc. (2001) 33-36.

Hammond, M. L., "Silicon Epitaxy by Chemical Vapor Deposition," pp. 45-106.

Csepregi, L. et al., "Substrate-Orientation Dependence of the Epitaxial Regrowth Rate from Si-Implanted Amorphous Si," Journal of Applied Physics, vol. 49, No. 7, pp. 3906-3911 (1978).

Seidel, H. et al., "Anisotropic Etching of Crystalline Silicon in Alkaline Solutions," J. Electrochem. Soc., vol. 137, No. 11, pp. 3612-3626, (1990).

Non-Final Office Communication for U.S. Appl. No. 15/071,575, dated Nov. 16, 2016, 13 pages.

Invitation to Pay Additional Fees from the International Searching Authority for International Patent Application No. PCT/US2017/017823, dated May 4, 2017, 18 pages.

International Application No. PCT/US2017/017823, International Search Report and Written Opinion, issued Jul. 5, 2017, 24pgs.

U.S. Appl. No. 17/166,357, filed Feb. 3, 2021, Sandisk Technologies LLC.

U.S. Appl. No. 17/169,987, filed Feb. 8, 2021, Sandisk Technologies LLC.

U.S. Appl. No. 17/189,153, filed Mar. 1, 2021, Sandisk Technologies LLC.

U.S. Appl. No. 17/510,807, filed Oct. 26, 2021, Sandisk Technologies LLC.

U.S. Appl. No. 17/715,662, filed Apr. 7, 2022, Sandisk Technologies LLC.

* cited by examiner

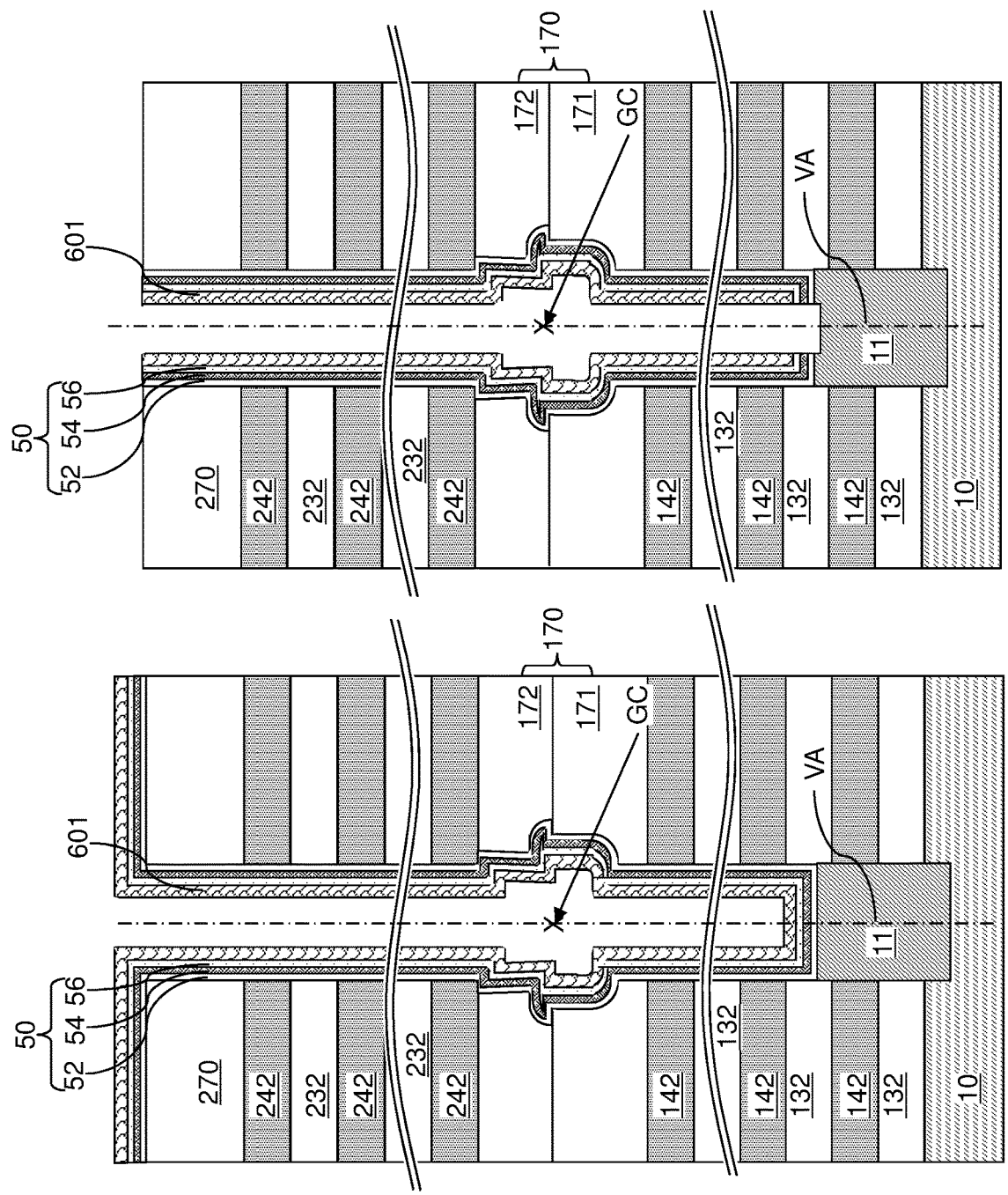

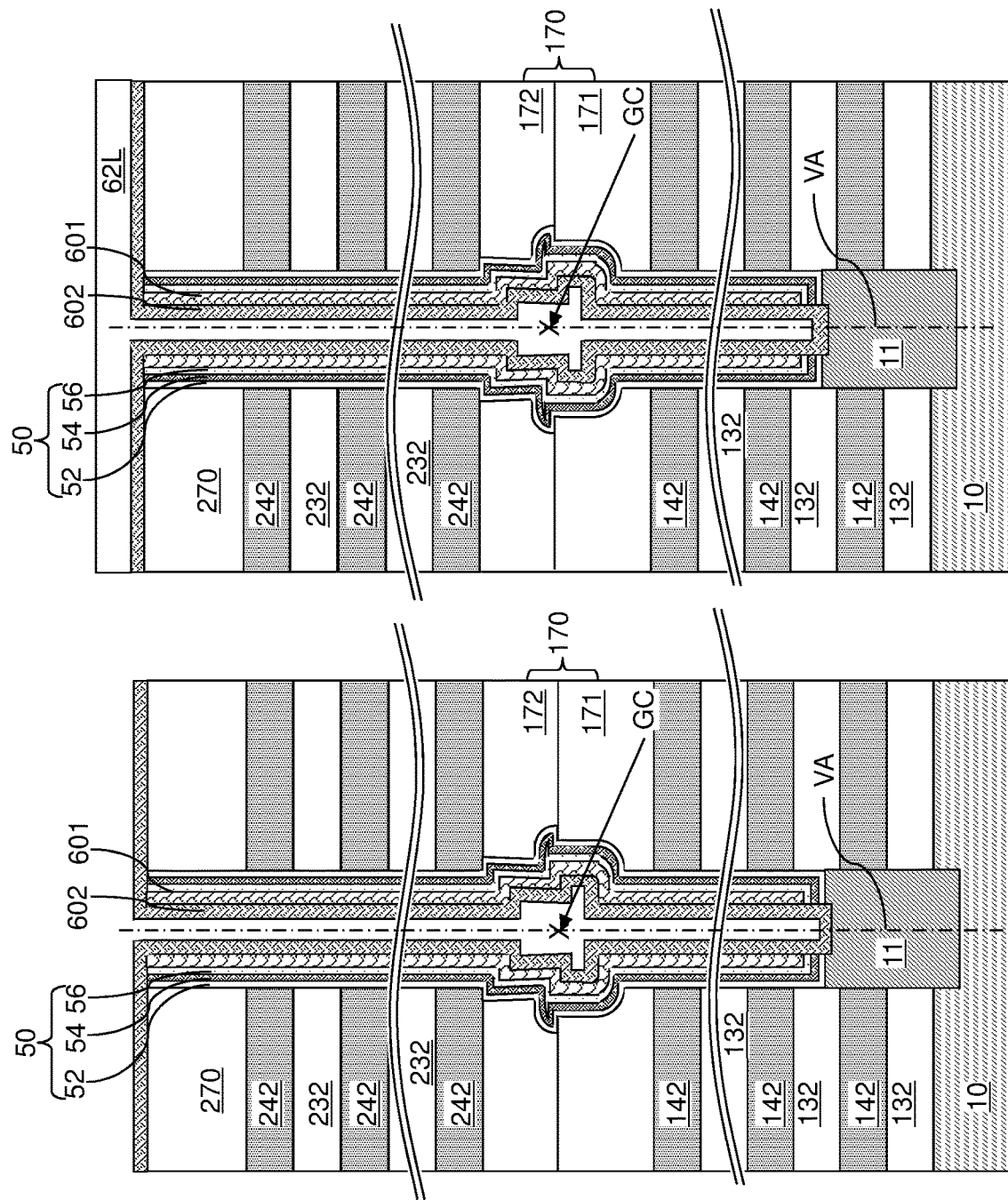

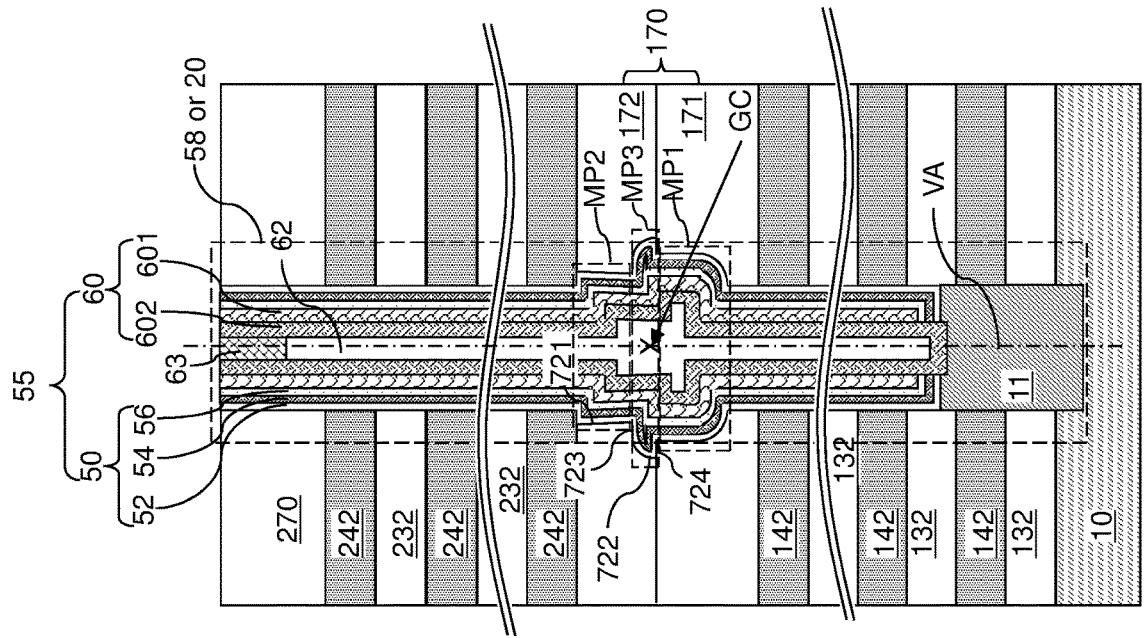
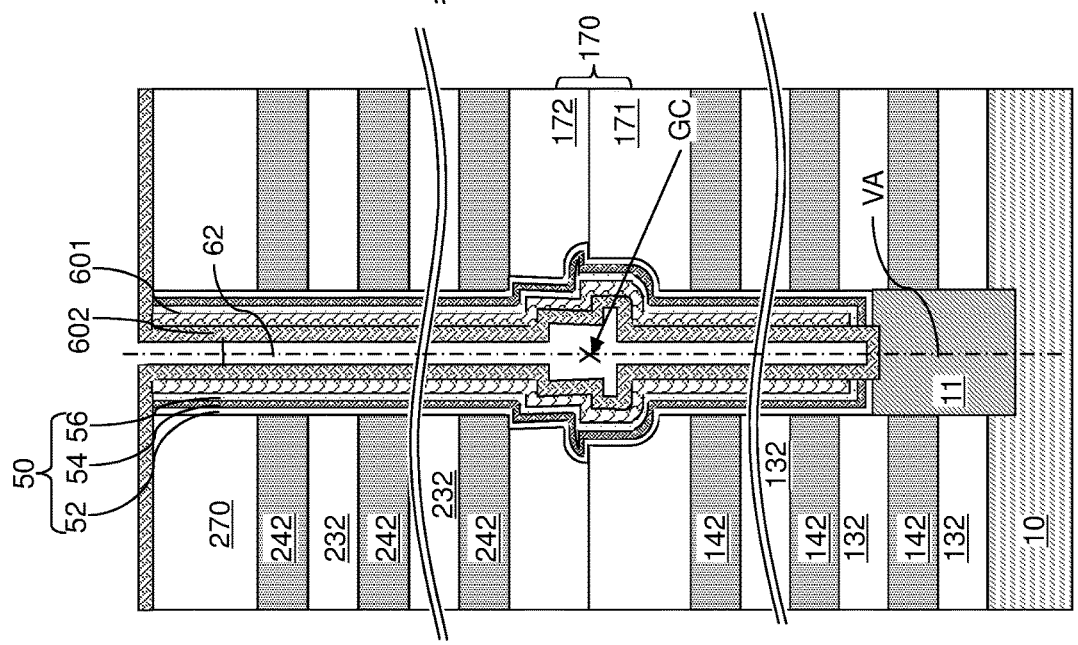
FIG. 11H
FIG. 11G

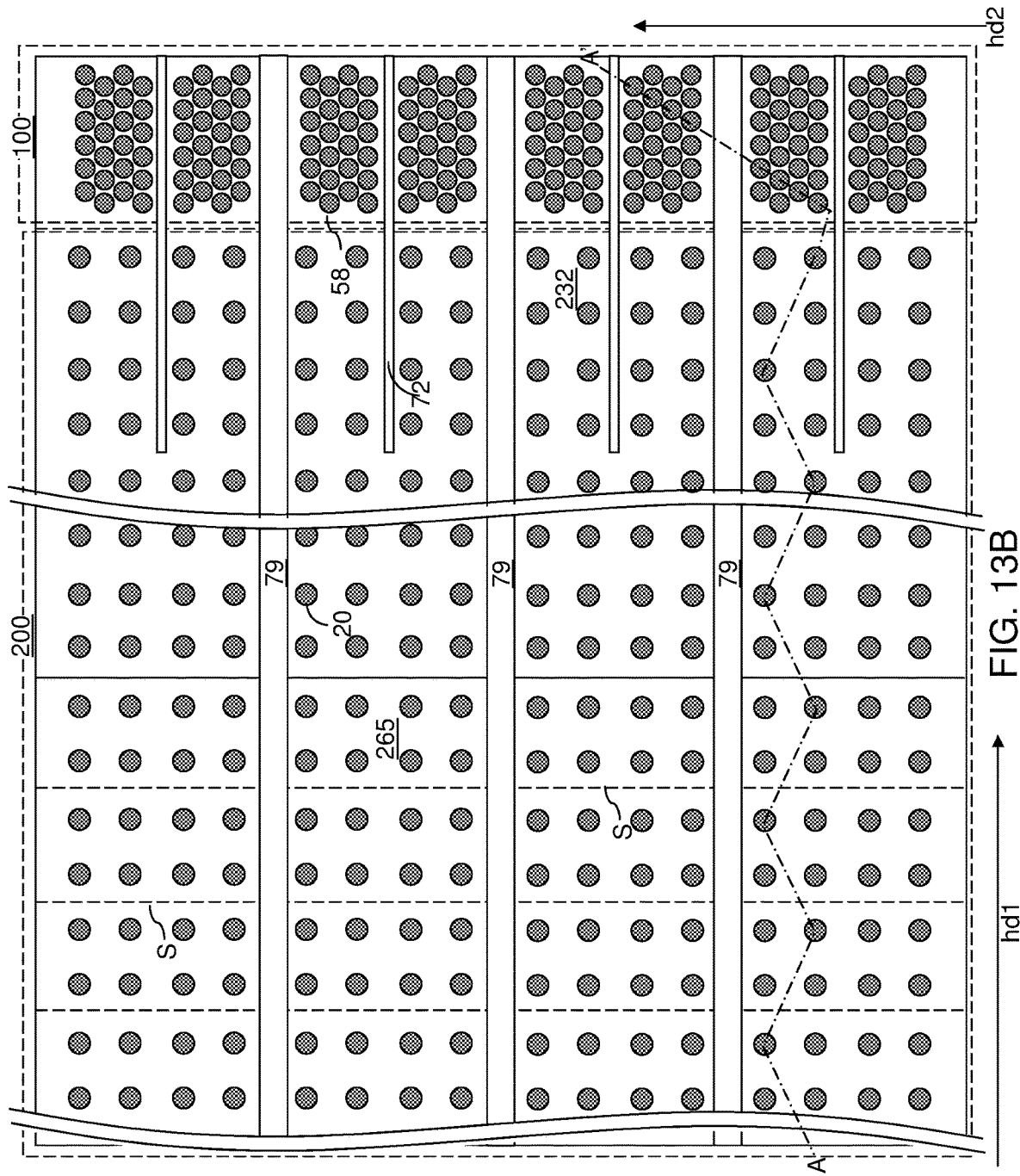

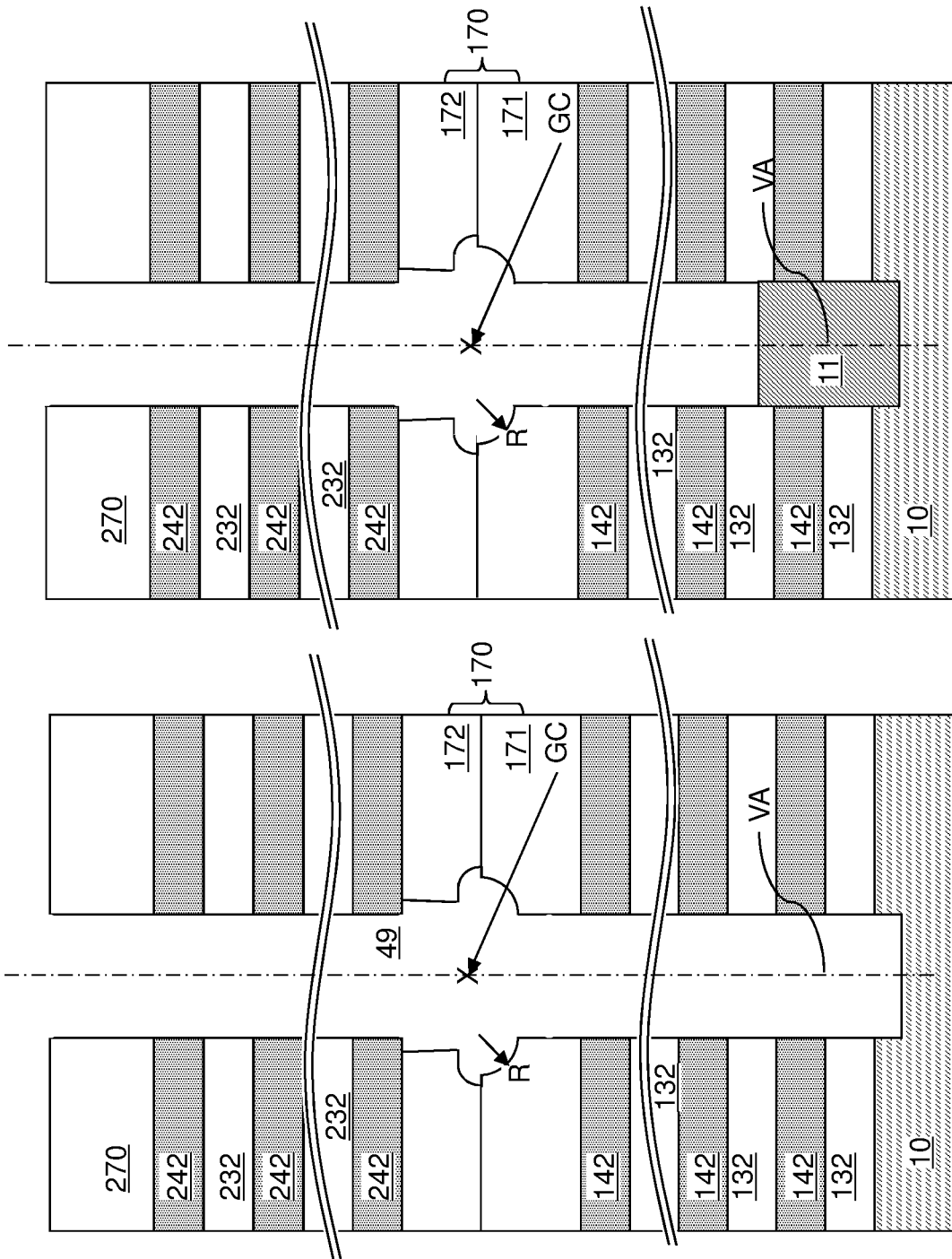

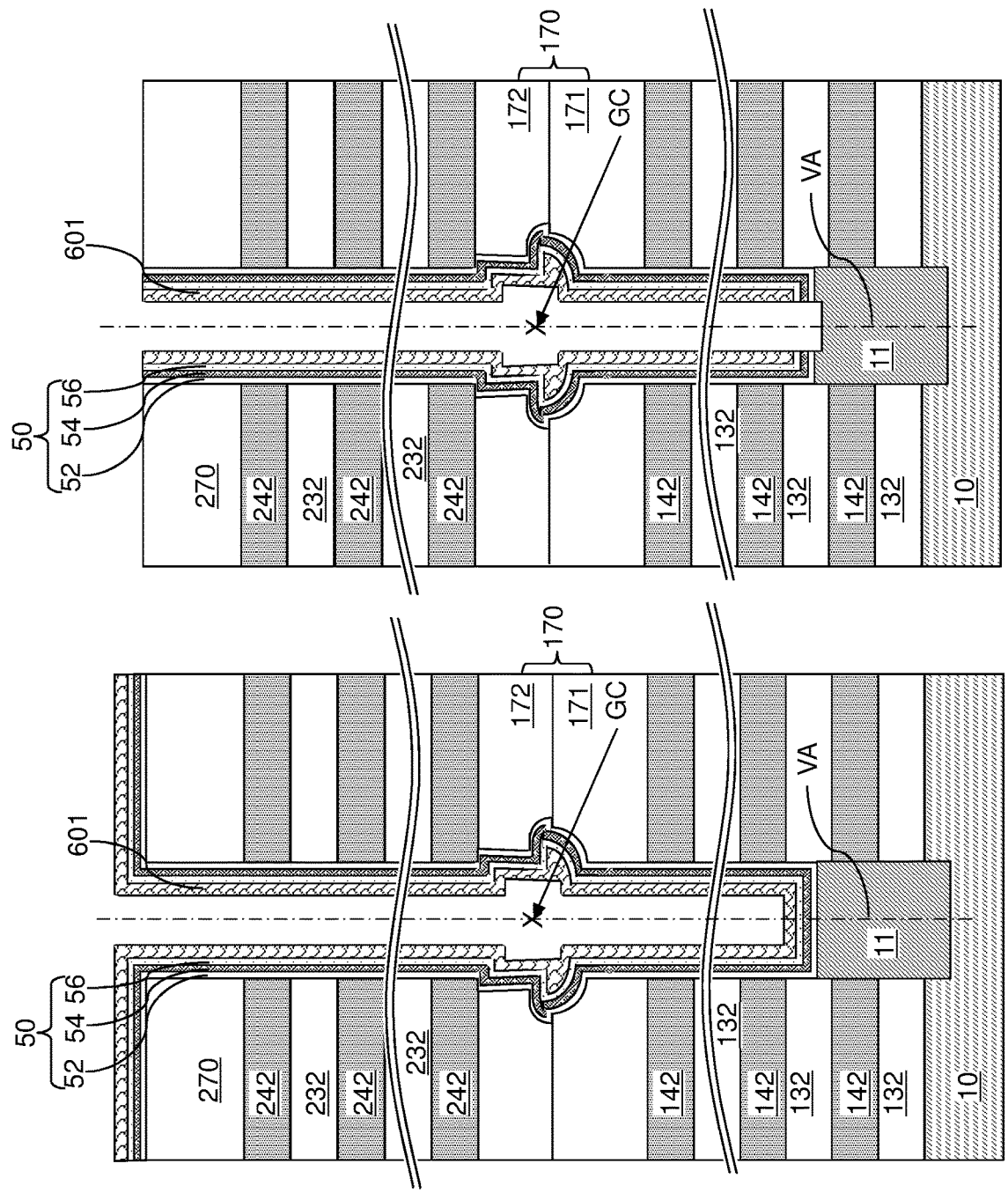

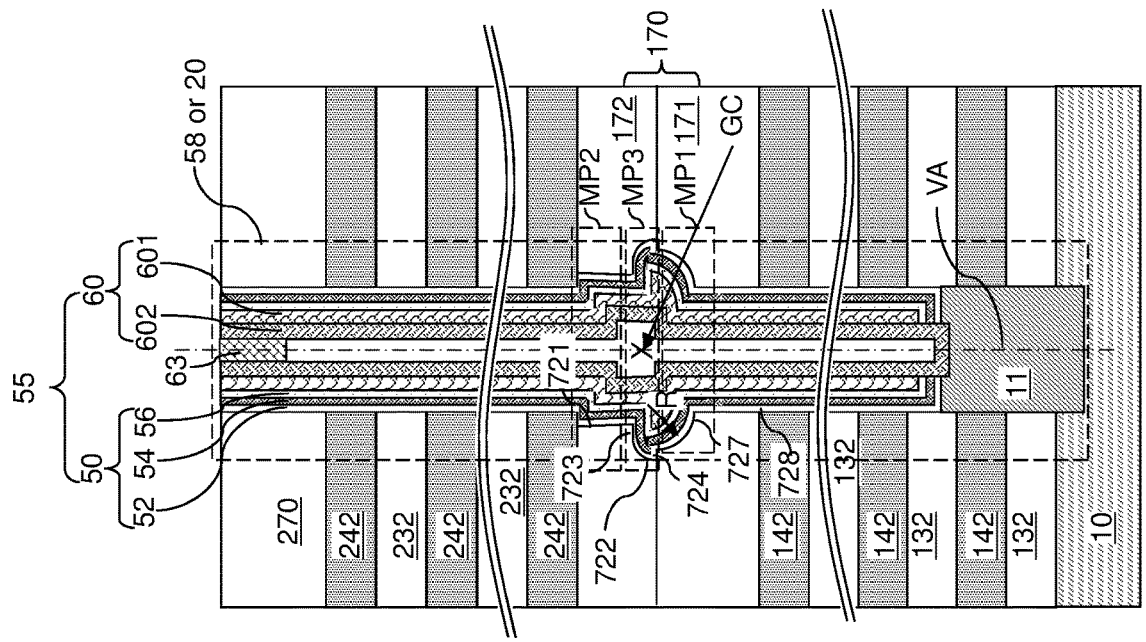
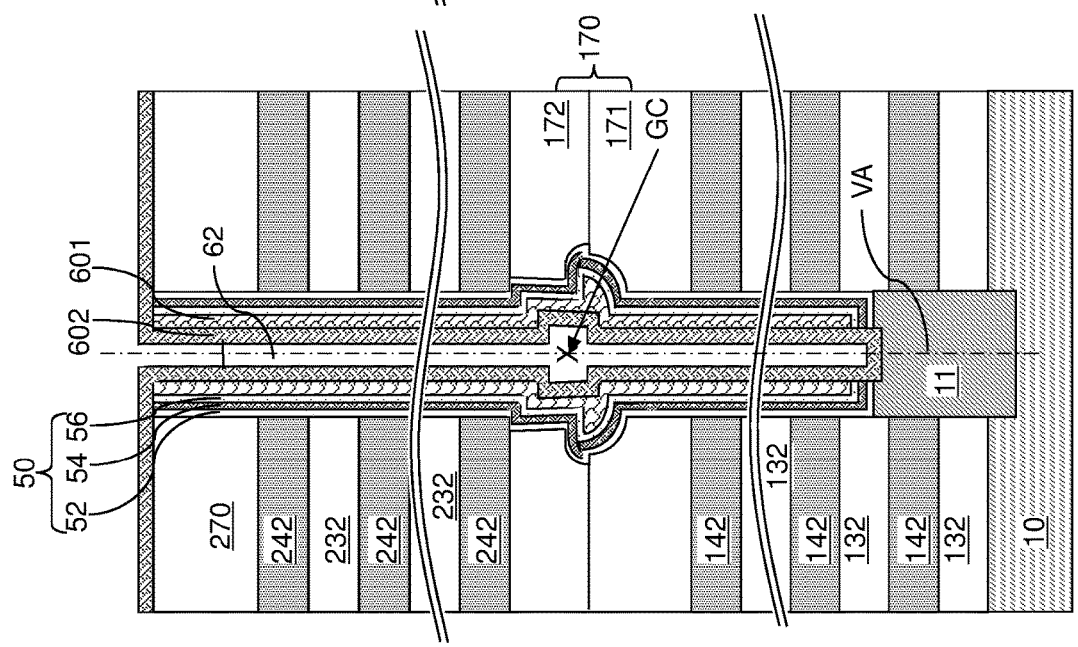
FIG. 20H
FIG. 20G

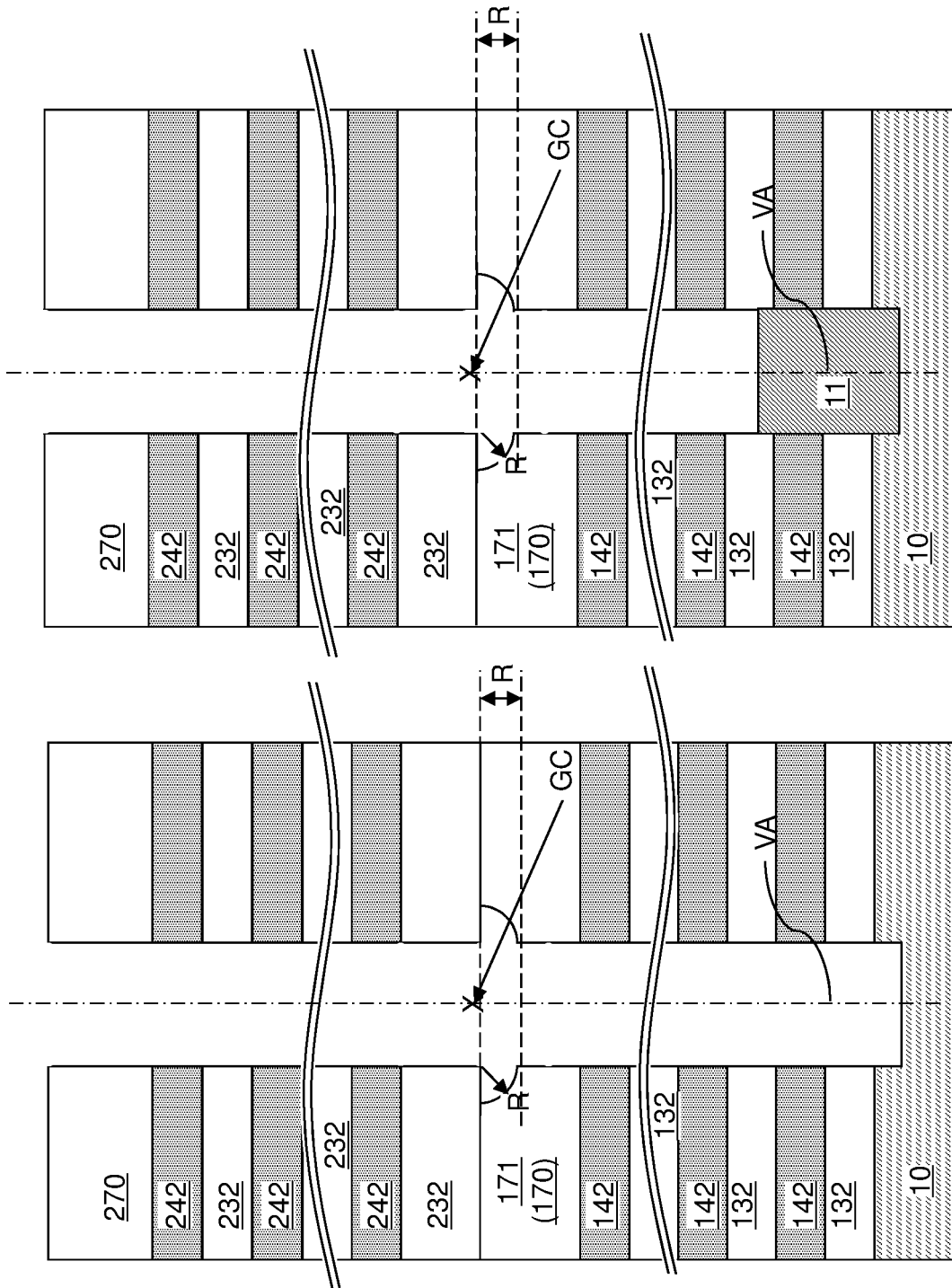

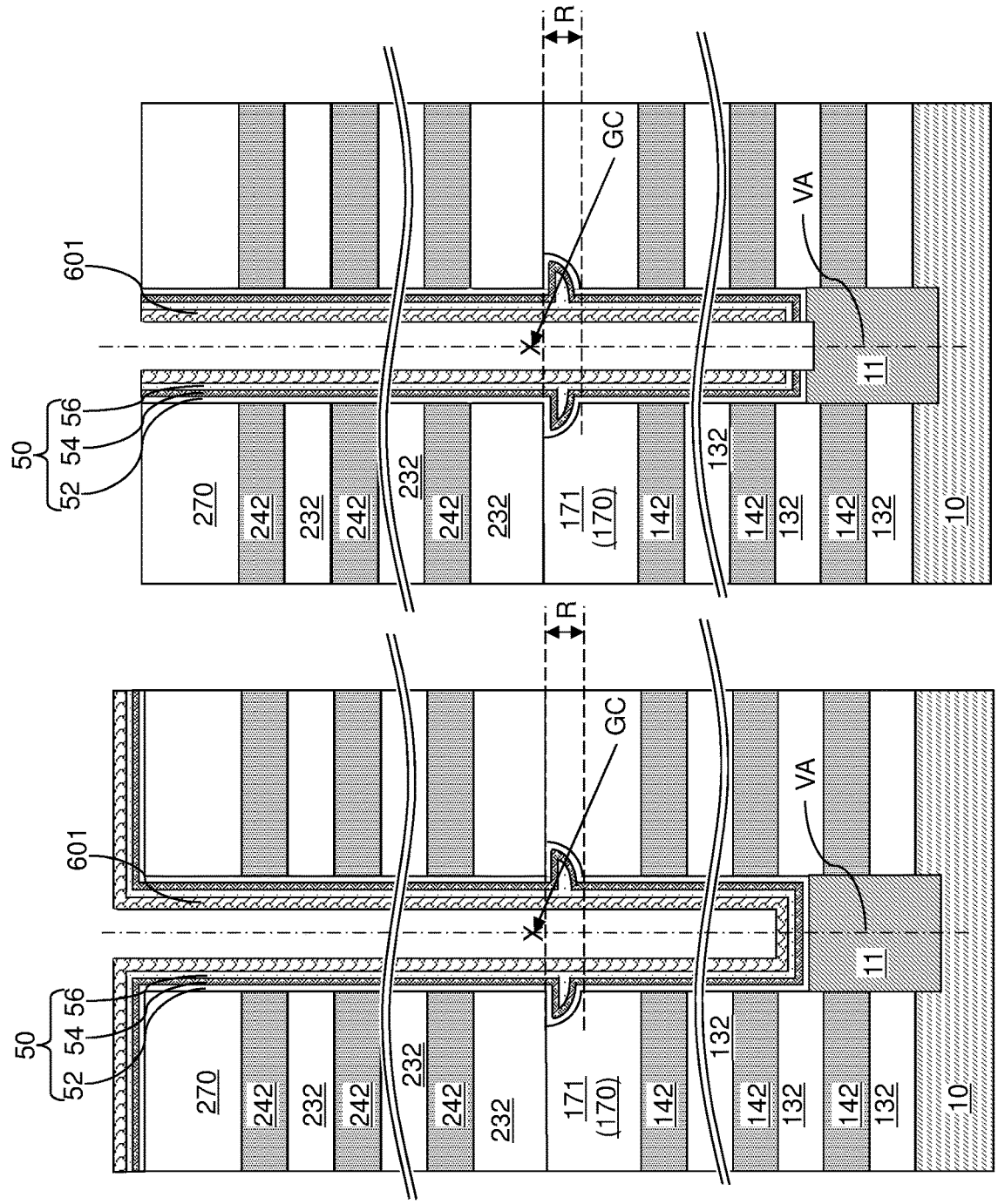

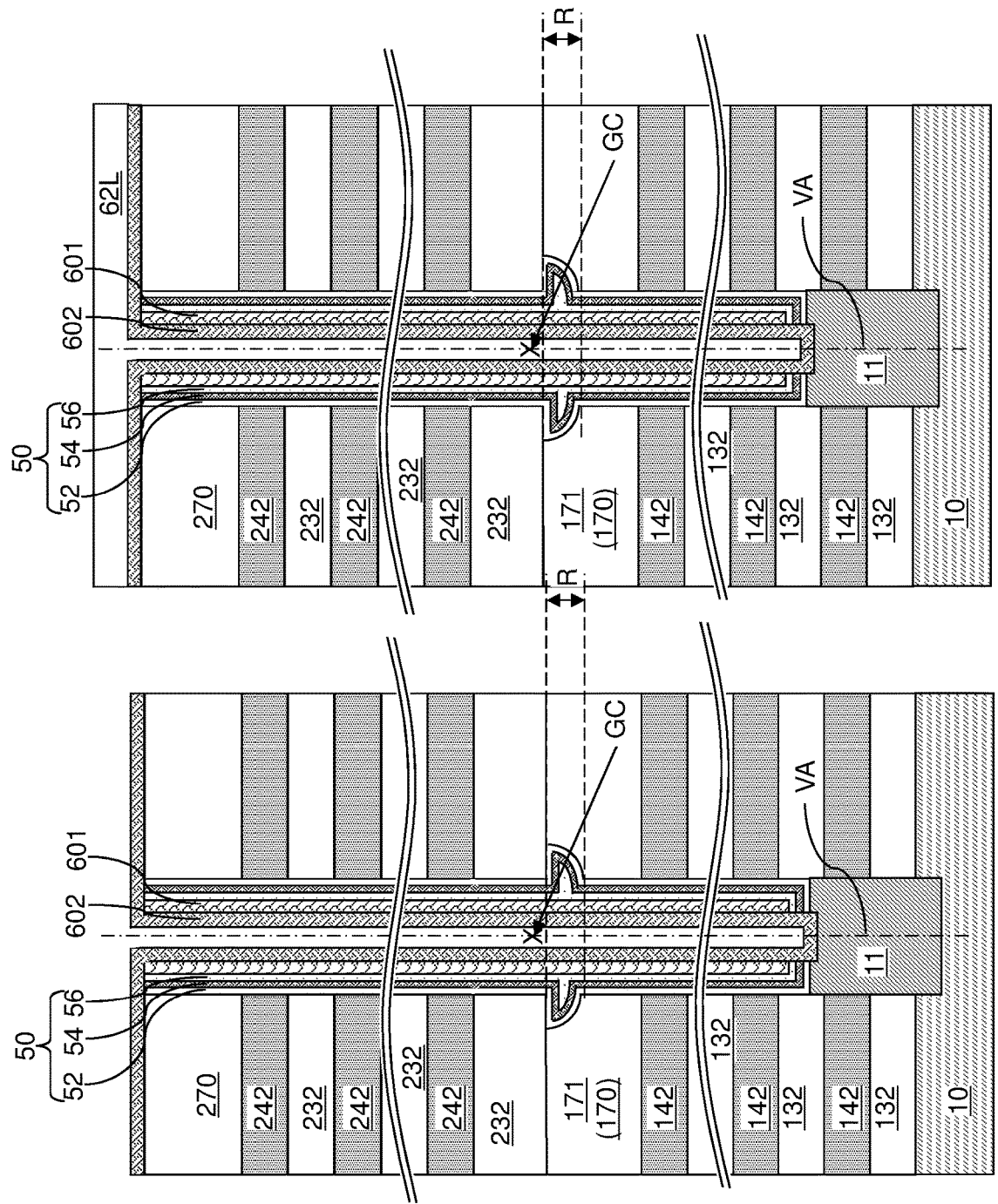

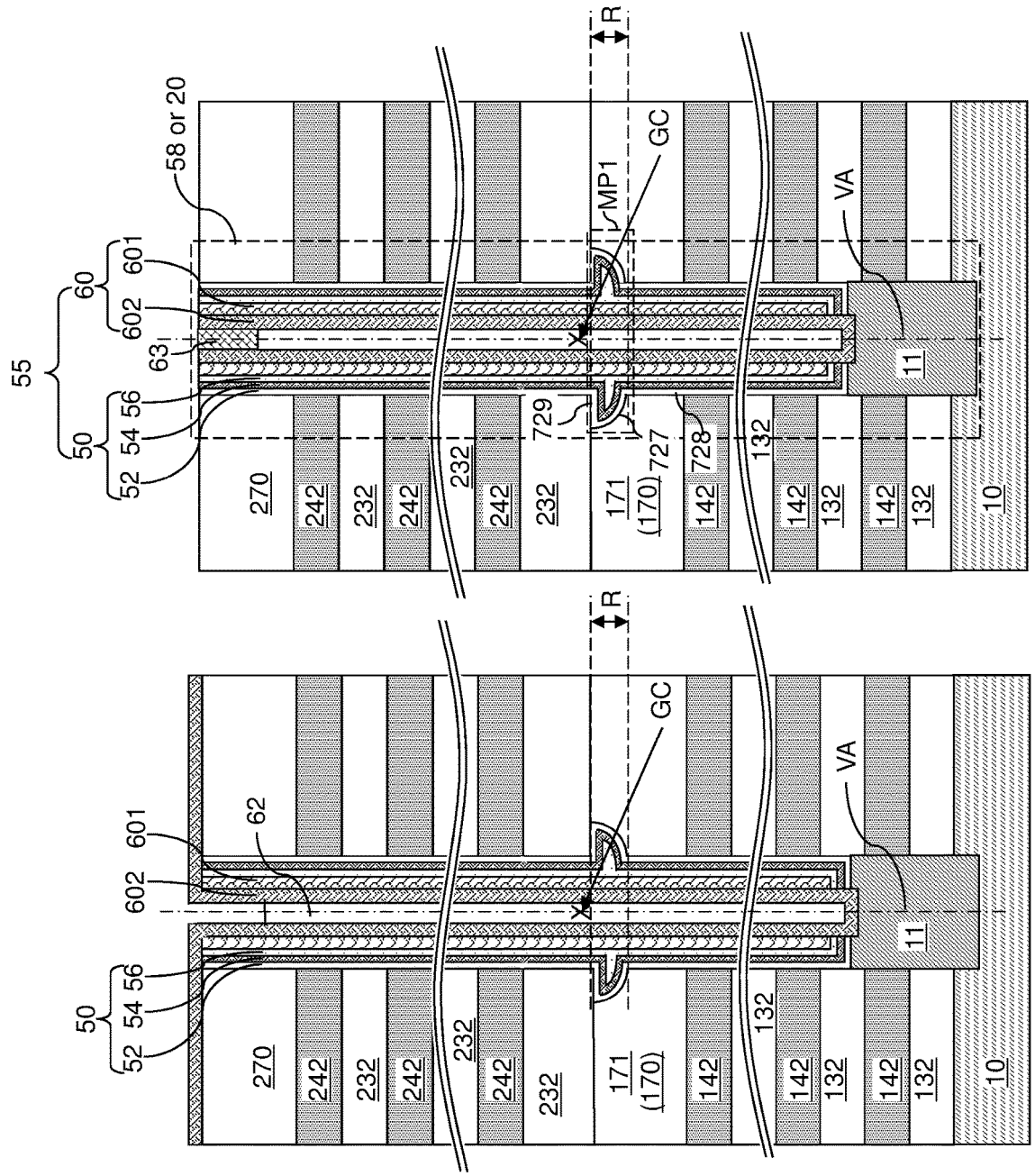

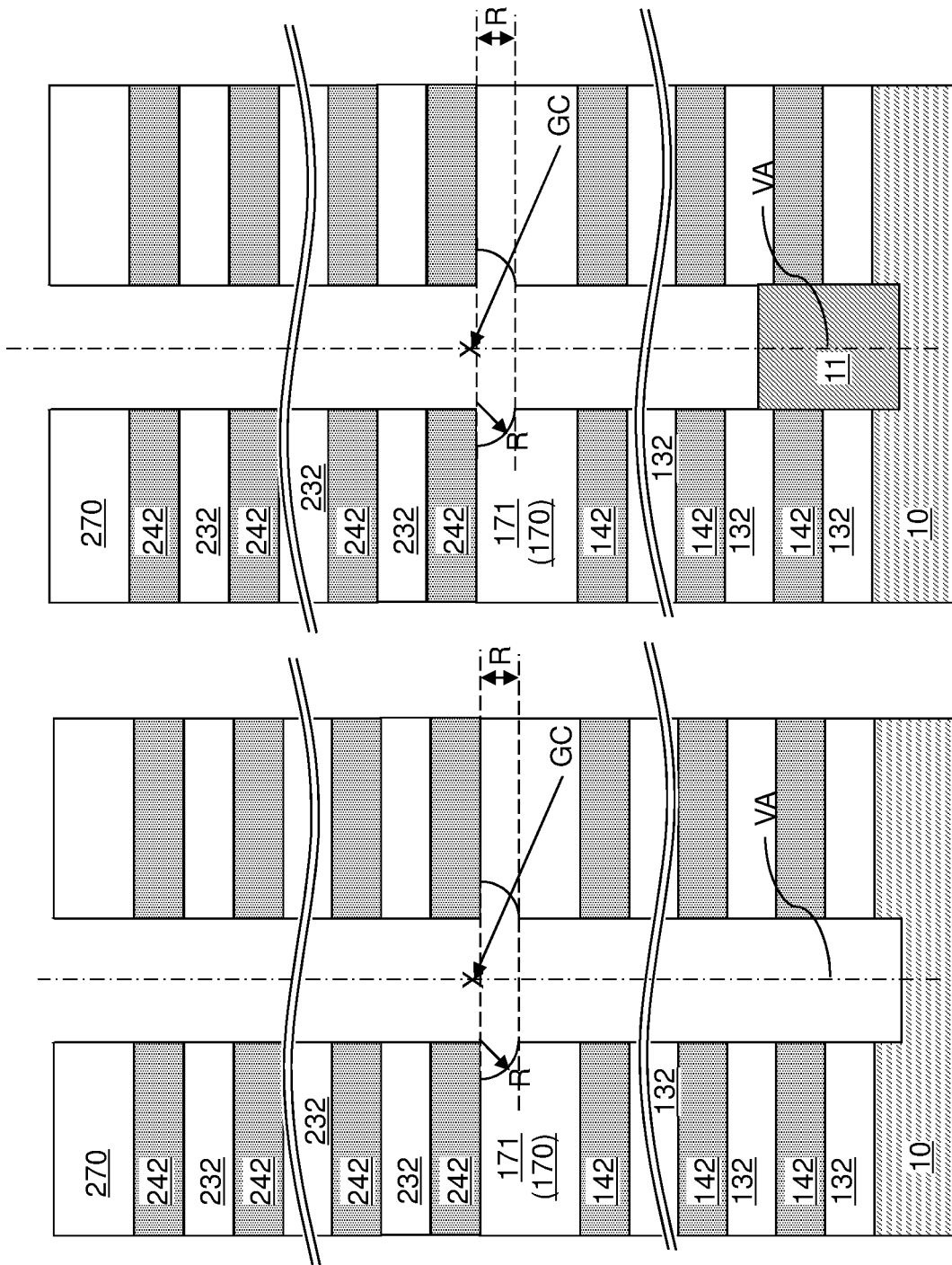

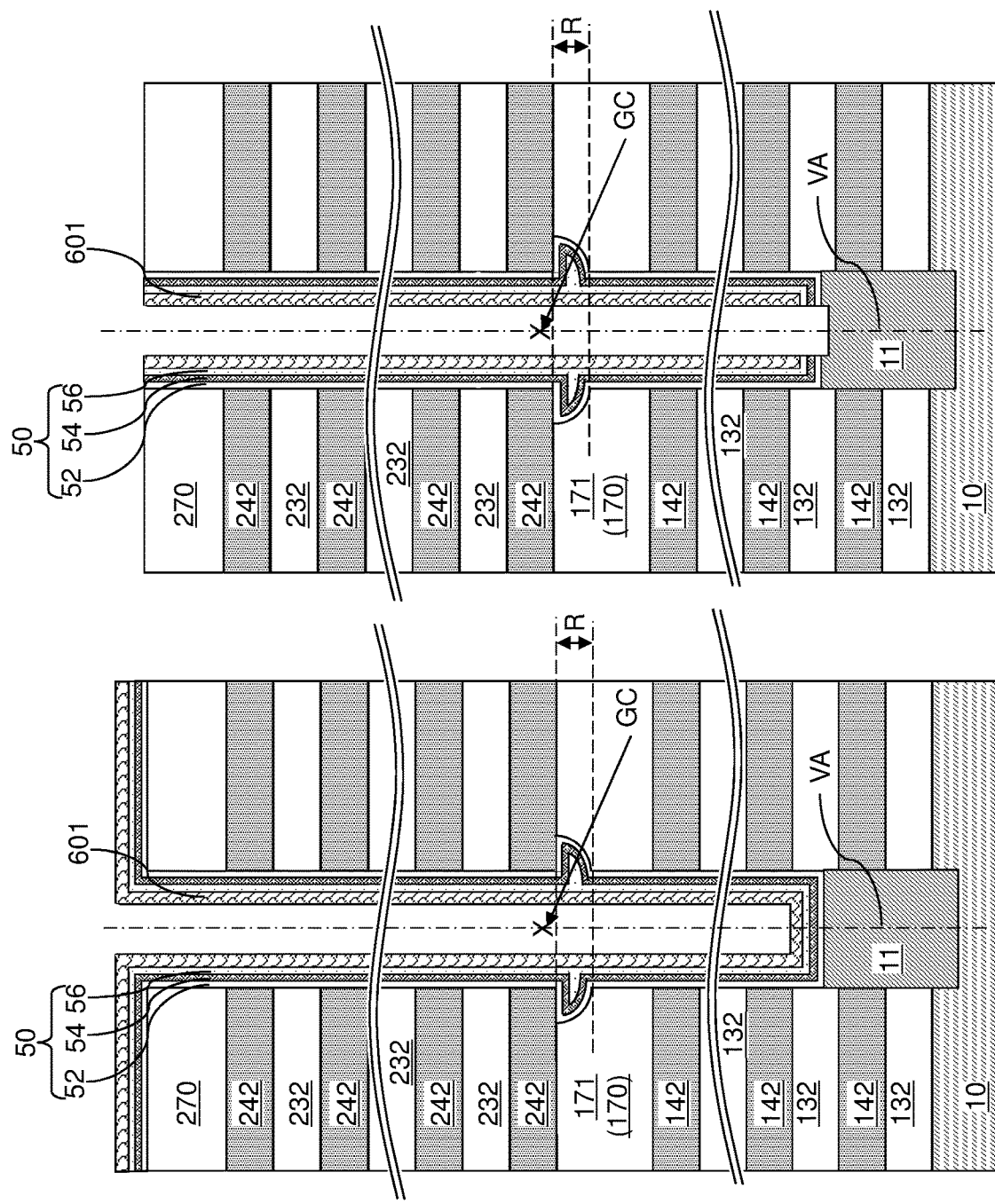

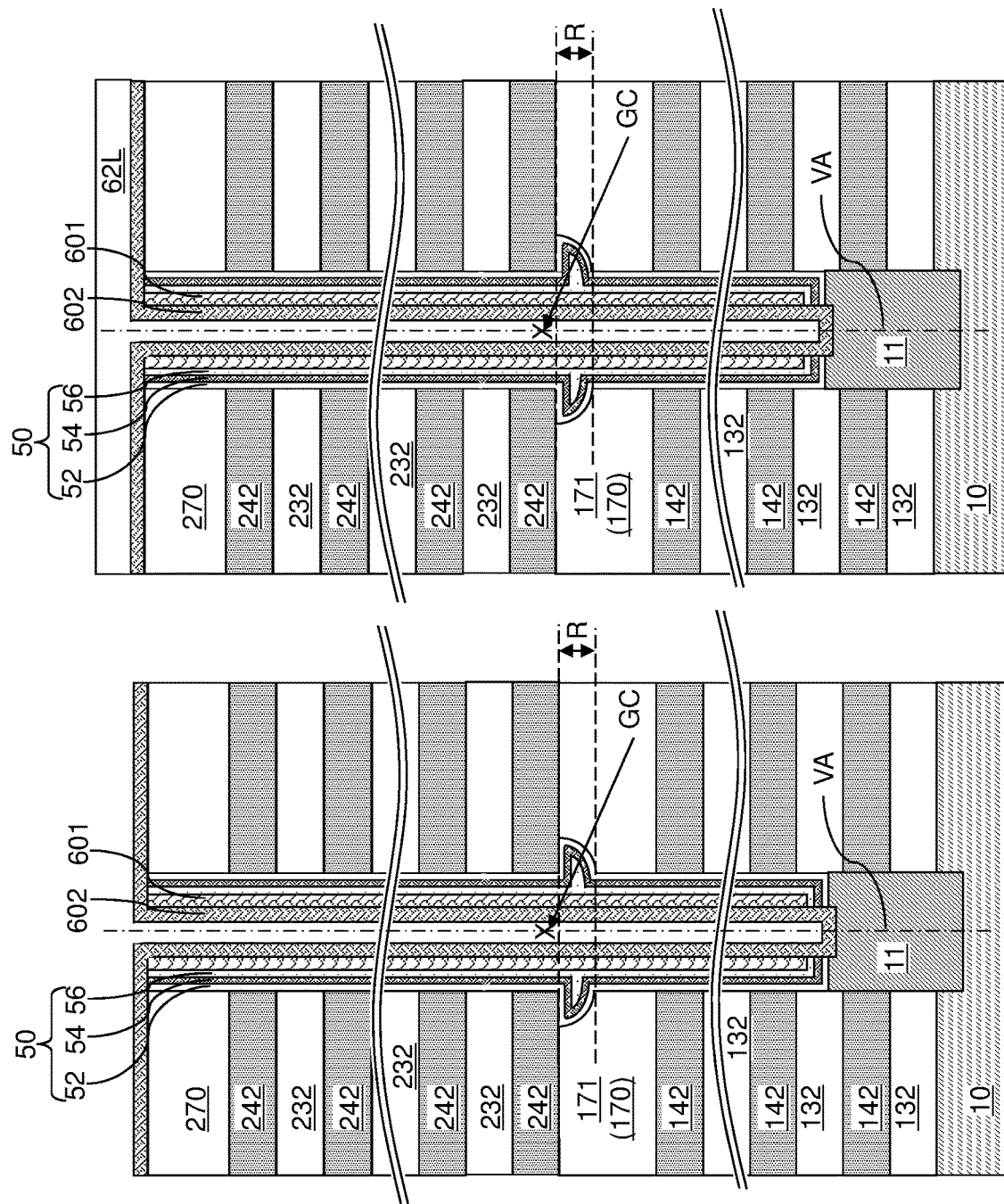

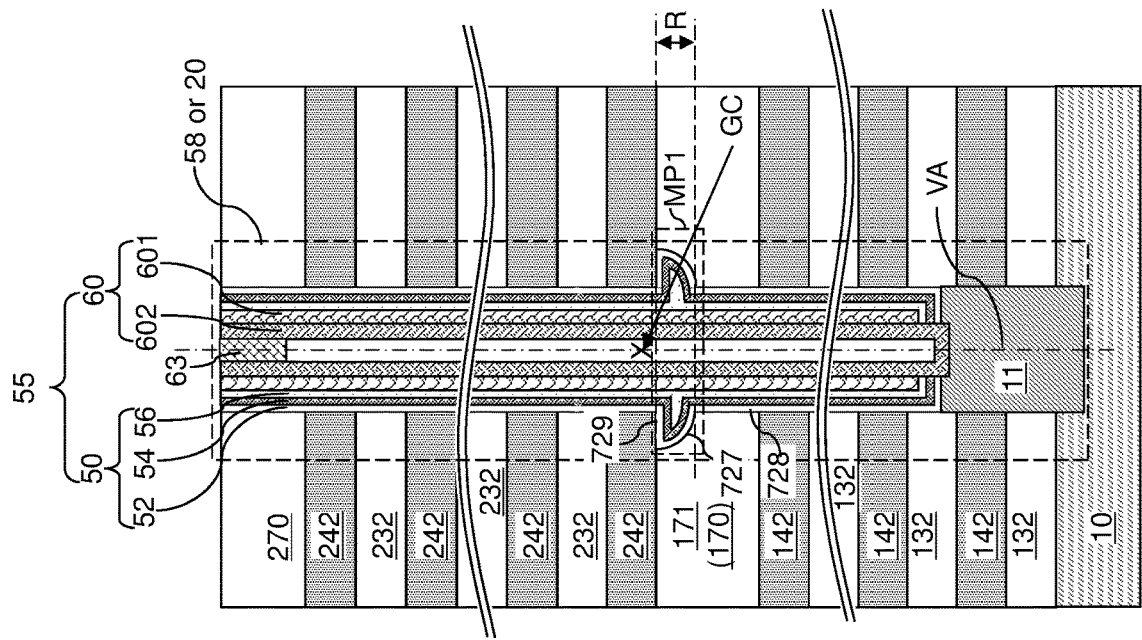
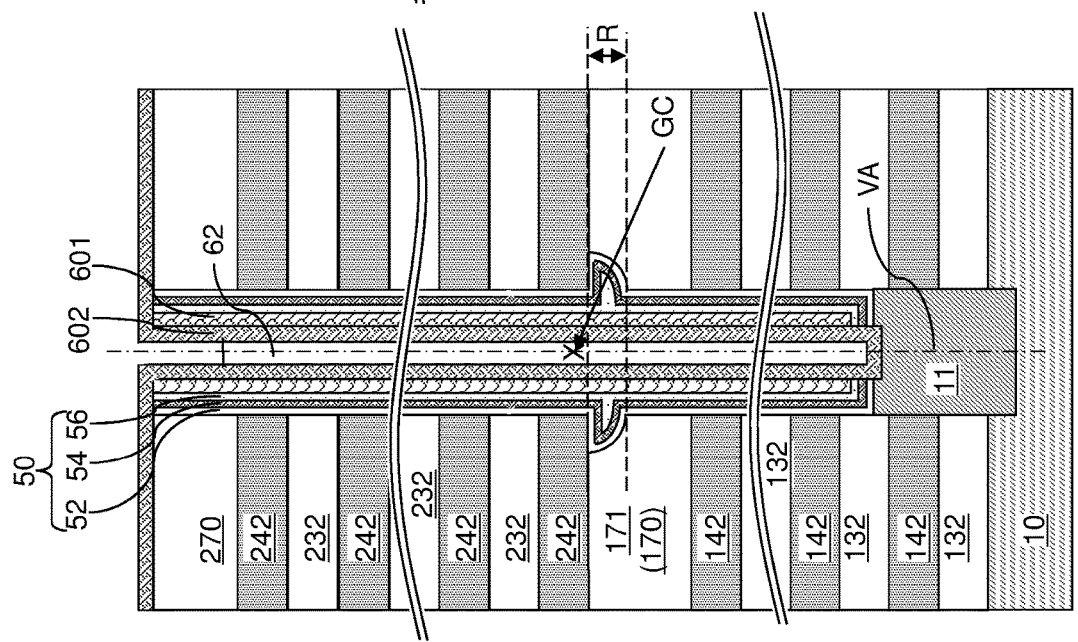
FIG. 29H
FIG. 29G

METHOD OF MAKING A MULTI-TIER MEMORY DEVICE WITH ROUNDED JOINT STRUCTURES

FIELD

The present disclosure relates generally to the field of semiconductor devices and specifically to a three-dimensional multi-tier memory device including rounded joint structures and methods of making the same.

BACKGROUND

Three-dimensional (3D) NAND stacked memory device can be formed from an array of an alternating stack of insulating materials and spacer material layers that are formed as electrically conductive layer or replaced with electrically conductive layers. Memory openings are formed through the alternating stack, and are filled with memory stack structures, each of which includes a vertical stack of memory elements and a vertical semiconductor channel. A memory-level assembly including the alternating stack and the memory stack structures is formed over a substrate. The electrically conductive layers can function as word lines of a 3D NAND stacked memory device, and bit lines overlying an array of memory stack structures can be connected to drain-side ends of the vertical semiconductor channels.

SUMMARY

According to an aspect of the present disclosure, a method of forming a memory device comprises: forming a first alternating stack of first insulating layers and first sacrificial material layers over a substrate; forming a first inter-tier dielectric layer over the first alternating stack; forming a first-tier memory opening through the first alternating stack; forming a sacrificial memory opening fill structure in the first-tier memory opening, wherein the sacrificial memory opening fill structure comprises a semiconductor fill material portion and an metallic fill material portion; forming a second inter-tier dielectric layer over the first inter-tier dielectric layer and the sacrificial memory opening fill structure; forming a second alternating stack of second insulating layers and second sacrificial material layers over the first inter-tier dielectric layer; forming a second-tier memory opening through the second alternating stack and exposing the metallic fill material portion; removing the metallic fill material portion and the semiconductor fill material portion selective to the second alternating stack and the first alternating stack; and forming a memory opening fill structure in volumes of the second-tier memory opening and the first-tier memory opening.

According to another aspect of the present disclosure, a memory device comprises: a first alternating stack of first insulating layers and first electrically conductive layers; a layer stack of a first inter-tier dielectric layer and a second inter-tier dielectric layer located over the first alternating stack; a second alternating stack of second insulating layers and second electrically conductive layers located over the second inter-tier dielectric layer; a memory opening vertically extending through the second alternating stack, the second inter-tier dielectric layer, the first inter-tier dielectric layer, and the first alternating stack; and a memory opening fill structure located in the memory opening and comprising a memory film and a vertical semiconductor channel, wherein: a first portion of the memory opening fill structure located in an upper portion of the first inter-tier dielectric layer laterally protrudes outward from a vertical axis passing through a geometrical center of the memory opening fill structure more than a sidewall of a portion of the memory opening fill structure located within the first alternating stack; and a second portion of the memory opening fill structure located in an upper portion of the second inter-tier dielectric layer comprises a cylindrical sidewall that is laterally offset from the vertical axis by a greater lateral distance than a bottom periphery of a sidewall of a portion of the memory opening fill structure located within the second alternating stack.

According to yet another aspect of the present disclosure, a method of forming a memory device comprises: forming a first alternating stack of first insulating layers and first sacrificial material layers over a substrate; forming an inter-tier dielectric layer over the first alternating stack; forming an etch mask layer including an opening therethrough over the inter-tier dielectric layer; performing an isotropic etch process that isotropically recesses a material of the inter-tier dielectric layer from underneath the opening in the etch mask layer; performing an anisotropic etch process after the isotropic etch process while the etch mask layer is present on the inter-tier dielectric layer to form a first-tier memory opening; forming a sacrificial memory opening fill structure in the first-tier memory opening; forming a second alternating stack of second insulating layers and second sacrificial material layers over the inter-tier dielectric layer; forming a second-tier memory opening through the second alternating stack on a top surface of the sacrificial memory opening fill structure; removing the sacrificial memory opening fill structure underneath the second-tier memory opening; and forming a memory opening fill structure in volumes of the second-tier memory opening and the first-tier memory opening.

According to still another aspect of the present disclosure, a memory device is provided, which comprises: a first alternating stack of first insulating layers and first electrically conductive layers; at least one inter-tier dielectric layer located over the first alternating stack; a second alternating stack of second insulating layers and second electrically conductive layers located over the at least one inter-tier dielectric layer; a memory opening vertically extending through the second alternating stack, the at least one inter-tier dielectric layer, and the first alternating stack; and a memory opening fill structure located in the memory opening and comprising a memory film and a vertical semiconductor channel, wherein: a first portion of the memory opening fill structure laterally protrudes outward from a vertical axis passing through a geometrical center of the memory opening fill structure more than a sidewall of a portion of the memory opening fill structure located within the first alternating stack; and a top periphery of a convex annular sidewall of the first portion of the memory opening fill structure is adjoined to a top surface of one of the at least one inter-tier dielectric layer; a bottom periphery of the convex annular sidewall of the first portion of the memory opening fill structure is adjoined to a top periphery of a straight cylindrical sidewall of the memory opening fill structure that vertically extends through the first alternating stack; and an entirety of the convex annular sidewall of the first portion of the memory opening fill structure has a uniform radius of curvature that equals a vertical distance between a horizontal plane including the top periphery of the convex annular sidewall of the first portion and a horizontal plane including the bottom periphery of the convex annular sidewall of the first portion.

BRIEF DESCRIPTION OF THE DRAWINGS

FIGS. 11A-11H are sequential vertical cross-sectional views of an inter-tier memory opening in the first exemplary structure during formation of a memory opening fill structure according to the first embodiment of the present disclosure.

FIG. 13B is a horizontal cross-sectional view of the first exemplary structure along the horizontal plane B-B' in FIG. 13A. The zig-zag vertical plane A-A' corresponds to the plane of the vertical cross-sectional view of FIG. 13A.

FIGS. 20A-20H are sequential vertical cross-sectional views of an inter-tier memory opening in the second exemplary structure during formation of a memory opening fill structure according to the second embodiment of the present disclosure.

FIGS. 24A-24H are sequential vertical cross-sectional views of an inter-tier memory opening in the third exemplary structure during formation of a memory opening fill structure according to the third embodiment of the present disclosure.

FIGS. 29A-29H are sequential vertical cross-sectional views of an inter-tier memory opening in the fourth exemplary structure during formation of a memory opening fill structure according to the fourth embodiment of the present disclosure.

DETAILED DESCRIPTION

Figure 1:
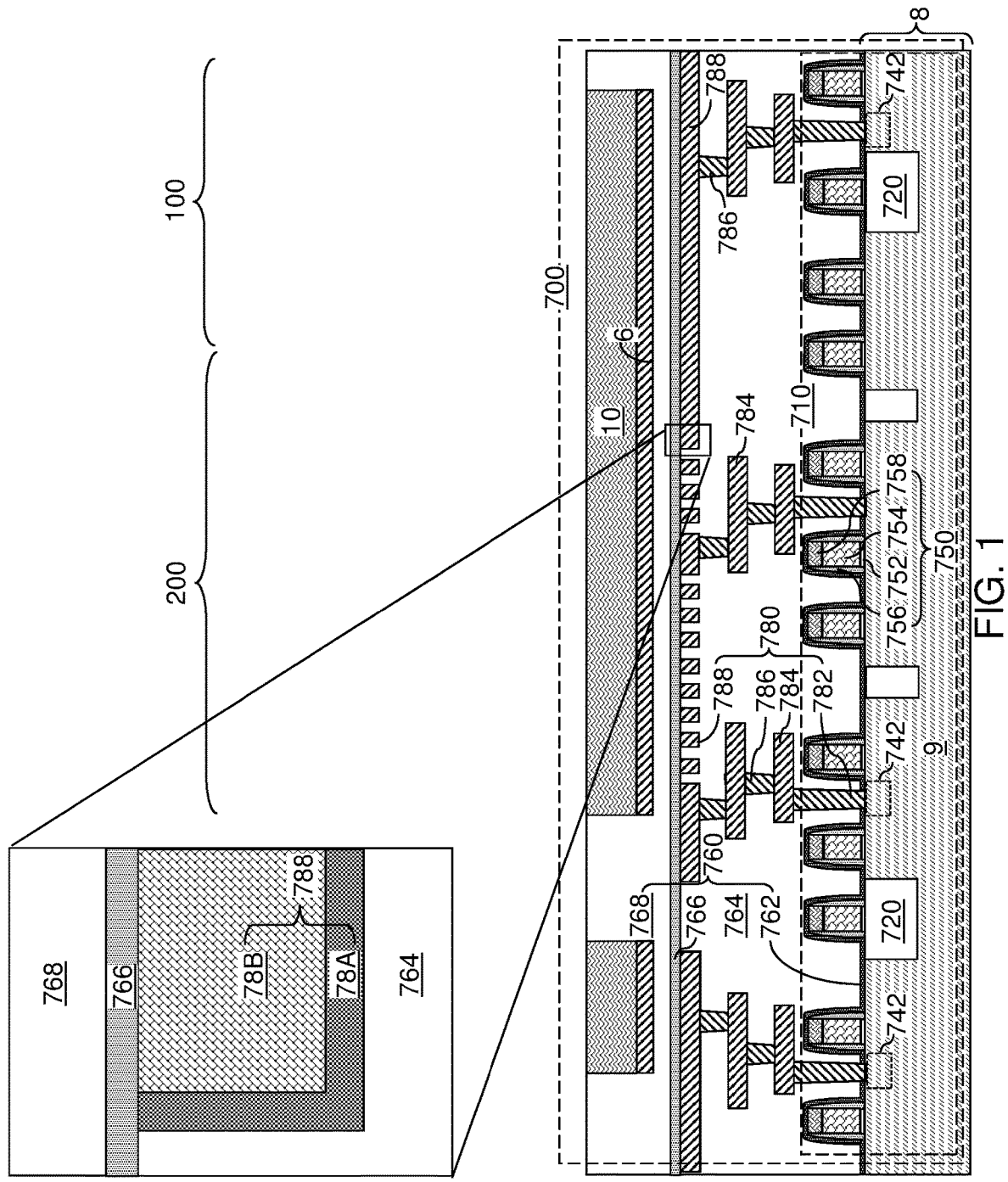
FIG. 1 is a vertical cross-sectional view of a first exemplary structure after formation of semiconductor devices, lower level dielectric layers including a silicon nitride layer, lower metal interconnect structures, and a planar semiconductor material layer on a semiconductor substrate according to a first embodiment of the present disclosure.

Embodiments of the present disclosure are directed to a three-dimensional multi-tier memory device including rounded joint structures and methods of making the same, the various aspect of which are described herein in detail. The embodiments of the present disclosure can be employed to form various semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise.

Ordinals such as "first," "second," and "third" are employed merely to identify similar elements, and different ordinals may be employed across the specification and the claims of the instant disclosure. Unless otherwise indicated, a "contact" between elements refers to a direct contact between elements that provides an edge or a surface shared by the elements. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between or at a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

Referring to FIG. 1, a first exemplary structure according to a first embodiment of the present disclosure is illustrated. The first exemplary structure includes a semiconductor substrate 8, and semiconductor devices 710 formed thereupon. The semiconductor substrate 8 includes a substrate semiconductor layer 9 at least at an upper portion thereof. Shallow trench isolation structures 720 can be formed in an upper portion of the substrate semiconductor layer 9 to provide electrical isolation among the semiconductor devices. The semiconductor devices 710 can include, for example, field effect transistors including respective transistor active regions 742 (i.e., source regions and drain regions), channel regions 746 and gate structures 750. The field effect transistors may be arranged in a CMOS configuration. Each gate structure 750 can include, for example, a gate dielectric 752, a gate electrode 754, a dielectric gate spacer 756 and a gate cap dielectric 758. The semiconductor devices can include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

Dielectric material layers are formed over the semiconductor devices, which is herein referred to as lower level dielectric layers 760. The lower level dielectric layers 760 constitute a dielectric layer stack in which each lower level dielectric layer 760 overlies or underlies other lower level dielectric layers 760. The lower level dielectric layers 760 can include, for example, a dielectric liner 762 such as a silicon nitride liner that blocks diffusion of mobile ions and/or apply appropriate stress to underlying structures, at least one first dielectric material layer 764 that overlies the dielectric liner 762, a silicon nitride layer (e.g., hydrogen diffusion barrier) 766 that overlies the dielectric material layer 764, and at least one second dielectric layer 768.

The dielectric layer stack including the lower level dielectric layers 760 functions as a matrix for lower metal interconnect structures 780 that provide electrical wiring among the various nodes of the semiconductor devices and landing pads for through-stack contact via structures to be subsequently formed. The lower metal interconnect structures 780 are embedded within the dielectric layer stack of the lower level dielectric layers 760, and comprise a lower metal line structure located under and optionally contacting a bottom surface of the silicon nitride layer 766.

For example, the lower metal interconnect structures 780 can be embedded within the at least one first dielectric material layer 764. The at least one first dielectric material layer 764 may be a plurality of dielectric material layers in which various elements of the lower metal interconnect structures 780 are sequentially embedded. Each dielectric material layer among the at least one first dielectric material layer 764 may include any of doped silicate glass, undoped silicate glass, organosilicate glass, silicon nitride, silicon oxynitride, and dielectric metal oxides (such as aluminum oxide). In one embodiment, the at least one first dielectric material layer 764 can comprise, or consist essentially of, dielectric material layers having dielectric constants that do not exceed the dielectric constant of undoped silicate glass (silicon oxide) of 3.9.

The lower metal interconnect structures 780 can include various device contact via structures 782 (e.g., source and drain electrodes which contact the respective source and drain nodes of the device or gate electrode contacts), intermediate lower metal line structures 784, lower metal via structures 786, and topmost lower metal line structures 788 that are configured to function as landing pads for through-stack contact via structures to be subsequently formed. In this case, the at least one first dielectric material layer 764 may be a plurality of dielectric material layers that are formed level by level while incorporating components of the lower metal interconnect structures 780 within each respective level. For example, single damascene processes may be employed to form the lower metal interconnect structures 780, and each level of the lower metal via structures 786 may be embedded within a respective via level dielectric material layer and each level of the lower level metal line structures (784, 788) may be embedded within a respective line level dielectric material layer. Alternatively, a dual damascene process may be employed to form integrated line and via structures, each of which includes a lower metal line structure and at least one lower metal via structure.

The topmost lower metal line structures 788 can be formed within a topmost dielectric material layer of the at least one first dielectric material layer 764 (which can be a plurality of dielectric material layers). Each of the lower metal interconnect structures 780 can include a metallic nitride liner 78A and a metal fill portion 78B. Each metallic nitride liner 78A can include a conductive metallic nitride material such as TiN, TaN, and/or WN. Each metal fill portion 78B can include an elemental metal (such as Cu, W, Al, Co, Ru) or an intermetallic alloy of at least two metals. Top surfaces of the topmost lower metal line structures 788 and the topmost surface of the at least one first dielectric material layer 764 may be planarized by a planarization process, such as chemical mechanical planarization. In this case, the top surfaces of the topmost lower metal line structures 788 and the topmost surface of the at least one first dielectric material layer 764 may be within a horizontal plane that is parallel to the top surface of the substrate 8.

The silicon nitride layer 766 can be formed directly on the top surfaces of the topmost lower metal line structures 788 and the topmost surface of the at least one first dielectric material layer 764. Alternatively, a portion of the first dielectric material layer 764 can be located on the top surfaces of the topmost lower metal line structures 788 below the silicon nitride layer 766. In one embodiment, the silicon nitride layer 766 is a substantially stoichiometric silicon nitride layer which has a composition of $Si_3N_4$. A silicon nitride material formed by thermal decomposition of a silicon nitride precursor is preferred for the purpose of blocking hydrogen diffusion. In one embodiment, the silicon nitride layer 766 can be deposited by a low pressure chemical vapor deposition (LPCVD) employing dichlorosilane ($SiH_2Cl_2$) and ammonia ($NH_3$) as precursor gases. The temperature of the LPCVD process may be in a range from 750 degrees Celsius to 825 degrees Celsius, although lesser and greater deposition temperatures can also be employed. The sum of the partial pressures of dichlorosilane and ammonia may be in a range from 50 mTorr to 500 mTorr, although lesser and greater pressures can also be employed. The thickness of the silicon nitride layer 766 is selected such that the silicon nitride layer 766 functions as a sufficiently robust hydrogen diffusion barrier for subsequent thermal processes. For example, the thickness of the silicon nitride layer 766 can be in a range from 6 nm to 100 nm, although lesser and greater thicknesses may also be employed.

The at least one second dielectric material layer 768 may include a single dielectric material layer or a plurality of dielectric material layers. Each dielectric material layer among the at least one second dielectric material layer 768 may include any of doped silicate glass, undoped silicate glass, and organosilicate glass. In one embodiment, the at least one first second material layer 768 can comprise, or consist essentially of, dielectric material layers having dielectric constants that do not exceed the dielectric constant of undoped silicate glass (silicon oxide) of 3.9.

An optional layer of a metallic material and a layer of a semiconductor material can be deposited over, or within patterned recesses of, the at least one second dielectric material layer 768, and is lithographically patterned to provide an optional planar conductive material layer 6 and a planar semiconductor material layer 10. The optional planar conductive material layer 6, if present, provides a high conductivity conduction path for electrical current that flows into, or out of, the planar semiconductor material layer 10. The optional planar conductive material layer 6 includes a conductive material such as a metal or a heavily doped semiconductor material. The optional planar conductive material layer 6, for example, may include a tungsten layer having a thickness in a range from 3 nm to 100 nm, although lesser and greater thicknesses can also be employed. A metal nitride layer (not shown) may be provided as a diffusion barrier layer on top of the planar conductive material layer 6. Layer 6 may function as a special source line in the completed device. Alternatively, layer 6 may comprise an etch stop layer and may comprise any suitable conductive, semiconductor or insulating layer.

The planar semiconductor material layer 10 can include horizontal semiconductor channels and/or source regions for a three-dimensional array of memory devices to be subsequently formed. The optional planar conductive material layer 6 can include a metallic compound material such as a conductive metallic nitride (e.g., TiN) and/or a metal (e.g., W). The thickness of the optional planar conductive material layer 6 may be in a range from 5 nm to 100 nm, although lesser and greater thicknesses can also be employed. The planar semiconductor material layer 10 includes a polycrystalline semiconductor material such as polysilicon or a polycrystalline silicon-germanium alloy. The thickness of the planar semiconductor material layer 10 may be in a range from 30 nm to 300 nm, although lesser and greater thicknesses can also be employed.

The planar semiconductor material layer 10 includes a semiconductor material, which can include at least one elemental semiconductor material, at least one III-V compound semiconductor material, at least one II-VI compound semiconductor material, at least one organic semiconductor material, and/or other semiconductor materials known in the art. In one embodiment, the planar semiconductor material layer 10 can include a polycrystalline semiconductor material (such as polysilicon), or an amorphous semiconductor material (such as amorphous silicon) that is converted into a polycrystalline semiconductor material in a subsequent processing step (such as an anneal step). The planar semiconductor material layer 10 can be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 9). In one embodiment, the planar semiconductor material layer 10 or portions thereof can be doped with electrical dopants, which may be p-type dopants or n-type dopants. The conductivity type of the dopants in the planar semiconductor material layer 10 is herein referred to as a first conductivity type.

The optional planar conductive material layer 6 and the planar semiconductor material layer 10 may be patterned to provide openings in areas in which through-stack contact via structures and through-dielectric contact via structures are to be subsequently formed. In one embodiment, the openings in the optional planar conductive material layer 6 and the planar semiconductor material layer 10 can be formed within the area of a memory array region 100, in which a three-dimensional memory array including memory stack structures is to be subsequently formed. Further, additional openings in the optional planar conductive material layer 6 and the planar semiconductor material layer 10 can be formed within the area of a staircase region 200 in which contact via structures contacting word line electrically conductive layers are to be subsequently formed.

The region of the semiconductor devices 710 and the combination of the lower level dielectric layers 760 and the lower metal interconnect structures 780 is herein referred to an underlying peripheral device region 700, which is located underneath a memory-level assembly to be subsequently formed and includes peripheral devices for the memory-level assembly. In an alternative embodiment, the peripheral device region 700 may be located on a separate substrate which is subsequently bonded to the memory array region 100.

The lower metal interconnect structures 780 are embedded in the lower level dielectric layers 760. The lower metal interconnect structures 780 can be electrically shorted to active nodes (e.g., transistor active regions 742 or gate electrodes 750) of the semiconductor devices 710 (e.g., CMOS devices), and are located at the level of the lower level dielectric layers 760. Only a subset of the active nodes is illustrated in FIG. 1 for clarity. Through-stack contact via structures (not shown in FIG. 1) can be subsequently formed directly on the lower metal interconnect structures 780 to provide electrical connection to memory devices to be subsequently formed. In one embodiment, the pattern of the lower metal interconnect structures 780 can be selected such that the topmost lower metal line structures 788 (which are a subset of the lower metal interconnect structures 780 located at the topmost portion of the lower metal interconnect structures 780) can provide landing pad structures for the through-stack contact via structures to be subsequently formed.

Figure 2:
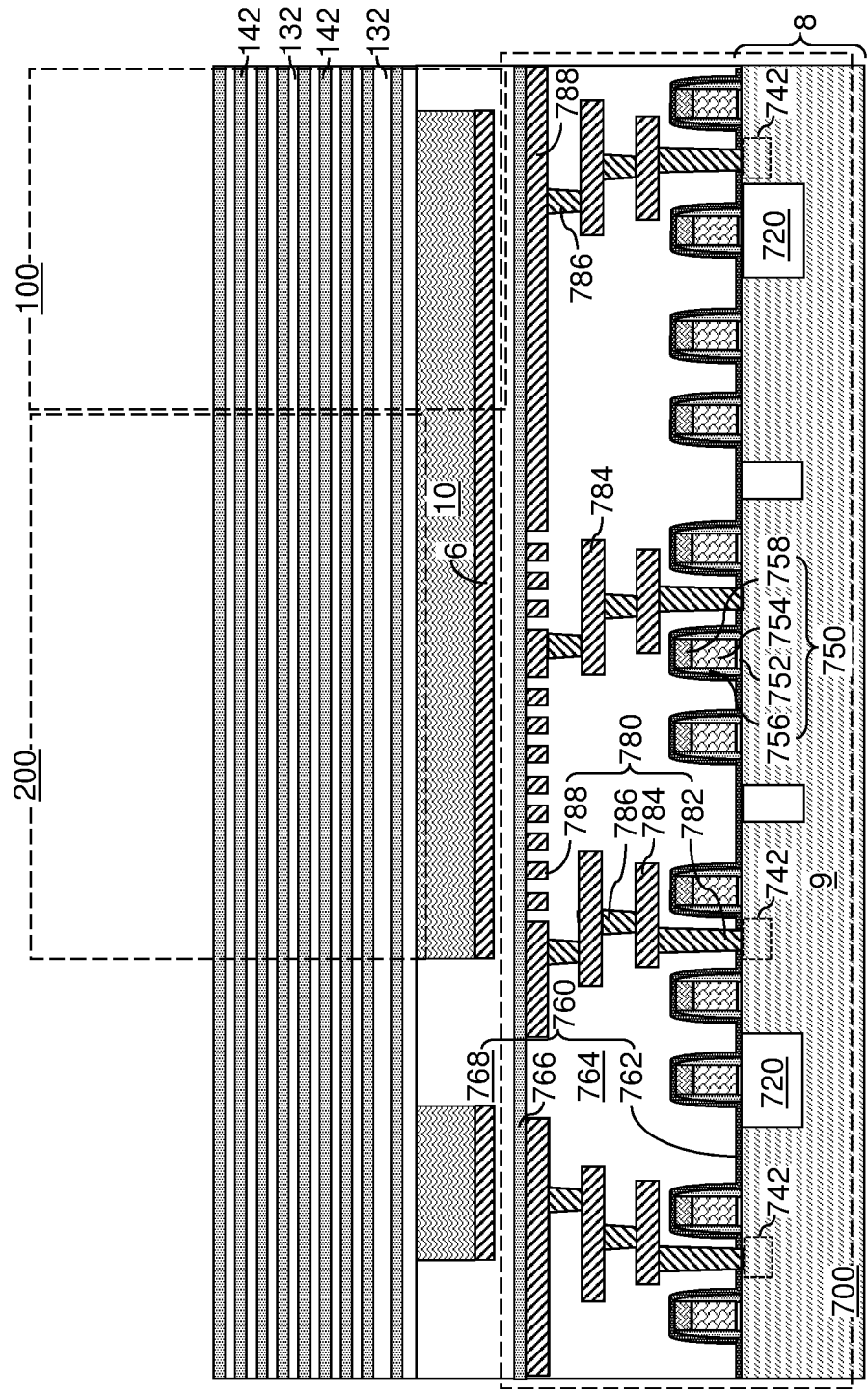
FIG. 2 is a vertical cross-sectional view of the first exemplary structure after formation of a first alternating stack of first insulting layers and first spacer material layers according to the first embodiment of the present disclosure.

Referring to FIG. 2, an alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as a first alternating stack. The level of the first alternating stack is herein referred to as a first-tier level, and the level of the alternating stack to be subsequently formed immediately above the first-tier level is herein referred to as a second-tier level, etc.

The first alternating stack can include first insulting layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers. While the present disclosure is described employing embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the planar semiconductor material layer 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first alternating stack (132, 142) can have a uniform thickness that is substantially invariant within each respective first sacrificial material layer 142.

A first inter-tier dielectric layer 171 is subsequently formed over the stack (132, 142). The first inter-tier dielectric layer 171 includes a dielectric material, which is herein referred to as a first component dielectric material. Any dielectric material that can be employed for the first insulating layers 132 may be employed for the first component dielectric material. In one embodiment, the first inter-tier dielectric layer 171 includes the same dielectric material as the first insulating layers 132. For example, the first inter-tier dielectric layer 171 can include a first silicon oxide material such as undoped silicate glass (i.e., silicon oxide). In one embodiment, the first inter-tier dielectric layer 171 comprises a first silicon oxide material having a first etch rate in 100:1 dilute hydrofluoric acid at room temperature. The first inter-tier dielectric layer 171 may be deposited by a conformal or non-conformal deposition process. For example, the first inter-tier dielectric layer 171 can be deposited by plasma enhanced physical vapor deposition. The thickness of the first inter-tier dielectric layer 171 can be in a range from 80 nm to 400 nm, although lesser and greater thicknesses can also be employed.

Figure 3:
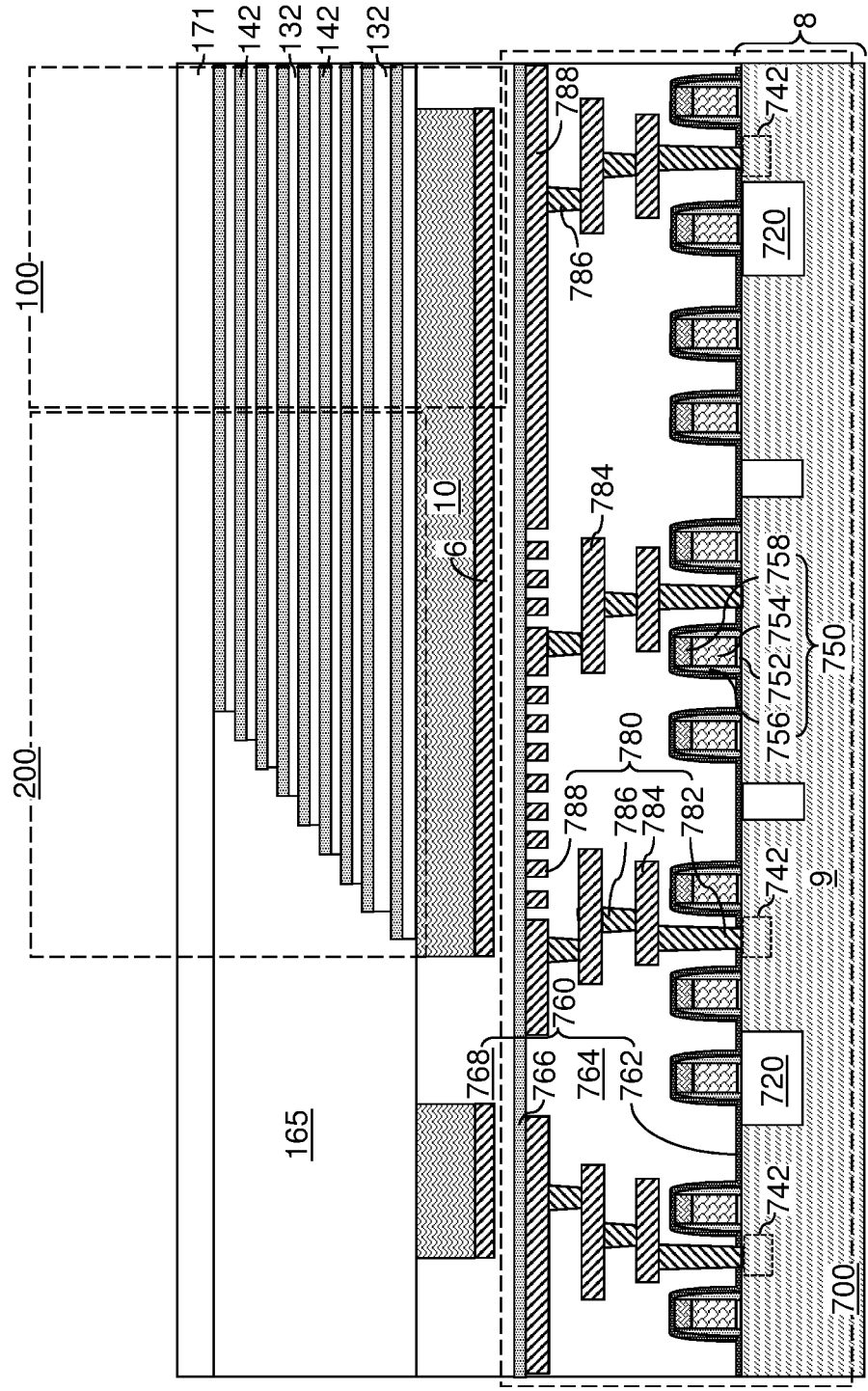
FIG. 3 is a vertical cross-sectional view of the first exemplary structure after patterning first-tier staircase regions on the first alternating stack and forming a first-tier retro-stepped dielectric material portion according to the first embodiment of the present disclosure.

Referring to FIG. 3, the first inter-tier dielectric layer 171 and the first alternating stack (132, 142) can be patterned to form first stepped surfaces in the word line contact region

200. The word line staircase region 200 can include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces can be formed, for example, by forming a mask layer with an opening therein, etching a cavity within the levels of the first inter-tier dielectric layer 171, and iteratively expanding the etched area and vertically recessing the cavity by etching each pair of a first insulating layer 132 and a first sacrificial material layer 142 located directly underneath the bottom surface of the etched cavity within the etched area. A dielectric material can be deposited to fill the first stepped cavity to form a first-tier retro-stepped dielectric material portion 165.

As used herein, a "retro-stepped" element refers to an element that has stepped surfaces and a horizontal cross-sectional area that increases monotonically as a function of a vertical distance from a top surface of a substrate on which the element is present. The first alternating stack (132, 142) and the first-tier retro-stepped dielectric material portion 165 collectively constitute a first-tier structure, which is an in-process structure that is subsequently modified. In one embodiment, the dielectric material of the first-tier retro-stepped dielectric material portion 165 may be the same as the dielectric material of the first inter-tier dielectric layer 171. For example, the first-tier retro-stepped dielectric material portion 165 and the first inter-tier dielectric layer 171 can include undoped silicate glass composed primarily of silicon oxide and including hydrogen and/or carbon at concentrations in a range from 0.1 part per million to 100 parts per million each.

Figure 4A:
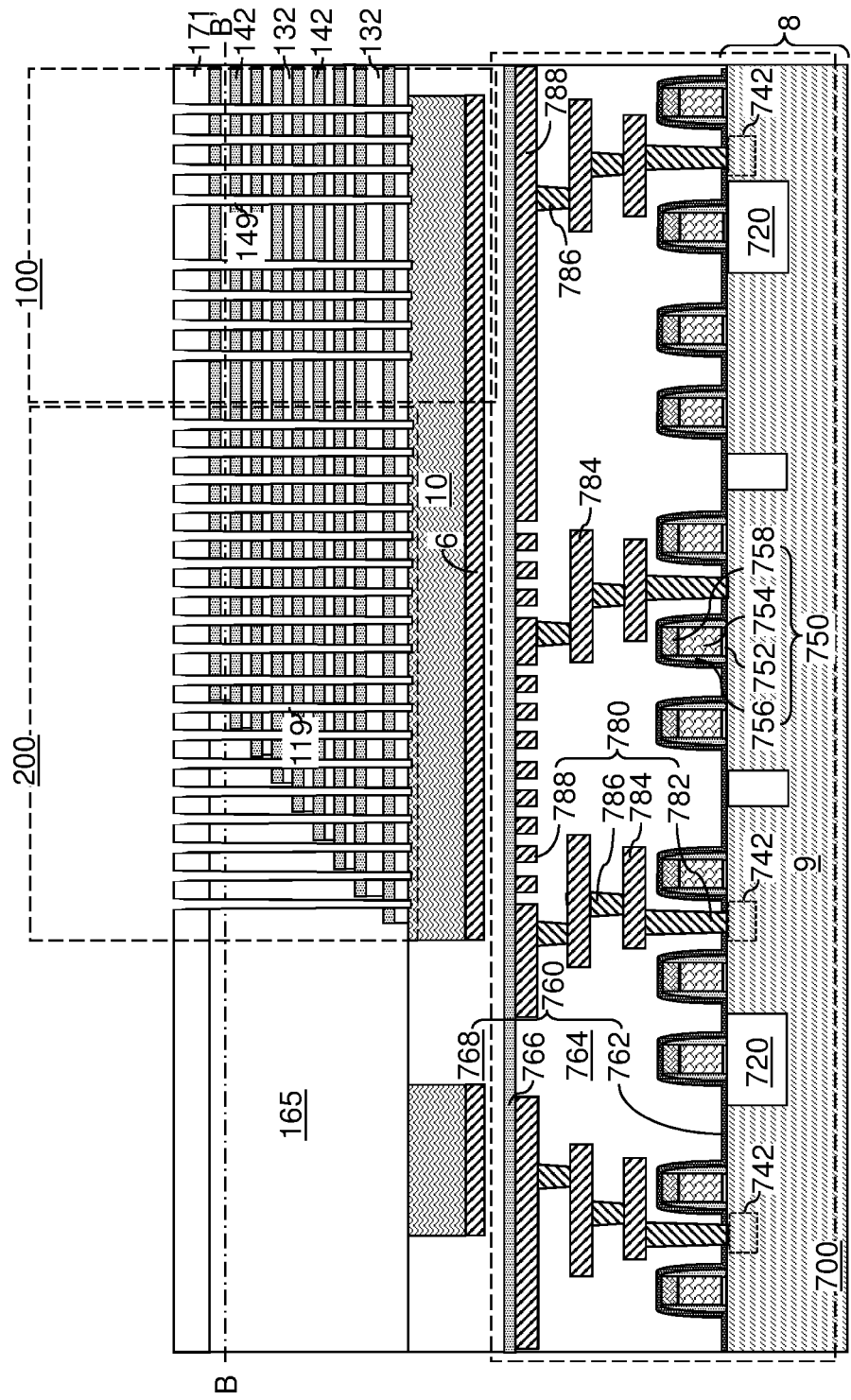
FIG. 4A is a vertical cross-sectional view of the first exemplary structure after formation of a first inter-tier dielectric layer, first-tier memory openings, and first-tier support openings according to the first embodiment of the present disclosure.
Figure 4B:
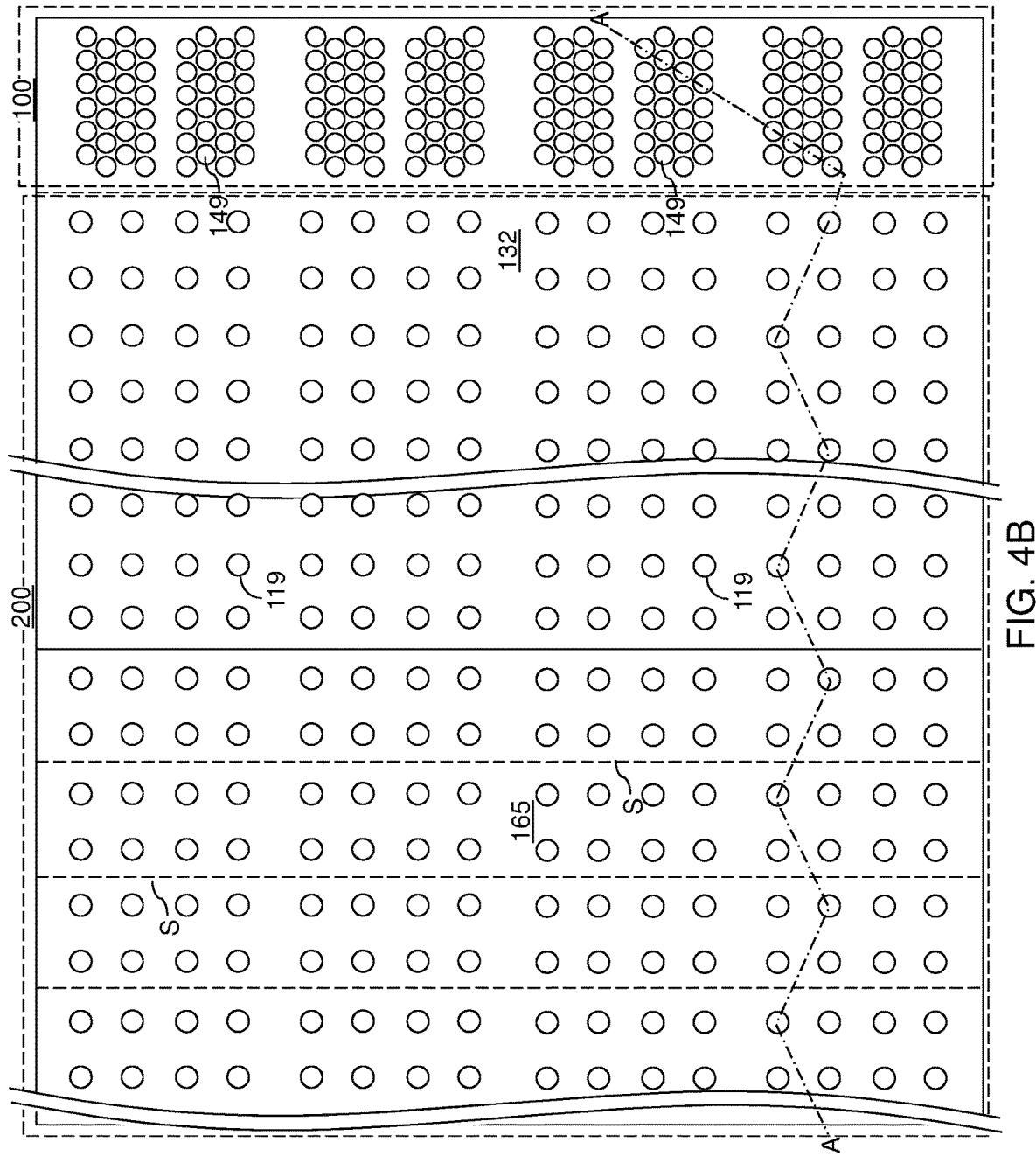
FIG. 4B is a horizontal cross-sectional view of the first exemplary structure along the horizontal plane B-B' in FIG. 4A. The zig-zag vertical plane A-A' corresponds to the plane of the vertical cross-sectional view of FIG. 4A.

Referring to FIGS. 4A and 4B, first-tier memory openings 149 and first-tier support openings 119 can be formed. The first-tier memory openings 149 and the first-tier support openings 119 extend through the first alternating stack (132, 142) at least to a top surface of the planar semiconductor material layer 10. The first-tier memory openings 149 can be formed in the memory array region 100 at locations at which memory stack structures including vertical stacks of memory elements are to be subsequently formed. The first-tier support openings 119 can be formed in the word line staircase region 200. For example, a lithographic material stack (not shown) including at least a photoresist layer can be formed over the first inter-tier dielectric layer 171, and can be lithographically patterned to form openings within the lithographic material stack. The pattern in the lithographic material stack can be transferred through the first inter-tier dielectric layer 171, and through the entirety of the first alternating stack (132, 142) by at least one anisotropic etch that employs the patterned lithographic material stack as an etch mask layer. Portions of the first inter-tier dielectric layer 171 and the first alternating stack (132, 142) underlying the openings in the patterned lithographic material stack are etched to form the first-tier memory openings 149 and the first-tier support openings 119. In other words, the transfer of the pattern in the patterned lithographic material stack through the first inter-tier dielectric layer 171 and the first alternating stack (132, 142) forms the first-tier memory openings 149 and the first-tier support openings 119.

In one embodiment, the chemistry of the anisotropic etch process employed to etch through the materials of the first alternating stack (132, 142) can alternate to optimize etching of the first and second materials in the first alternating stack (132, 142). The anisotropic etch can be, for example, a series of reactive ion etches or a single etch (e.g., a $CF_4/O_2/Ar$ reactive ion etch). The sidewalls of the first-tier memory openings 149 and the first-tier support openings 119 can be substantially vertical, or can be tapered. Subsequently, the patterned lithographic material stack can be subsequently removed, for example, by ashing.

Figure 5:
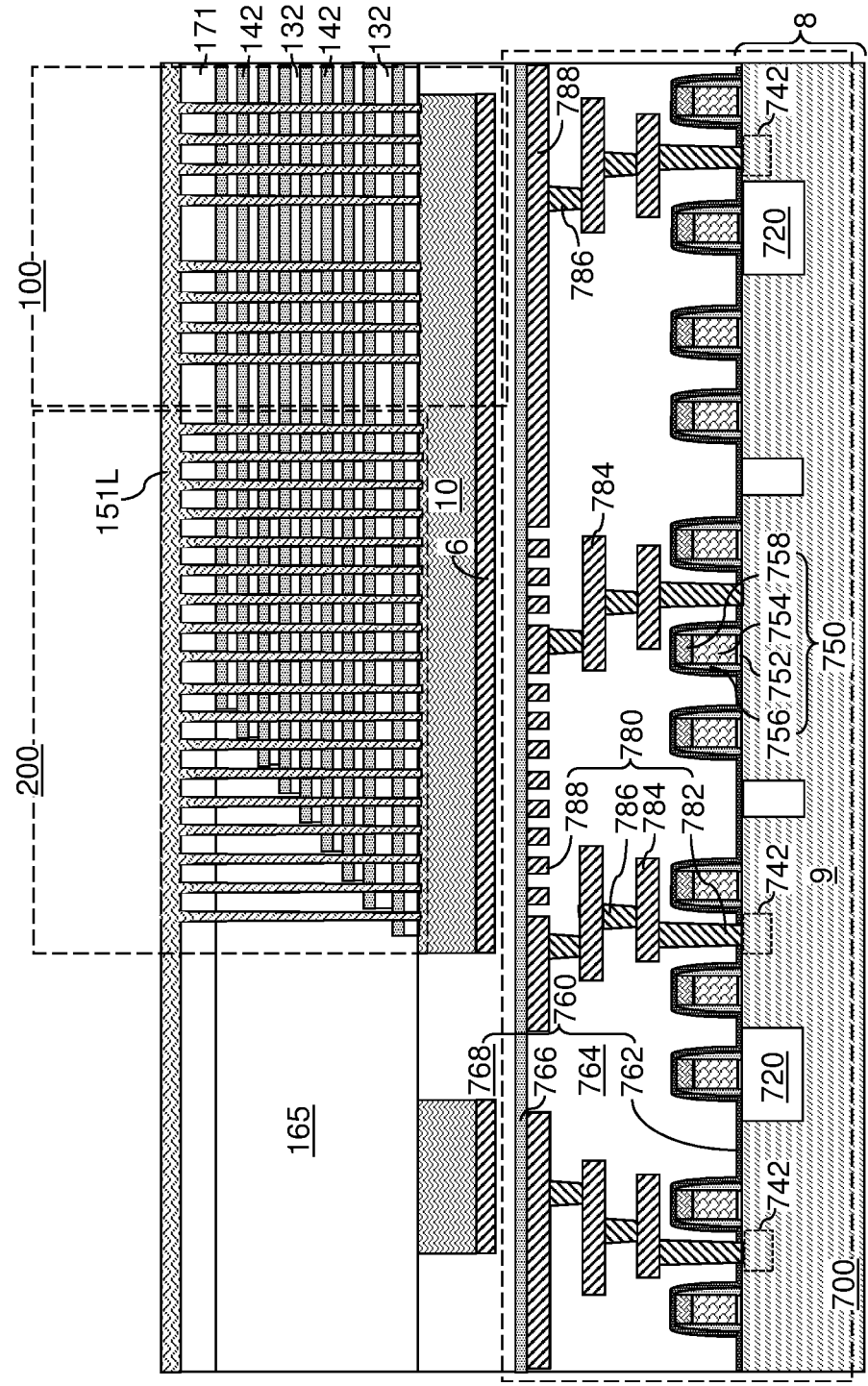
FIG. 5 is a vertical cross-sectional view of the first exemplary structure after formation of a sacrificial fill material layer according to the first embodiment of the present disclosure.
Figure 6A:
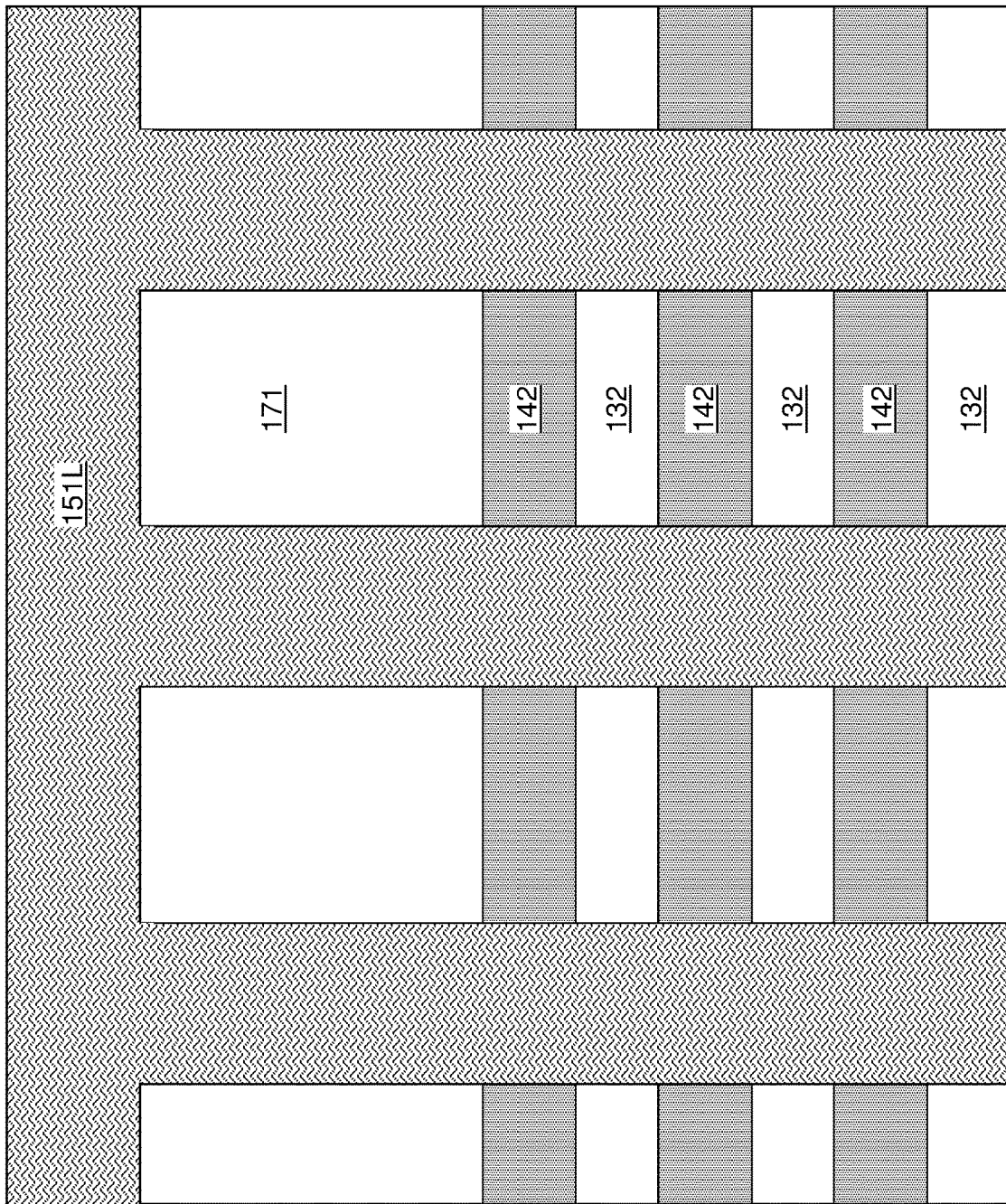
FIGS. 6A-6G are sequential vertical cross-sectional views of a region of the first exemplary structure during formation of sacrificial memory opening fill structures and a second inter-tier dielectric layer according to the first embodiment of the present disclosure.

Referring to FIGS. 5 and 6A, a sacrificial fill material layer 151L is deposited in the first-tier memory openings 149 and the first-tier support openings 119. The sacrificial fill material layer 151L includes a sacrificial fill material which can be subsequently removed selective to the materials of the first insulating layers 132 and the first sacrificial material layers 142. In one embodiment, the sacrificial fill material layer 151L can include amorphous silicon, polysilicon, germanium, a silicon-germanium alloy, carbon, borosilicate glass (which provides higher etch rate relative to undoped silicate glass), porous or non-porous organosilicate glass, organic polymer, or inorganic polymer. In one embodiment, the sacrificial fill material layer 151L can include a first sacrificial material selected from a semiconductor material, amorphous carbon, diamond-like carbon, inorganic polymer, and an organic polymer. In one embodiment, the sacrificial fill material layer 151L can include a semiconductor material, such as amorphous silicon or polysilicon. Optionally, a thin etch stop layer (such as a silicon oxide layer having a thickness in a range from 1 nm to 3 nm) may be employed prior to depositing the sacrificial fill material layer 151L. If an etch stop layer is employed, semiconductor materials, such as amorphous silicon, may be employed as the sacrificial fill material. The sacrificial fill material layer 151L may be formed by a non-conformal deposition or a conformal deposition method.

Figure 6B:
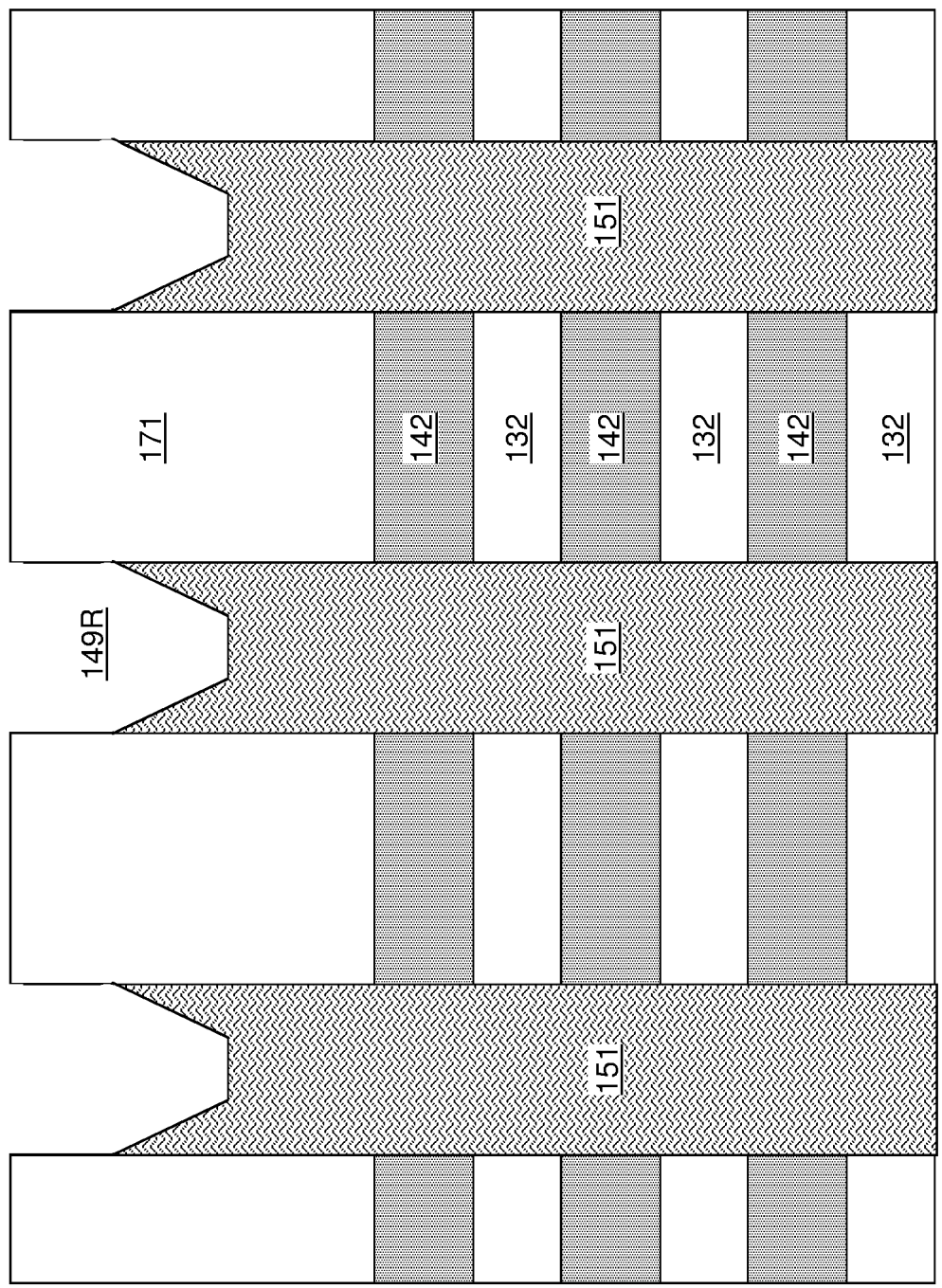

Referring to FIG. 6B, the semiconductor fill material layer 151L can be vertically recessed by performing a recess etch process, which may comprise an isotropic etch process or an anisotropic etch process. In one embodiment, an anisotropic etch process may be employed to vertically recess the semiconductor fill material. Each remaining portion of the semiconductor fill material layer 151L comprises a semiconductor fill material portion 151. In one embodiment, each semiconductor fill material portion 151 has a respective top surface located below the horizontal plane including the top surface of the first inter-tier dielectric layer 171 and above the horizontal plane including the bottom surface of the first inter-tier dielectric layer 171. In one embodiment, the semiconductor fill material portions 151 may have a respective contoured top surface in which a periphery of the respective contoured top surface is located above the center portion of the respective contoured top surface. A recess cavity 149R can be present over the top surface of each semiconductor fill material portion and underneath a horizontal plane including the top surface of the first inter-tier dielectric layer 171 after the etch process.

Figure 6C:
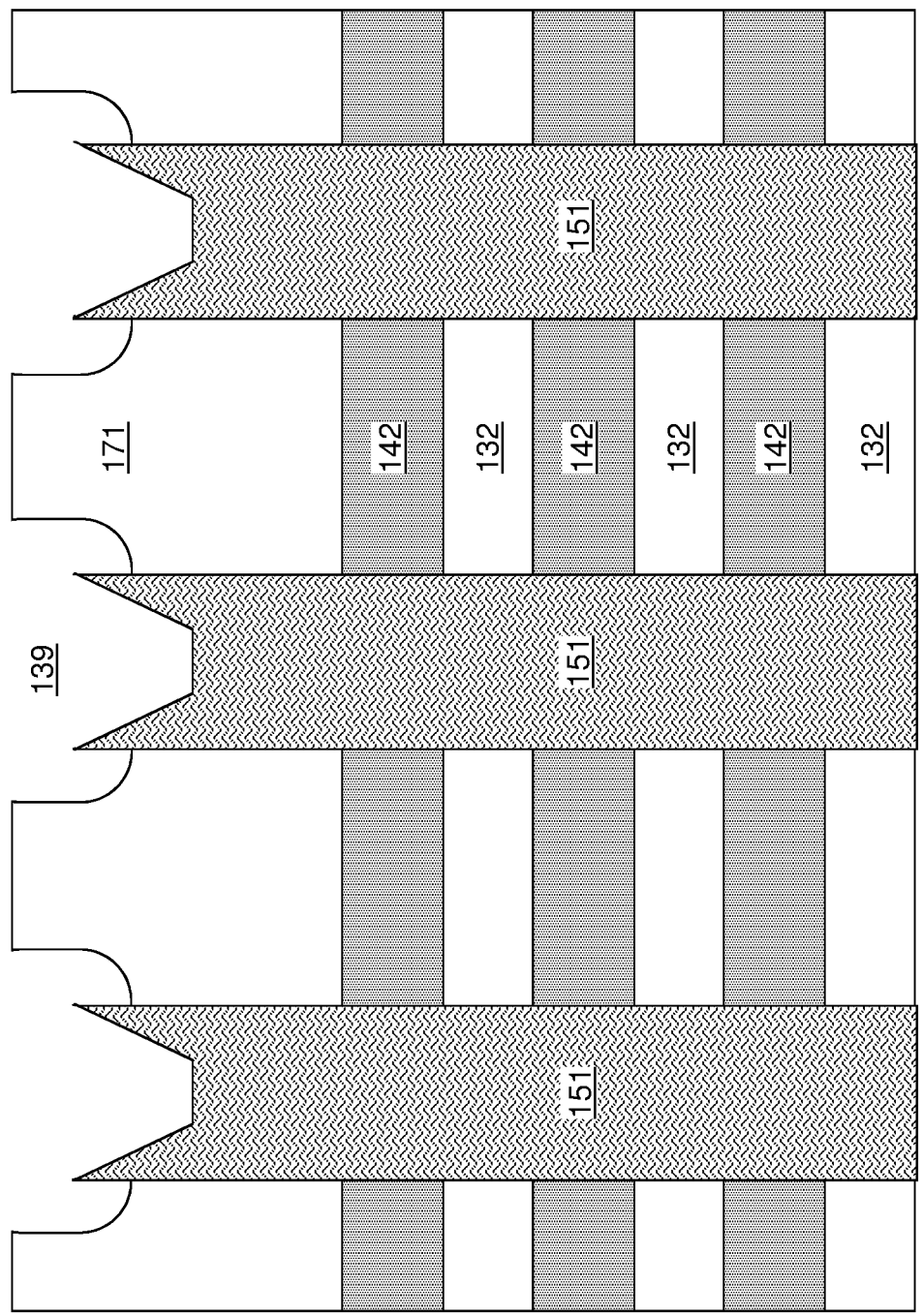

Referring to FIG. 6C, an additional etch process can be performed to laterally expand the recess cavities 149R to form discrete cavities 139 having a tapered sidewall. In one embodiment, the additional etch process etches a material of the first inter-tier dielectric layer 171 selective to the semiconductor fill material portions 151. In one embodiment, the additional etch process comprises an isotropic etch process that isotropically recesses physically exposed surfaces of the first inter-tier dielectric layer 171. In an illustrative example, the semiconductor fill material portions 151 may comprise amorphous silicon or polysilicon, and the additional etch process may comprise a wet etch process employing dilute hydrofluoric acid. Physically exposed surfaces of the first inter-tier dielectric layer 171 may comprise concave annular surfaces having a respective bottom periphery that is adjoined to a cylindrical sidewall of a respective semiconductor fill material portion 151.

Figure 6D:
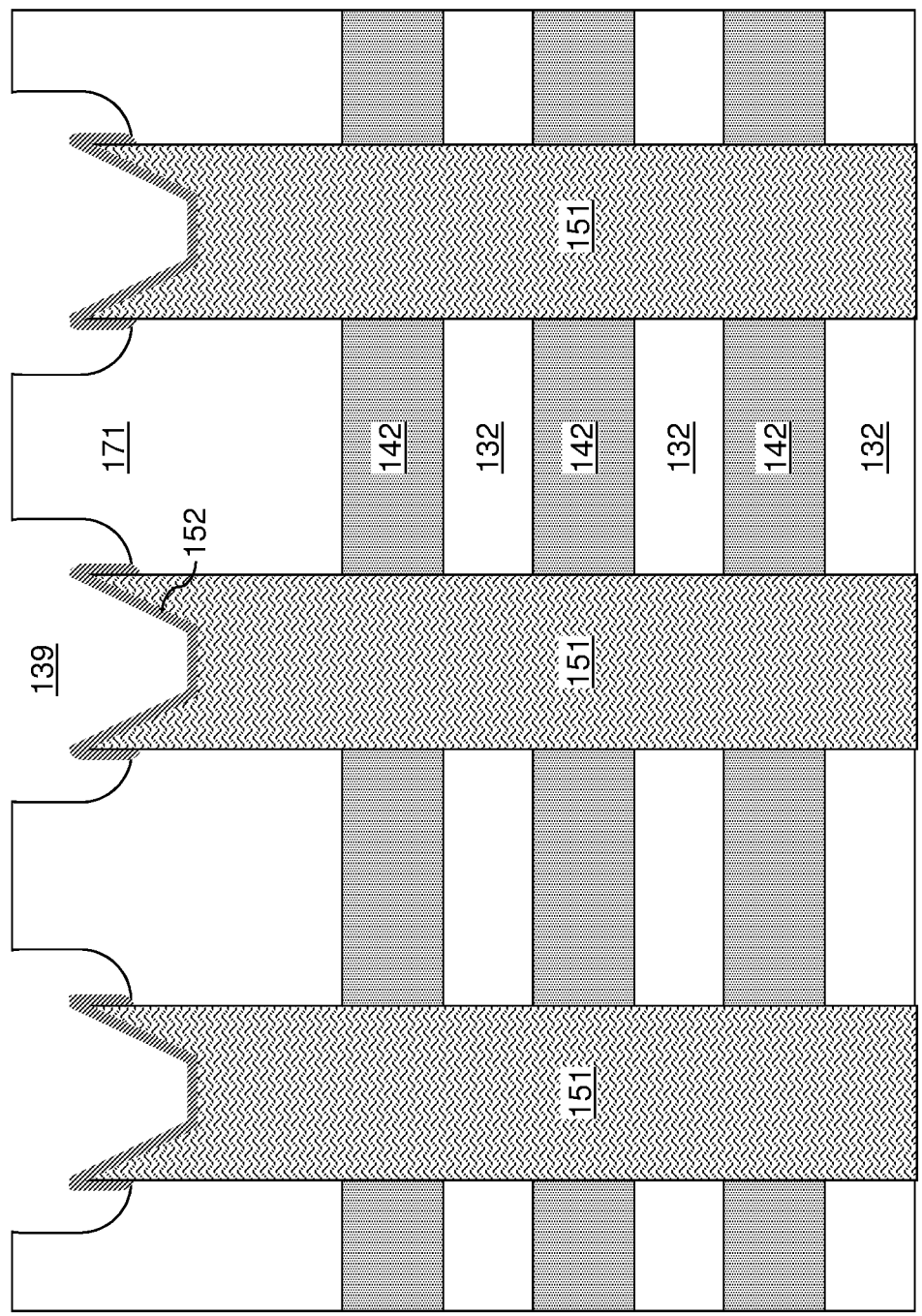

Referring to FIG. 6D, a semiconductor oxide (e.g., a silicon oxide) liner 152 can optionally be formed on a top surface of each semiconductor fill material portion 151 in the discrete cavities 139. In one embodiment, the semiconductor oxide liners 152 may be formed by thermal oxidation or plasma oxidation of a surface portion of the semiconductor fill material portions 151. Each semiconductor oxide liner 152 can be formed on a top surface of a respective semiconductor fill material portion 151 and on physically exposed portions of the cylindrical sidewall of the respective semiconductor fill material portion 151. In one embodiment, the semiconductor oxide liner 152 may comprise a silicon oxide adhesion layer having a thickness in a range from 1 nm to 20 nm, such as from 2 nm to 8 nm, although lesser and greater thicknesses may also be employed.

Figure 6E:
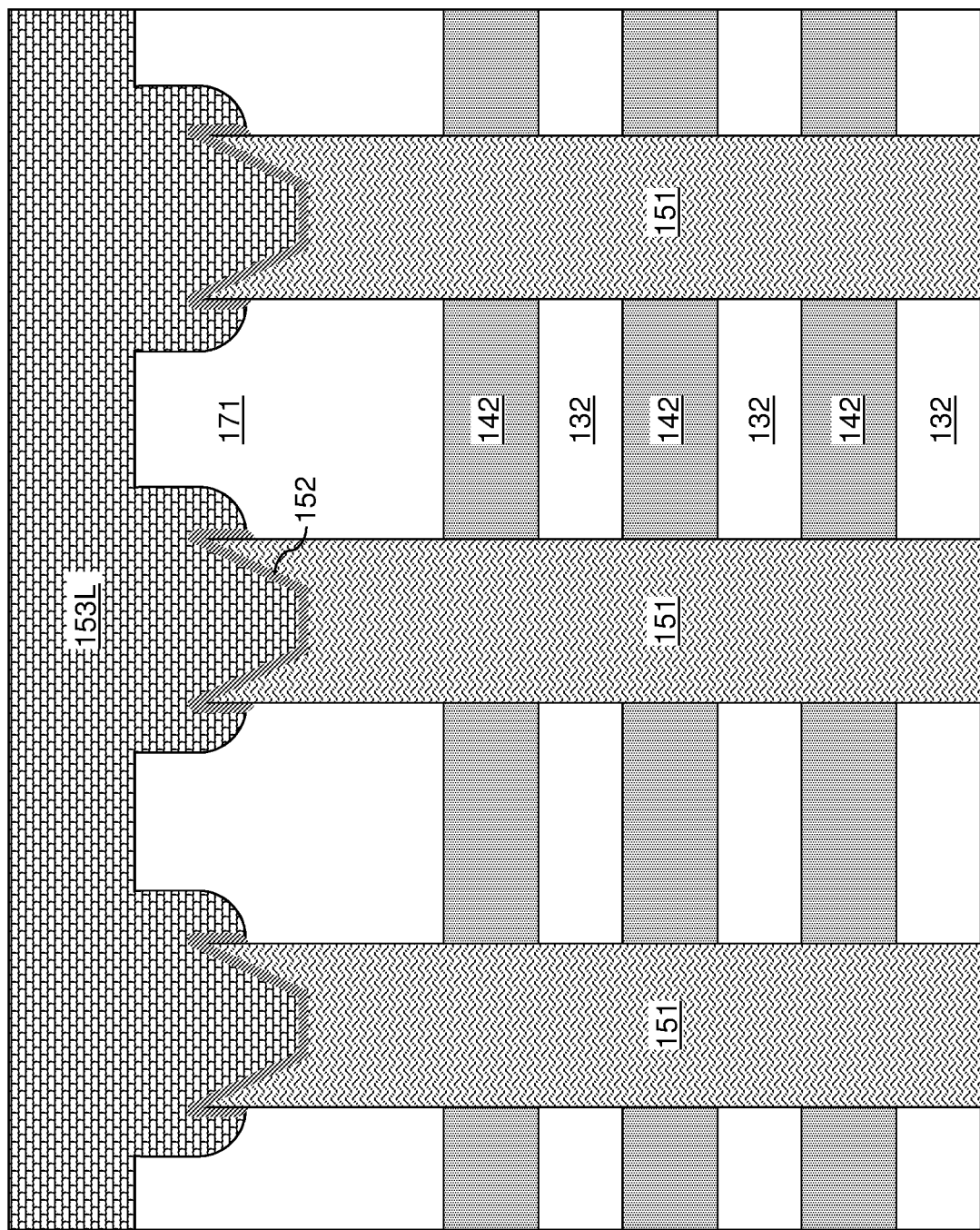

Referring to FIG. 6E, a metallic fill material layer 153L can be deposited in the recesses (e.g., the discrete cavities 139) over the semiconductor fill material portions 151 and over the topmost surface of the first inter-tier dielectric layer 171. The metallic fill material layer 153L comprises an electrically conductive material, which may be a metal, an intermetallic alloy, or a metal nitride material. In one embodiment, the metallic fill material layer 153L comprises an electrically conductive etch stop material that can provide high etch resistance during an anisotropic etch process to be subsequently employed to form second-tier openings through a second alternating stack to be subsequently formed. In one embodiment, the metallic fill material layer 153L comprises and/or consists essentially of a refractory metal selected from W, Ta, Mo or Nb. For example, the metallic fill material layer 153L may comprise a tungsten etch stop layer formed on the silicon oxide adhesion layer 152 which promotes adhesion and reduces peeling of the tungsten etch stop layer.

Figure 6F:
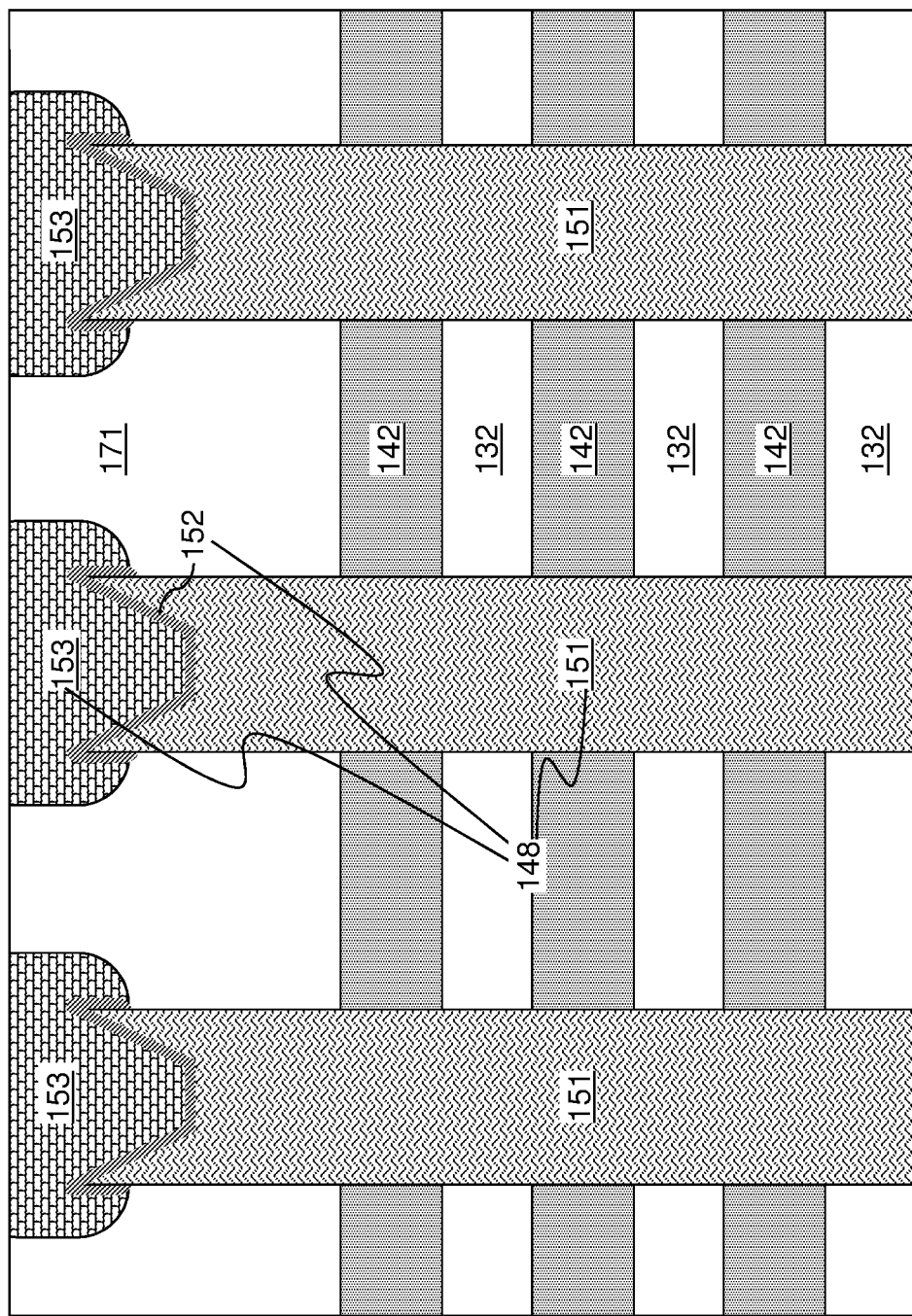

Referring to FIG. 6F, portions of the metallic fill material layer 153L located above the horizontal plane including the top surface of the first inter-level dielectric layer 171 may be removed by a planarization process. The planarization process may comprise a chemical mechanical polishing (CMP) process and/or a recess etch process. Each remaining portion of the metallic fill material layer 153L constitutes a metallic fill material portion (e.g., etch stop portion) 153. Each metallic fill material portion 153 is formed over a respective silicon oxide liner 152, and is spaced from a respective underlying semiconductor fill material portion 151 by the respective silicon oxide liner 152. Each contiguous combination of a semiconductor fill material portion 151, a silicon oxide liner 152, and a metallic fill material portion 153 that fills a first-tier memory opening 149 constitutes a sacrificial memory opening fill structure 148. Each contiguous combination of a semiconductor fill material portion 151, a silicon oxide liner 152, and a metallic fill material portion 153 that fills a first-tier support opening 119 constitutes a sacrificial support opening fill structure (not illustrated).

Figure 6G:
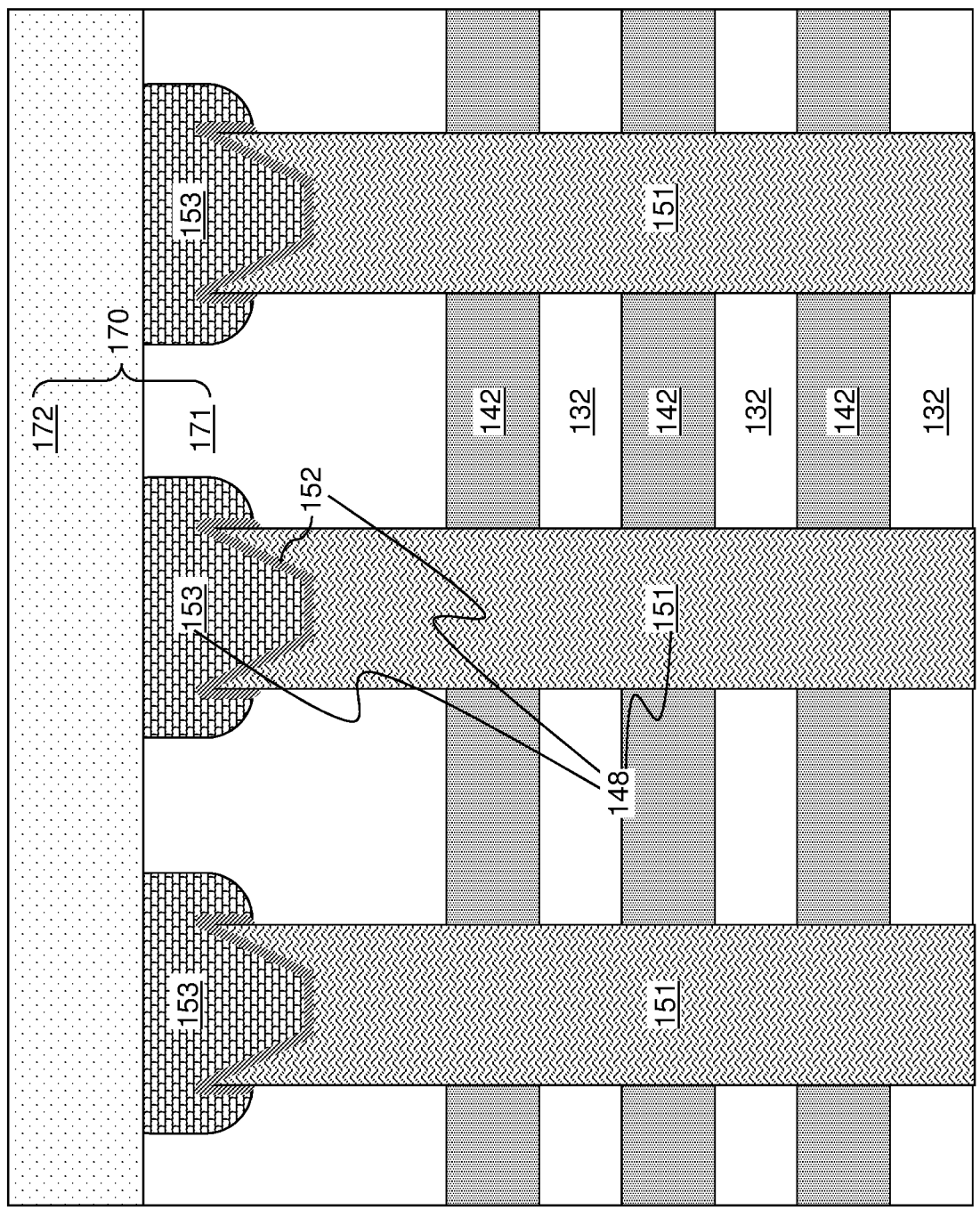

Referring to FIG. 6G, a second inter-tier dielectric layer 172 can be formed over the first inter-tier dielectric layer 171, the sacrificial memory opening fill structures 148, and the sacrificial support opening fill structures. The thickness of the inter-tier dielectric layer 172 may be in a range from 20 nm to 300 nm, such as from 40 nm to 150 nm, although lesser and greater thicknesses may also be employed. In one embodiment, the second inter-tier dielectric layer 172 comprises a second silicon oxide material. In one embodiment, the second silicon oxide material may have a different material composition than the first silicon oxide material of the first inter-tier dielectric layer 171 such that an etch rate of the second silicon oxide material in 100:1 dilute hydrofluoric acid at room temperature is greater than an etch rate of the first silicon oxide material in the 100:1 dilute hydrofluoric acid at room temperature by a factor in a range from 2 to 1,000. In one embodiment, the first inter-tier dielectric layer 171 comprises undoped silicate glass, and the second inter-tier dielectric layer 172 comprises a doped silicate glass (i.e., doped silicon oxide) such as phosphosilicate glass (PSG), borosilicate glass (BSG), borophosphosilicate glass (BPSG), or organosilicate glass (i.e., carbon containing silicon oxide). The combination of the first inter-tier dielectric layer 171 and the second inter-tier dielectric layer 172 is herein referred to as an inter-tier dielectric layer 170, or more generally as at least one inter-tier dielectric layer.

Figure 7:
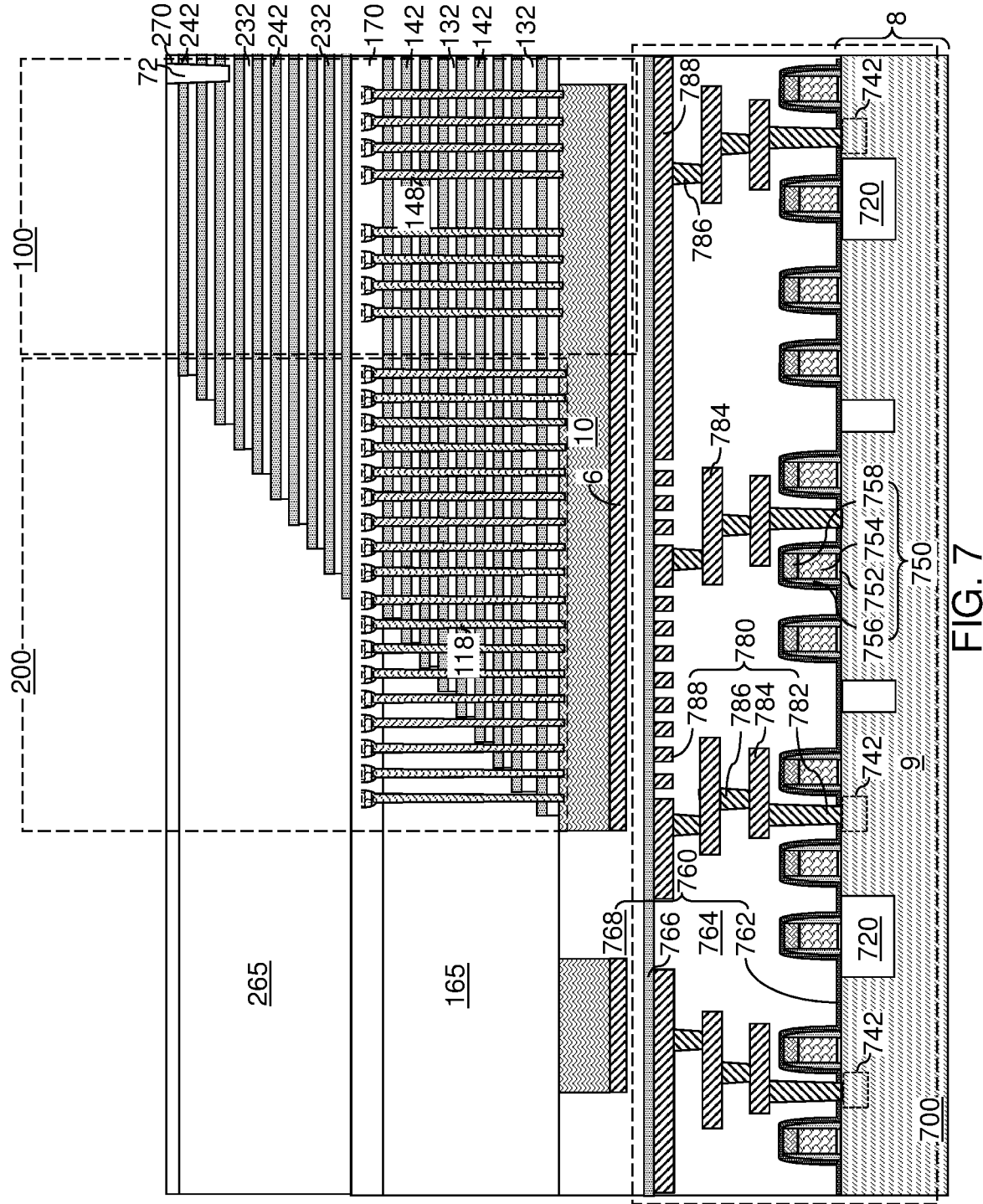
FIG. 7 is a vertical cross-sectional view of the first exemplary structure after formation of a second alternating stack of second insulating layers and second spacer material layers, a second-tier retro-stepped dielectric material portion, and a second insulating cap layer according to the first embodiment of the present disclosure.

Referring to FIG. 7, sacrificial memory opening fill structures 148 and sacrificial support opening fill structures 118 are illustrated, which extend through the first alternating stack (132, 142) and the inter-tier dielectric layers 170. A second-tier structure can be formed over the first-tier structure (132, 142, 170, 148, 118). The second-tier structure can include an additional alternating stack of insulating layers and spacer material layers, which can be sacrificial material layers. For example, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

Second stepped surfaces in the second stepped area can be formed in the staircase region 200 employing a same set of processing steps as the processing steps employed to form the first stepped surfaces in the first stepped area with suitable adjustment to the pattern of at least one masking layer. A second-tier retro-stepped dielectric material portion 265 can be formed over the second stepped surfaces in the word line staircase region 200.

An insulating cap layer 270 can be subsequently formed over the second alternating stack (232, 242). The insulating cap layer 270 includes a dielectric material that is different from the material of the second sacrificial material layers 242. In one embodiment, the insulating cap layer 270 can include silicon oxide. In one embodiment, the first and second sacrificial material layers (142, 242) can comprise silicon nitride.

Generally speaking, at least one alternating stack of insulating layers (132, 232) and spacer material layers (such as sacrificial material layers (142, 242)) can be formed over the planar semiconductor material layer 10, and at least one retro-stepped dielectric material portion (165, 265) can be formed over the staircase regions on the at least one alternating stack (132, 142, 232, 242).

Optionally, drain-select-level shallow trench isolation structures 72 can be formed through a subset of layers in an upper portion of the second alternating stack (232, 242). The second sacrificial material layers 242 that are cut by the select-drain-level shallow trench isolation structures 72 correspond to the levels in which drain-select-level electrically conductive layers are subsequently formed. The drain-select-level shallow trench isolation structures 72 include a dielectric material such as silicon oxide.

Figure 8A:
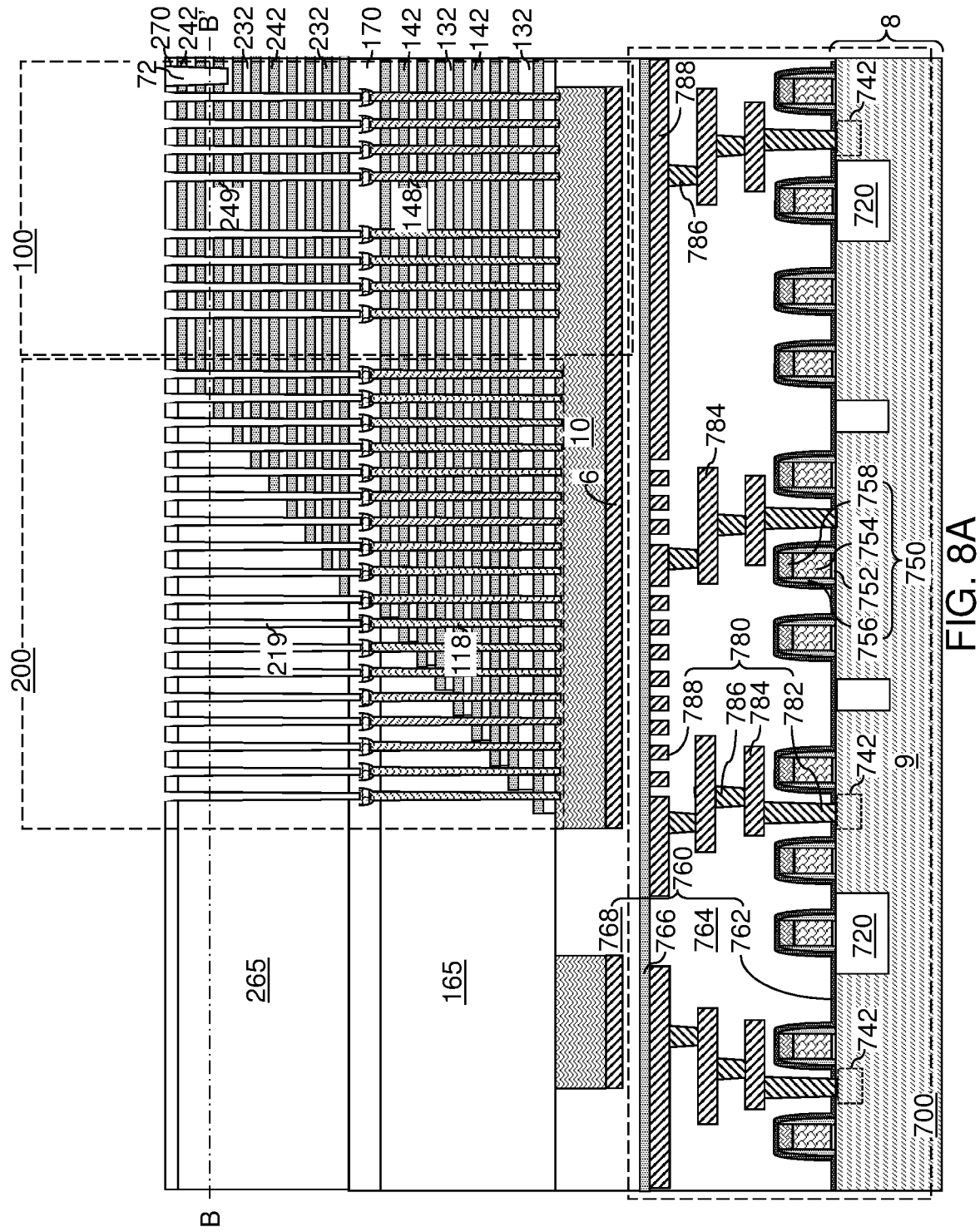
FIG. 8A is a vertical cross-sectional view of the first exemplary structure after formation of second-tier memory openings and second-tier support openings according to the first embodiment of the present disclosure.
Figure 8B:
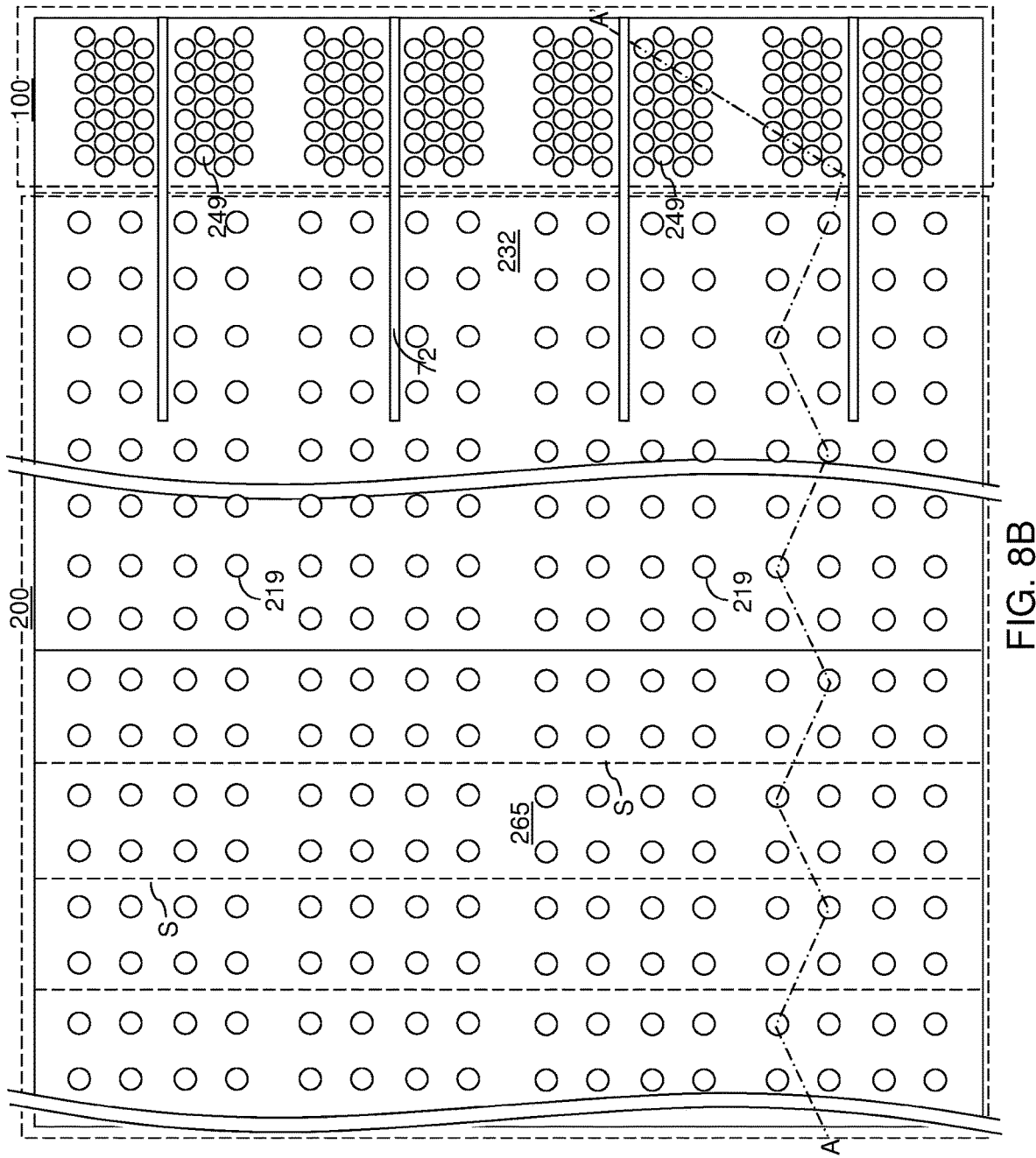
FIG. 8B is a horizontal cross-sectional view of the first exemplary structure along the horizontal plane B-B' in FIG. 8A. The zig-zag vertical plane A-A' corresponds to the plane of the vertical cross-sectional view of FIG. 8A.
Figure 9A:
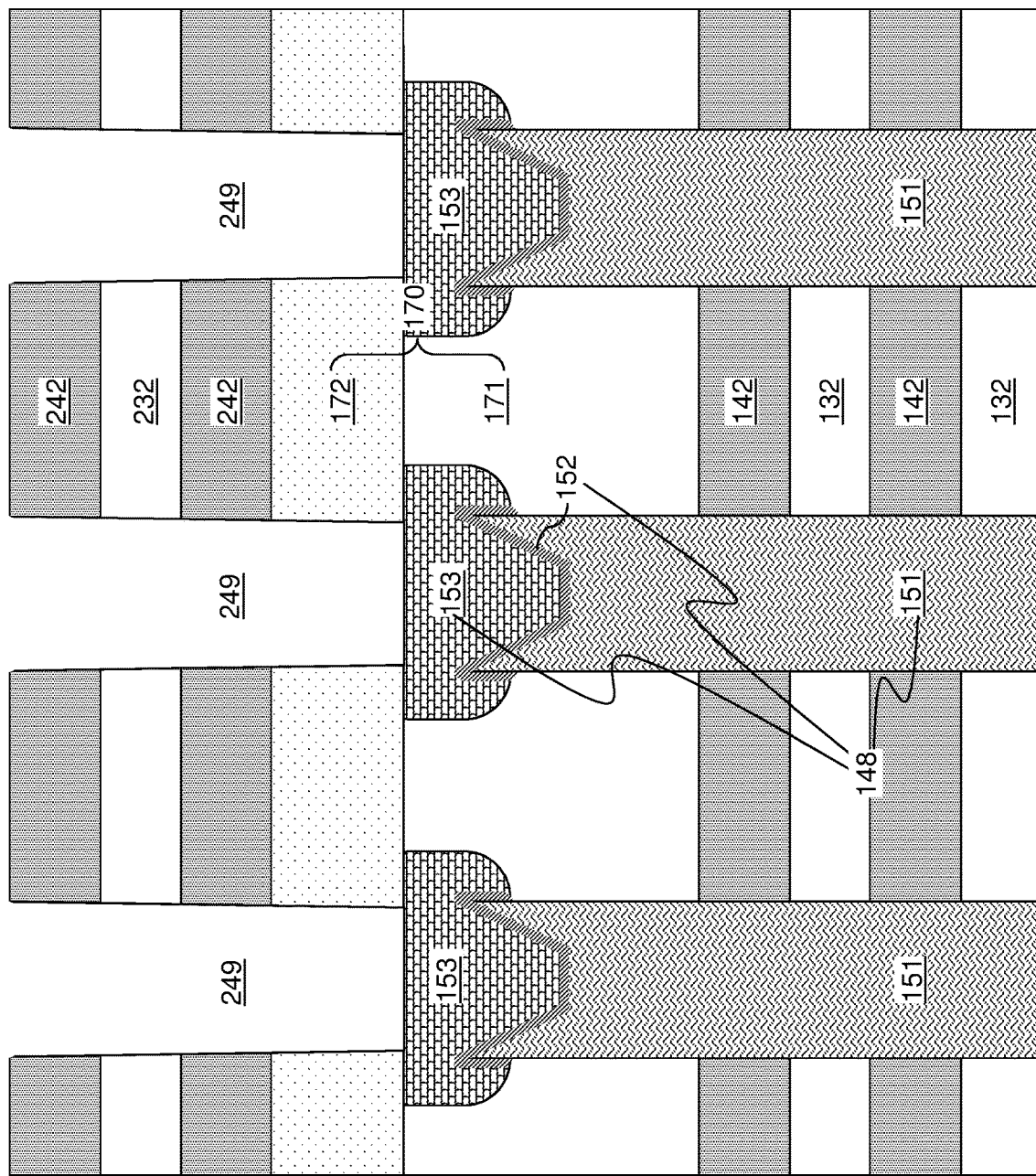
FIGS. 9A-9D are sequential vertical cross-sectional views of a region of the first exemplary structure during formation of inter-tier memory openings according to the first embodiment of the present disclosure.

Referring to FIGS. 8A, 8B, and 9A, second-tier memory openings 249 and second-tier support openings 219 extending through the second-tier structure (232, 242, 270, 265) are formed in areas overlying the sacrificial fill structures (148, 118). A photoresist layer can be applied over the second-tier structure (232, 242, 270, 265), and can be lithographically patterned to form a same pattern as the pattern of the sacrificial memory opening fill structures 148 and the sacrificial support opening fill structures 118, i.e., the pattern of the first-tier memory openings 149 and the first-tier support openings 119. Thus, the lithographic mask employed to pattern the first-tier memory openings 149 and the first-tier support openings 119 can be employed to pattern the second-tier memory openings 249 and the second-tier support openings 219.

An anisotropic etch can be performed to transfer the pattern of the lithographically patterned photoresist layer through the second-tier structure (232, 242, 270, 265). In one embodiment, the chemistry of the anisotropic etch process employed to etch through the materials of the second alternating stack (232, 242) can alternate to optimize etching of the alternating material layers in the second alternating stack (232, 242). The anisotropic etch can be, for example, a series of reactive ion etches. The anisotropic etch process may have an etch chemistry that is selective to the metallic material of the metallic fill material portions 153, which function as an etch stop.

The metallic fill material portions 153 also prevent or reduce the formation of a carbon containing etch residue which may be formed on the top of the semiconductor fill material portions 151 after the reactive ion etch which uses a carbon containing etch gas. The etch residue may clog the bottom of the second-tier memory openings 249, which may cause narrowing of the bottom of the second-tier memory openings 249, which in turn may lead to memory cell characteristic degradation and open circuit failures (e.g., discontinuous channels) in memory opening fill structures to be deposited in the memory openings. By reducing or eliminating the carbon containing etch residue, such problems may be reduced or avoided.

The patterned lithographic material stack can be removed, for example, by ashing after the anisotropic etch process. A top surface of an underlying sacrificial memory opening fill structure 148 can be physically exposed at the bottom of each second-tier memory opening 249. A top surface of an underlying sacrificial support opening fill structure 118 can be physically exposed at the bottom of each second-tier support opening 219. The top surfaces of the metallic fill material portions 153 can be physically exposed underneath the second-tier memory openings 249 and underneath the second-tier support openings 219.

Figure 9B:
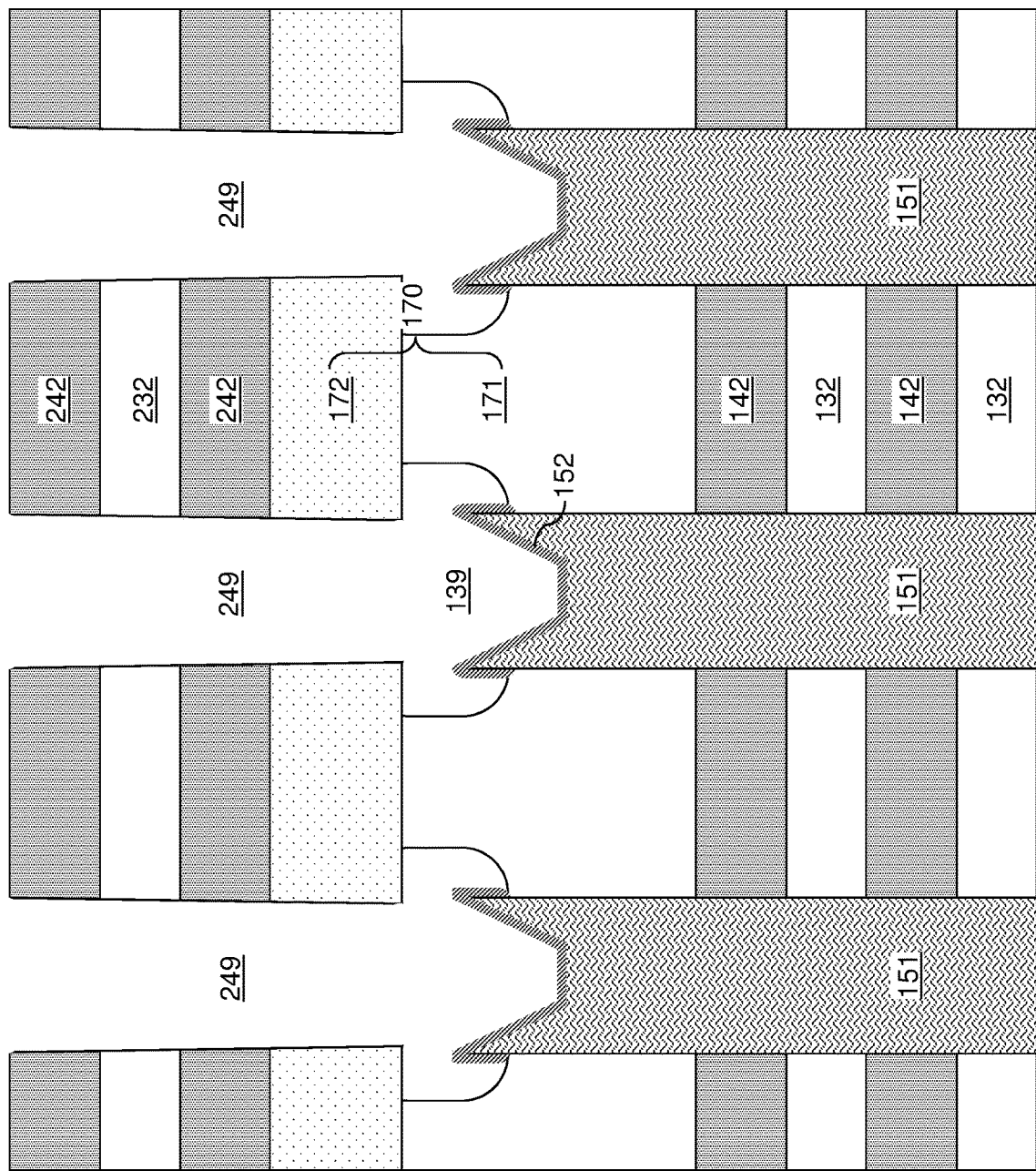

Referring to FIG. 9B, the metallic fill material portions 153 can be removed selective to the materials of the second-tier structure (232, 242, 270, 265), the inter-tier dielectric layers 170, and the semiconductor oxide liners 152 by performing a first isotropic etch process. In an illustrative example, the first isotropic etch process may comprise a wet etch process that etches the material of the metallic fill material portions 153 selective to materials of the semiconductor oxide liners 152, the first inter-tier dielectric layer 171, the second inter-tier dielectric layer 172, the first alternating stack (132, 142), and the second alternating stack (232, 242). For example, if the metallic fill material portions 153 comprise tungsten, a wet etch process employing hydrogen peroxide may be performed.

Figure 9C:
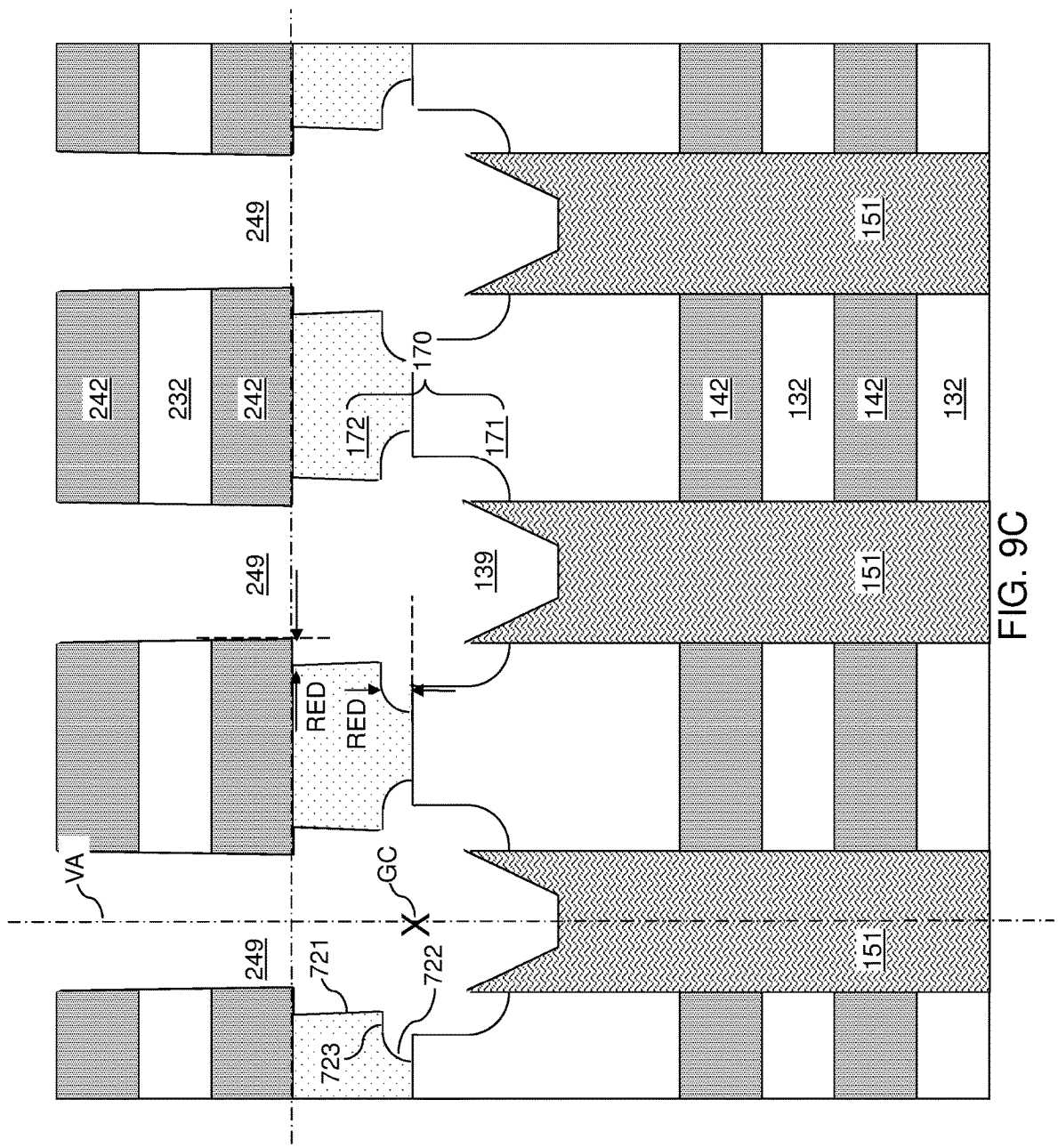

Referring to FIG. 9C, a second isotropic etch process can be performed, which etches the semiconductor oxide liners 152 selective to the material of the semiconductor fill material portions 151. According to an embodiment of the present disclosure, the second isotropic etch process may isotropically recess physically exposed surfaces of the second inter-tier dielectric layer 172 by a recess etch distance RED. In one embodiment, the second isotropic etch process may comprise a wet etch process employing dilute hydrofluoric acid. In one embodiment, the first inter-tier dielectric layer 171 comprises a first silicon oxide material having a first etch rate in 100:1 dilute hydrofluoric acid, and the second inter-tier dielectric layer 172 comprises a second silicon oxide material having a second etch rate in 100:1 dilute hydrofluoric acid that is greater than the first etch rate by a factor in a range from 2 to 1,000. In other words, the ratio of the second etch rate to the first etch rate may be in a range from 2 to 1,000. The lateral recess etch distance of the cylindrical sidewalls of the second inter-tier dielectric layer 172 and the isotropic etch distance of concave surface segments of the second inter-tier dielectric layer 172 may be the same as the recess etch distance RED. In one embodiment, the recess etch distance RED may be in a range from 1 nm to 100 nm, such as from 3 nm to 30 nm, although lesser and greater recess etch distances may also be employed.

In one embodiment, physically exposed surfaces of the second inter-tier dielectric layer 172 around each second-tier memory opening 249 after the second isotropic etch process may comprise a cylindrical sidewall 721 that is laterally offset from a vertical axis VA passing through a geometrical center GC of a respective memory opening (which includes the volume of the second-tier memory opening 249 and a respective underlying first-tier memory opening 149) by a greater lateral distance than a bottom periphery of a sidewall of the second-tier memory opening 249 (located in second alternating stack (232, 242) above the top surface of the second inter-tier dielectric layer 172). The physically exposed surfaces of the second inter-tier dielectric layer 172 around each second-tier memory opening 249 may also have a convex annular surface 722 having a bottom periphery that is adjoined to the top surface of the first inter-tier dielectric layer 172, and a planar annular surface 723 having an outer periphery that is adjoined to an inner periphery of the convex annular surface of the convex annular surface 722 and having an inner periphery that is adjoined to a bottom periphery of the cylindrical sidewall 721. As used herein, a geometrical center of an element refers to the center of gravity of a hypothetical element having a same shape as the element and having a uniform density throughout.

Figure 9D:
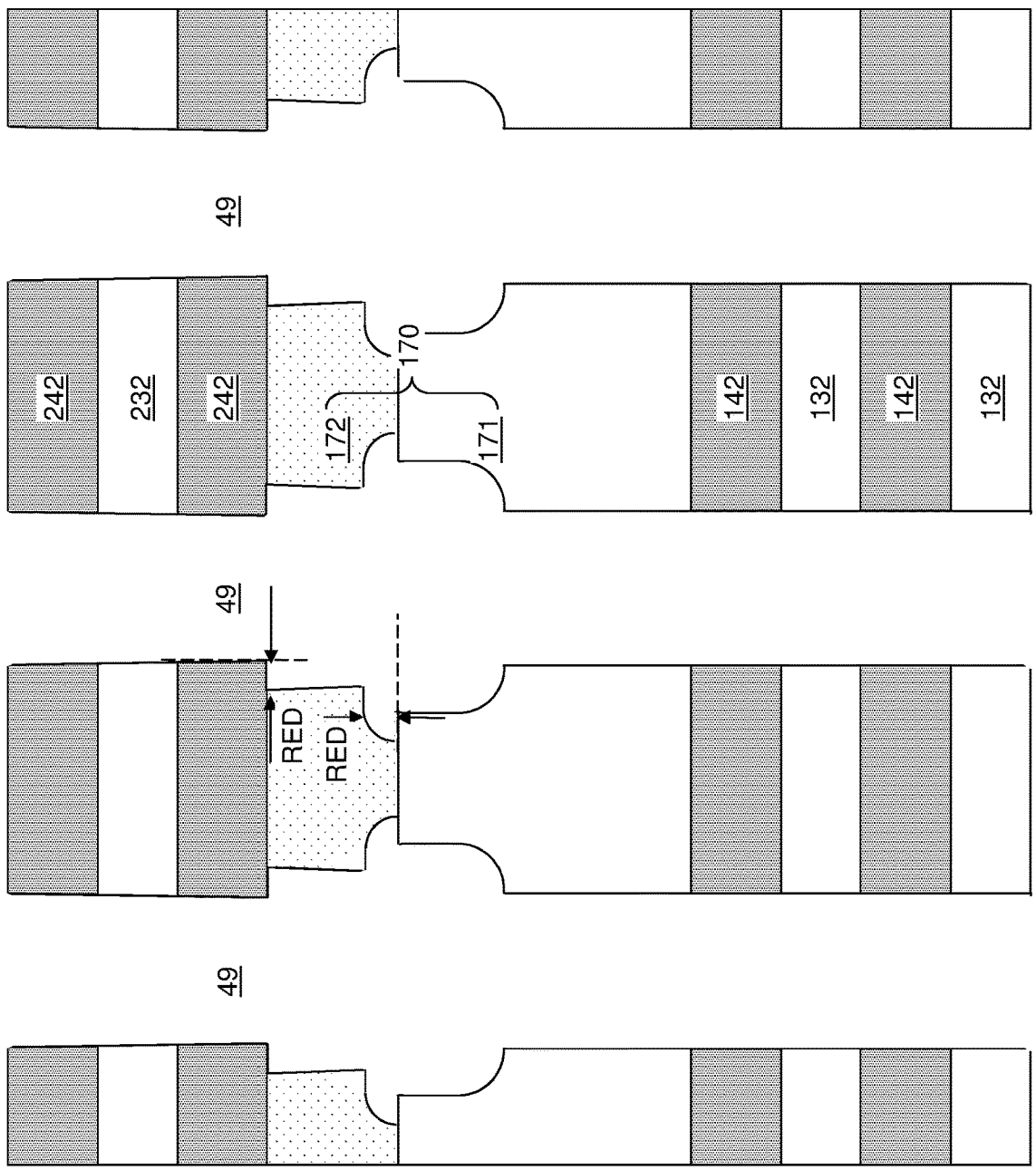
Figure 10:
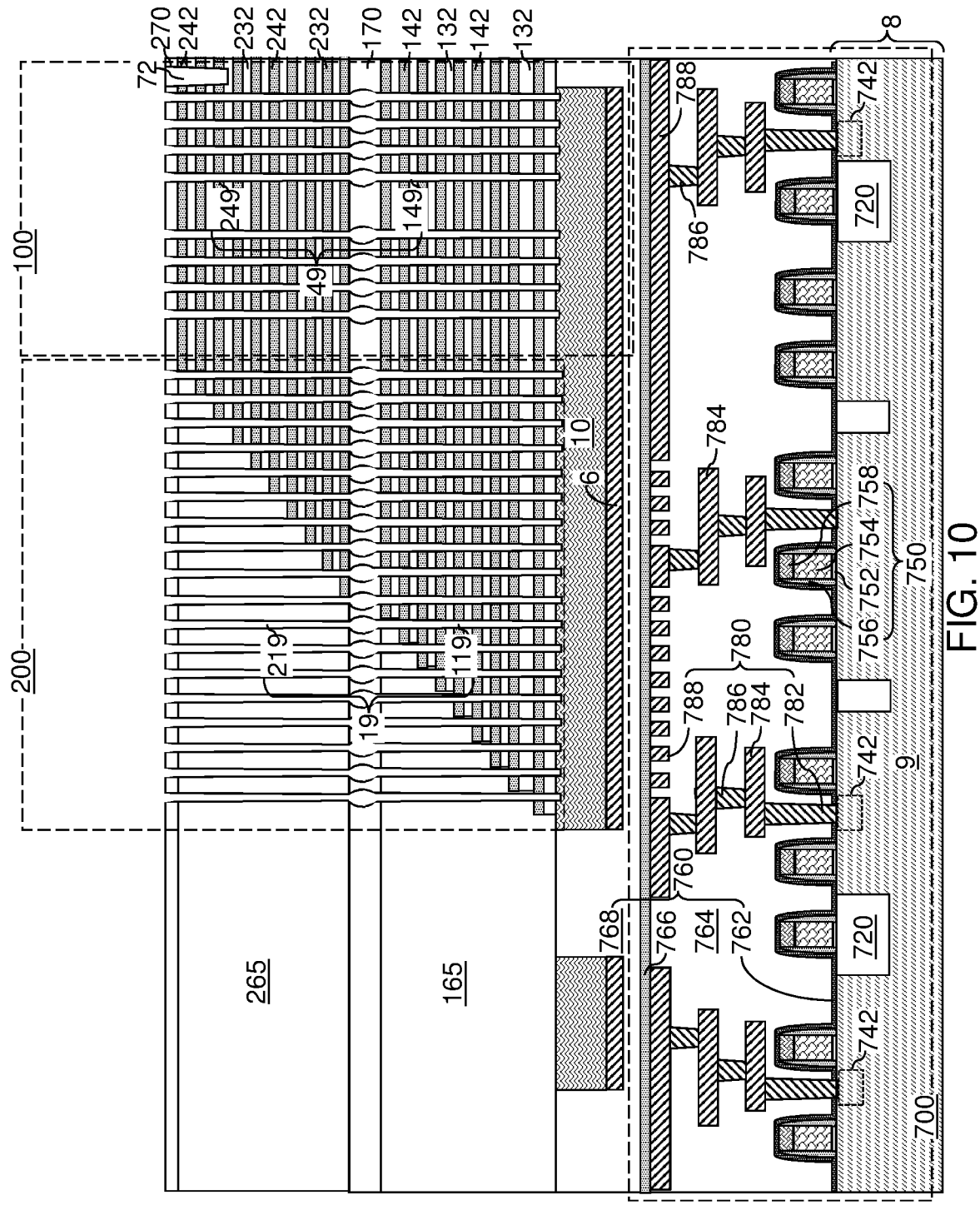
FIG. 10 is a vertical cross-sectional view of the first exemplary structure after formation of inter-tier openings according to the first embodiment of the present disclosure.

Referring to FIGS. 9D and 10, a third isotropic etch process can be performed, which etches the material of the semiconductor fill material portions 151 selective to the materials of the first inter-tier dielectric layer 171, the second inter-tier dielectric layer 172, the first alternating stack (132, 142), and the second alternating stack (232, 242). For example, if the semiconductor fill material portions 151 comprise amorphous silicon or polysilicon, the third isotropic etch process can comprise a wet etch process employing hot trimethyl-2 hydroxyethyl ammonium hydroxide ("hot TMY") or tetramethyl ammonium hydroxide (TMAH). Each contiguous combination of a first-tier memory opening 149 and a second-tier memory opening 249 constitutes a memory opening 49, which is also referred to as an inter-tier memory opening. Each contiguous combination of a first-tier support opening 119 and a second-tier support opening 219 constitutes a support opening 19, which is also referred to as an inter-tier support opening.

FIGS. 11A-11H are sequential vertical cross-sectional views of an inter-tier memory opening 49 in the first exemplary structure during formation of a memory opening fill structure according to the first embodiment of the present disclosure.

Figures 11A, 11B:
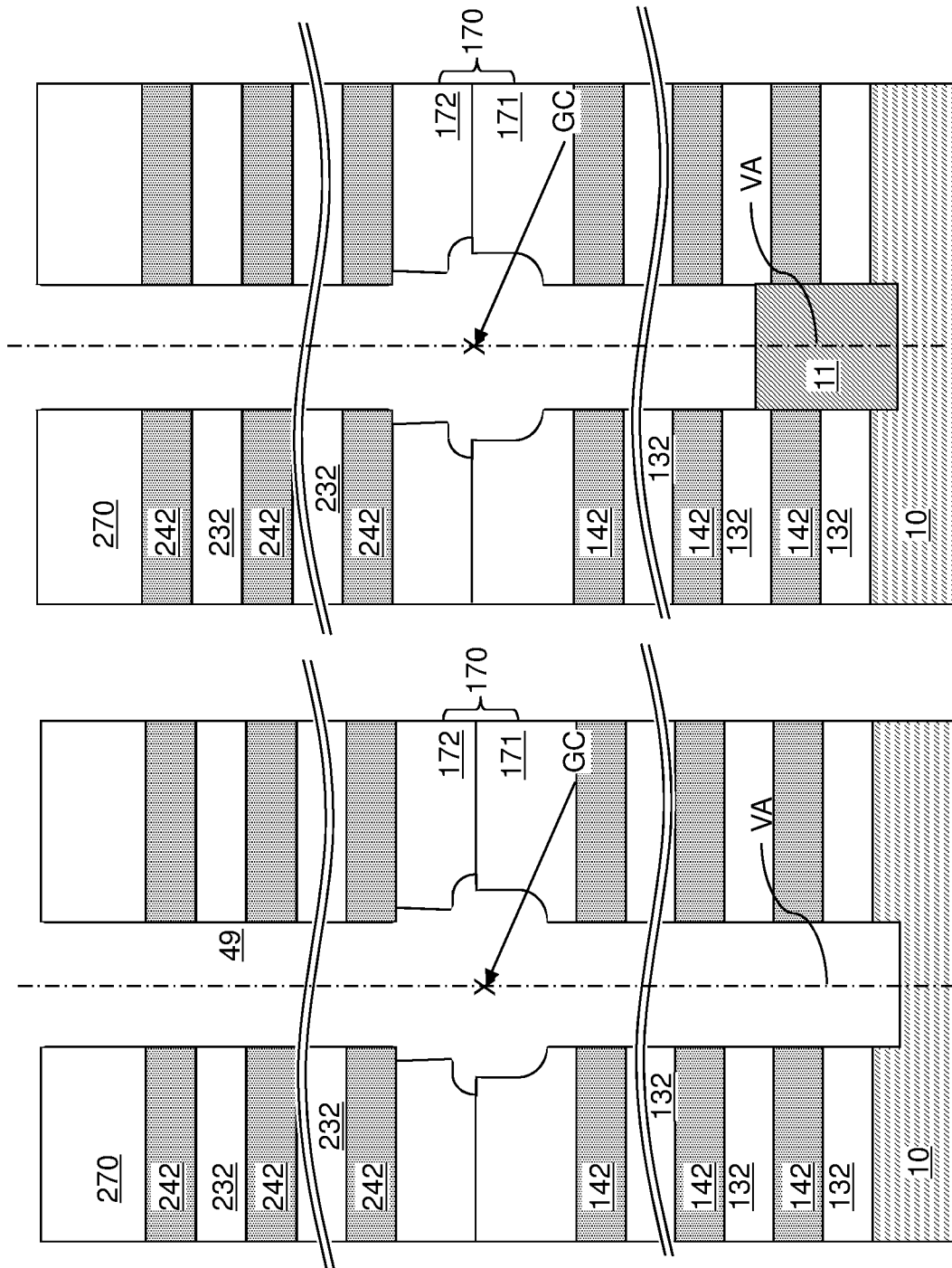

Referring to FIG. 11A, a memory opening 49 in the first exemplary structure of FIG. 10 is illustrated. The memory opening 49 extends through the first-tier structure and the second-tier structure.

Referring to FIG. 11B, a pedestal channel portion 11 can be optionally formed at the bottom of each memory opening 49 by performing a selective epitaxy process. The pedestal channel portion 11 may have a doping of a same conductivity type as the planar semiconductor material layer 10. In one embodiment, the planar semiconductor material layer and the pedestal channel portion 11 may have a doping of a first conductivity type. In one embodiment, a top surface of each pedestal channel portion 11 may be located above the bottommost first sacrificial material layer 142 and below the first sacrificial material layer 142 that overlies the bottommost first sacrificial material layer 142.

Referring to FIG. 11C, a stack of layers including a blocking dielectric layer 52, a charge storage layer 54, a tunneling dielectric layer 56, and an optional first semiconductor channel material layer 601 may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The optional first semiconductor channel material layer 601 includes a semiconductor material having a doping of the first conductivity type. For example, the first semiconductor channel material layer 601 may include at least one elemental semiconductor material, at least one III-V compound semiconductor material, at least one II-VI compound semiconductor material, at least one organic semiconductor material, or other semiconductor materials known in the art. In one embodiment, the first semiconductor channel material layer 601 may comprise an amorphous silicon or polysilicon layer having a uniform doping. In one embodiment, the first semiconductor channel material layer 601 may include dopants of the first conductivity type at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$, although lesser and greater atomic concentrations may also be employed. The first semiconductor channel material layer 601 may be formed by a conformal deposition method such as low pressure chemical vapor deposition (LPCVD). The thickness of the first semiconductor channel material layer 601 may be in a range from 2 nm to 10 nm, although lesser and greater thicknesses may also be used. Alternatively, the first semiconductor channel material layer 601 may be omitted. A cavity may be present in the volume of each memory opening 49 that is not filled with the deposited material layers (52, 54, 56, 601).

Referring to FIG. 11D, an anisotropic etch process may be performed to remove horizontally-extending portions of the deposited material layers (52, 54, 56, 601). A surface of a pedestal channel portion 11 (or a surface of the planar semiconductor material layer 10 in case the pedestal channel portions 11 are not employed) can be physically exposed at the bottom each memory opening 49. According to an aspect of the present disclosure, if present, then each portion of the first semiconductor channel material layer 601 located at the level of the inter-tier dielectric layers 170 can be laterally offset outward from a cylindrical vertical plane including an inner sidewall of a respective first semiconductor channel material layer 601 located within a same memory opening 49.

Referring to FIG. 11E, a second semiconductor channel material layer 602 may be conformally deposited. The second semiconductor channel material layer 602 includes a semiconductor material having a doping of the first conductivity type. The second semiconductor channel material layer 602 may comprise any material that may be employed for the first semiconductor channel material layer 601. In one embodiment, the second semiconductor channel material layer 602 may be an amorphous silicon or polysilicon layer including dopants of the first conductivity type at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$, although lesser and greater atomic concentrations may also be employed. The second semiconductor channel material layer 602 may be formed by a conformal deposition method such as low pressure chemical vapor deposition (LPCVD). The thickness of the second semiconductor channel material layer 602 may be in a range from 2 nm to 10 nm, although lesser and greater thicknesses may also be used. A cavity may be present in the volume of each memory opening 49 that is not filled with the deposited material layers (52, 54, 56, 601, 602).

Referring to FIG. 11F, a dielectric core layer 62L may be deposited in the cavity within each memory opening 49. The dielectric core layer 62L includes a dielectric material such as silicon oxide or organosilicate glass. The dielectric core layer 62L may be deposited by a conformal deposition method such as low pressure chemical vapor deposition (LPCVD), or by a self-planarizing deposition process such as spin coating.

Referring to FIG. 11G, the horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 11H, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material and the second semiconductor channel material layer 602 that overlie the horizontal plane including the top surface of the second insulating cap layer 270 may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0 \times 10^{18}/cm^3$ to $2.0 \times 10^{21}/cm^3$, although lesser and greater dopant concentrations may also be used. The doped semiconductor material may be, for example, doped polysilicon.

Each contiguous combination of a remaining portion of the second semiconductor channel material layer 602 and a first semiconductor channel layer (if present) 601 constitutes a vertical semiconductor channel 60 through which electrical current may flow when a vertical NAND device including the vertical semiconductor channel 60 is turned on. A tunneling dielectric layer 56 laterally surrounds the vertical semiconductor channel 60 and is surrounded by the charge storage layer 54. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of an optional pedestal channel portion 11, a memory stack structure 55, a dielectric core 62, and a drain region 63 within a memory opening 49 constitutes a memory opening fill structure 58. Each combination of an optional pedestal channel portion 11, a memory stack structure 55, a dielectric core 62, and a drain region 63 within a support opening 49 constitutes a support pillar structure 20.

A memory opening fill structure 58 can be formed in volumes of a contiguous pair of a second-tier memory opening 249 and a first-tier memory opening 149. The memory opening fill structure 58 comprises a memory film 50 and a vertical semiconductor channel 60. A first portion MP1 of the memory opening fill structure 58 located in an upper portion of the first inter-tier dielectric layer 171 laterally protrudes outward from a vertical axis VA passing through a geometrical center of the memory opening fill structure 58 more than a sidewall of a portion of the memory opening fill structure 58 located within the first alternating stack (132, 142). A second portion MP2 of the memory opening fill structure 58 located in an upper portion of the second inter-tier dielectric layer 172 comprises a cylindrical sidewall 721 that is laterally offset from the vertical axis VA by a greater lateral distance than a bottom periphery of a sidewall of a portion of the memory opening fill structure 58 located within the second alternating stack (232, 242).

In one embodiment, a third portion MP3 of the memory opening fill structure 58 located in a lower portion of the second inter-tier dielectric layer 172 laterally protrudes from a bottom periphery of the second portion MP2 of the memory opening fill structure 58 and comprises a planar annular bottom surface 724 that contacts an annular segment of a top surface of the first inter-tier dielectric layer 171. In one embodiment, an outer periphery of the planar annular bottom surface 724 of the third portion MP3 of the memory opening fill structure 58 is laterally offset from the vertical axis VA by a greater lateral offset distance than a maximum lateral offset distance of the first portion MP1 of the memory opening fill structure 58 from the vertical axis VA.

In one embodiment, the third portion MP3 of the memory opening fill structure 58 comprises a convex annular surface 722 having a bottom periphery that is adjoined to an outer periphery of the planar annular bottom surface 724 of the third portion MP3 of the memory opening fill structure 58, and a planar annular surface 723 having an outer periphery that is adjoined to an inner periphery of the convex annular surface 722 of the third portion MP3 of the memory opening fill structure 58 and having an inner periphery that is adjoined to a bottom periphery of the cylindrical sidewall 721 of the second portion MP2 of the memory opening fill structure 58.

In one embodiment, a vertical offset distance between the planar annular surface 723 of the third portion MP3 of the memory opening fill structure 58 and a horizontal plane including an interface between the first inter-tier dielectric layer 171 and the second inter-tier dielectric layer 172 is the same as a lateral offset distance between the cylindrical sidewall 721 of the second portion MP2 of the memory opening fill structure 58 and a bottom periphery of the portion of the memory opening fill structure 58 located within the second alternating stack (232, 242) within a horizontal plane including a top surface of the second inter-tier dielectric layer 172.

By forming the second inter-tier dielectric layer 172 of a material having a higher etch rate than the first inter-tier dielectric layer 171, the memory opening 49 is laterally expanded in the joint region and the laterally expanded second portion MP2 and third portion MP3 of the memory opening fill structure 58 are formed in the joint region of the memory opening 49. Furthermore, the third portion MP3 of the memory opening fill structure 58 has a tapered convex shape, and defects (such as discontinuities or thinning in the semiconductor channel 60) in the joint region at the third portion MP3 of the memory opening fill structure 58 may be reduced or avoided.

Figure 12:
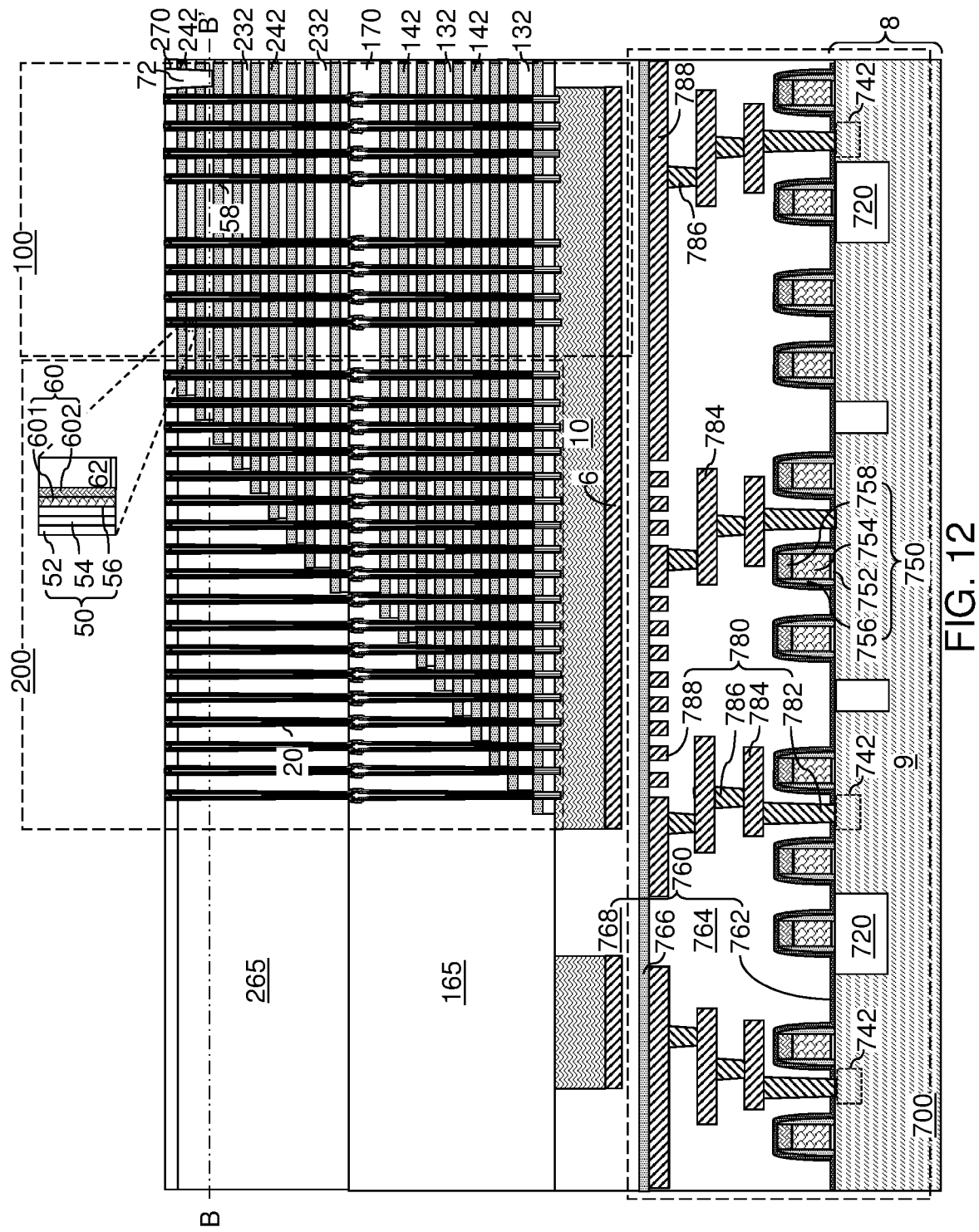
FIG. 12 is a vertical cross-sectional view of the first exemplary structure after formation of memory opening fill structures and support pillar structures according to the first embodiment of the present disclosure.

Referring to FIG. 12, the exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58.

Figure 13A:
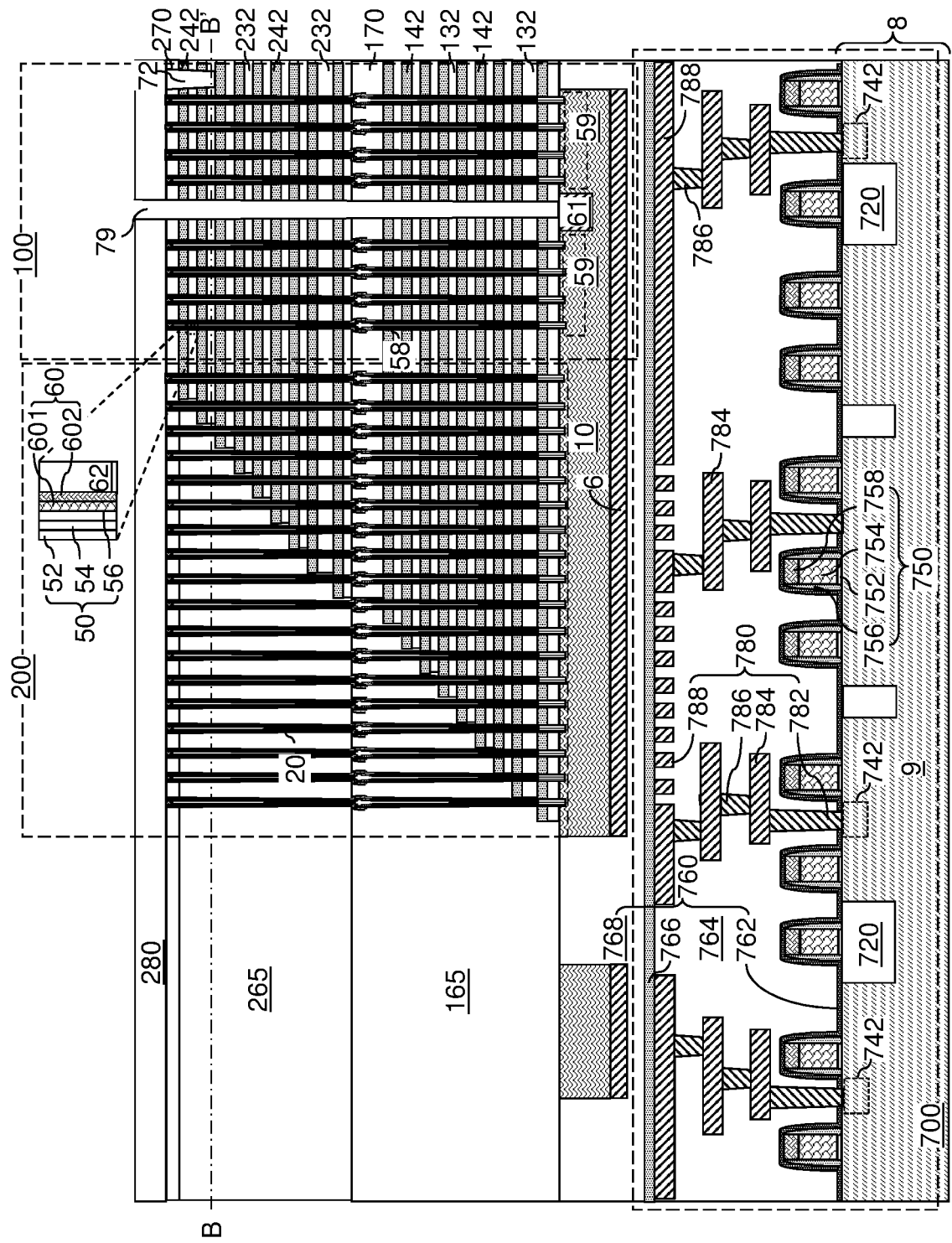
FIG. 13A is a vertical cross-sectional view of the first exemplary structure after formation of backside contact trenches according to the first embodiment of the present disclosure.

Referring to FIGS. 13A and 13B, a first contact-level dielectric layer 280 may be formed over the second-tier structure (232, 242, 270, 265, 72). The first contact-level dielectric layer 280 includes a dielectric material such as silicon oxide, and may be formed by a conformal or non-conformal deposition process. For example, the first contact-level dielectric layer 280 may include undoped silicate glass and may have a thickness in a range from 100 nm to 600 nm, although lesser and greater thicknesses may also be used.

A photoresist layer (not shown) may be applied over the first contact-level dielectric layer 280, and may be lithographically patterned to form elongated openings that laterally extend along the first horizontal direction hd1. An anisotropic etch process can be performed to form backside trenches 79 underneath the elongated openings in the photoresist layer. The backside trenches 79 vertically extend through the first contact-level dielectric layer 280, the second-tier structure (232, 242, 270, 265, 72), and the first-tier structure (132, 142, 170, 165), and laterally extend along the first horizontal direction hd1 through the memory array region 100 and the staircase region 200. A top surface of the planar semiconductor material layer 10 may be physically exposed at the bottom of each backside trench 79.

Dopants of the second conductivity type can be implanted into portions of the planar semiconductor material layer 10 that underlie the backside trenches 79 to form source regions 61. Surface portions of the planar semiconductor material layer 10 extending between the source regions 61 and adjacent memory opening fill structures 58 constitute horizontal semiconductor channels 59. The photoresist layer may be removed, for example, by ashing.

Figure 14A:
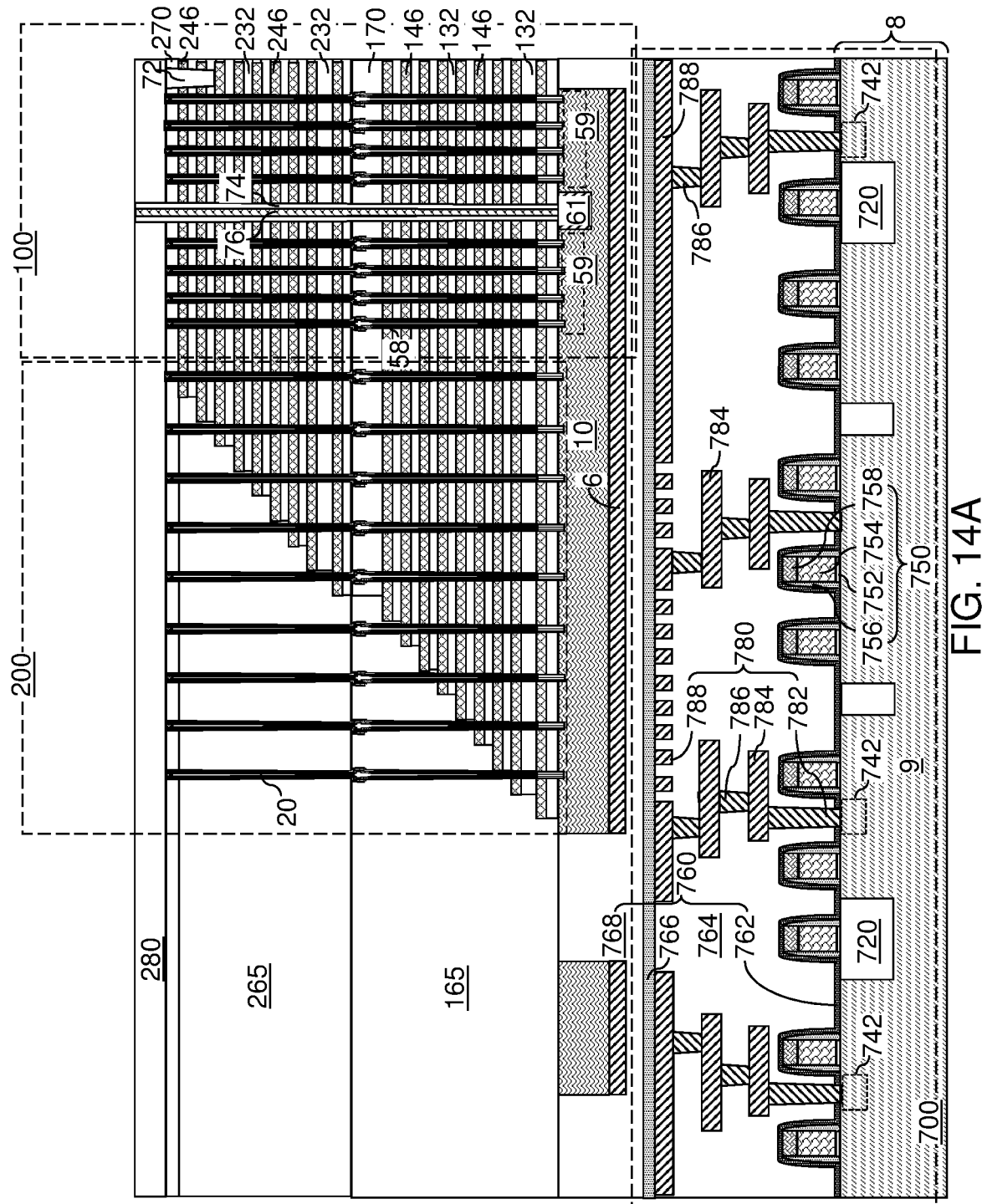
FIG. 14A is a vertical cross-sectional view of the first exemplary structure after replacement of sacrificial material layers with electrically conductive layers and formation of insulating spacers and backside contact via structures according to the first embodiment of the present disclosure.
Figure 14B:
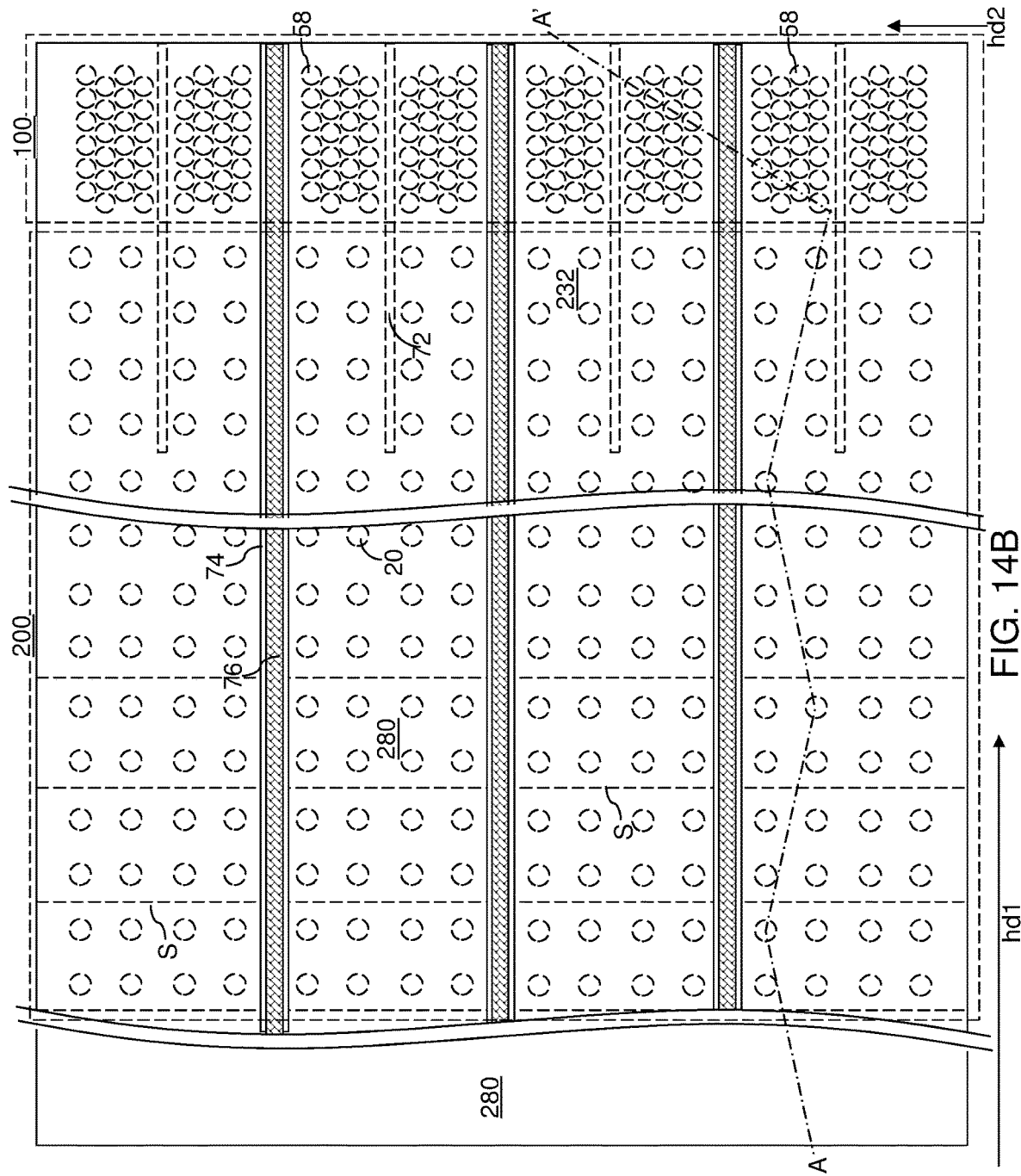
FIG. 14B is a top view of the first exemplary structure along the horizontal plane B-B' of FIG. 14A. The zig-zag vertical plane A-A' corresponds to the plane of the vertical cross-sectional view of FIG. 14A.
Figure 14C:
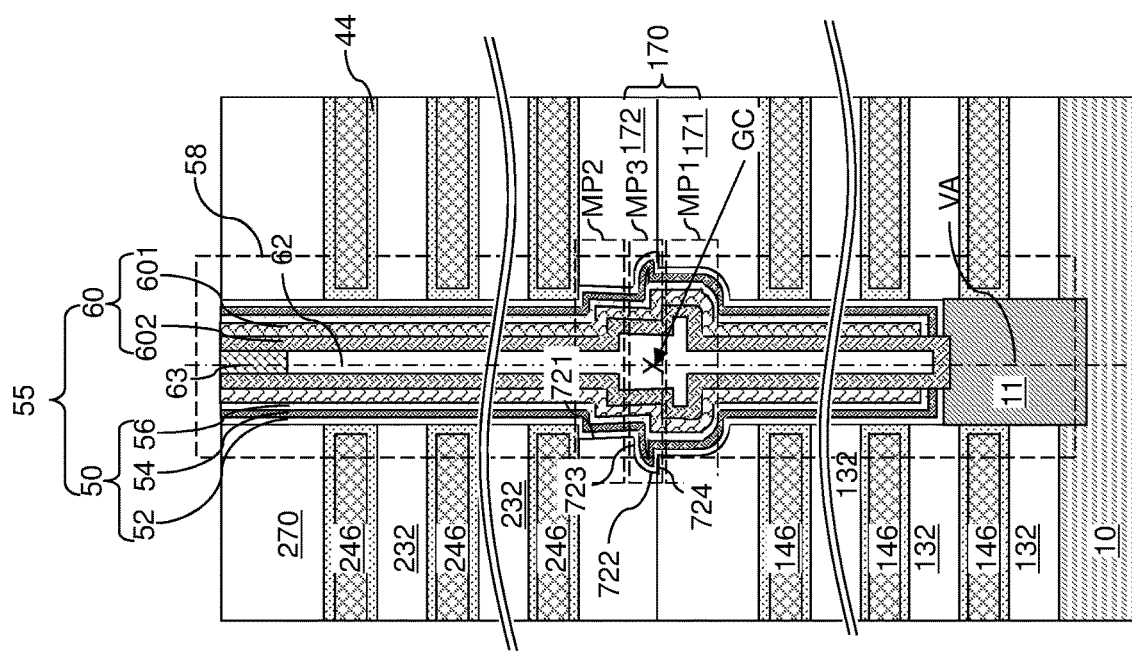
FIG. 14C is a vertical cross-sectional view of a region around a memory stack structure at the processing step of FIGS. 14A and 14B.

Referring to FIGS. 14A-14C, the sacrificial material layers (142, 242) are removed selective to the insulating layers (132, 232), the first and second insulating cap layers (170, 270), the first contact-level dielectric layer 280, and the planar semiconductor material layer 10. For example, an etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 may be introduced into the backside trenches 79, for example, using an isotropic etch process. In one embodiment, the sacrificial material layers (142, 242) may include silicon nitride, the materials of the insulating layers (132, 232), the first and second insulating cap layers (170, 270), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses are formed in volumes from which the sacrificial material layers (142, 242) are removed. The backside recesses include first backside recesses that are formed in volumes from which the first sacrificial material layers 142 are removed and second backside recesses that are formed in volumes from which the second sacrificial material layers 242 are removed. Each of the backside recesses may be a laterally extending cavity having a lateral dimension that is greater than the vertical extent of the cavity. In other words, the lateral dimension of each of the backside recesses may be greater than the height of the respective backside recess. A plurality of backside recesses may be formed in the volumes from which the material of the sacrificial material layers (142, 242) is removed. Each of the backside recesses may extend substantially parallel to the top surface of the substrate semiconductor layer 9. A backside recess may be vertically bounded by a top surface of an underlying insulating layer (132, 232) and a bottom surface of an overlying insulating layer (132, 232). In one embodiment, each of the backside recesses may have a uniform height throughout.

A backside blocking dielectric layer 44 may be optionally deposited in the backside recesses and the backside trenches 79 and over the first contact-level dielectric layer 280. The backside blocking dielectric layer 44 includes a dielectric material such as a dielectric metal oxide, silicon oxide, or a combination thereof. For example, the backside blocking dielectric layer 44 may include aluminum oxide. The backside blocking dielectric layer 44 may be formed by a conformal deposition process such as atomic layer deposition or chemical vapor deposition. The thickness of the backside blocking dielectric layer 44 may be in a range from 1 nm to 20 nm, such as from 2 nm to 10 nm, although lesser and greater thicknesses may also be used.

At least one conductive material may be deposited in the plurality of backside recesses, on the sidewalls of the backside trenches 79, and over the first contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electri-cally conductive material that includes at least one metallic element. Non-limiting exemplary metallic materials that may be deposited in the backside recesses include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses may be a combination of titanium nitride layer and a tungsten fill material.

Electrically conductive layers (146, 246) may be formed in the backside recesses by deposition of the at least one conductive material. A plurality of first electrically conductive layers 146 may be formed in the plurality of first backside recesses, a plurality of second electrically conductive layers 246 may be formed in the plurality of second backside recesses, and a continuous metallic material layer (not shown) may be formed on the sidewalls of each backside trench 79 and over the first contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (**146, 246) may have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55. At least one bottommost first electrically conductive layer 146 constitutes a source select gate electrode.

Each of the memory stack structures 55 comprises a vertical stack of memory elements located at each level of the electrically conductive layers (146, 246). A subset of the electrically conductive layers (146, 246) may comprise word lines for the memory elements. The semiconductor devices in the underlying peripheral device region 700 may comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246).

An insulating spacer material layer may be conformally deposited in the backside trenches 79 and over the first contact-level dielectric layer 280 by a conformal deposition process. The insulating spacer material layer may include, for example, silicon oxide. An anisotropic etch process can be performed to remove horizontally-extending portions of the insulating spacer material layer. Each remaining vertically-extending portion of the insulating spacer material layer constitutes an insulating spacer 74.

At least one conductive material (such as at least one metallic material) can be deposited in remaining volumes of the backside trenches 79. Excess portions of the at least one conductive material can be removed from above the horizontal plane including the top surface of the first contact-level dielectric layer 280. Each remaining portion of the at least one conductive material constitutes a backside contact via structure 76.

Alternatively, at least one dielectric material, such as silicon oxide, may be conformally deposited in the backside trenches 79 by a conformal deposition process. Each portion of the deposited dielectric material that fills a backside trench 79 constitutes a backside trench fill structure. In this case, each backside trench fill structure may fill the entire volume of a backside trench 79 and may consist essentially of at least one dielectric material. In this alternative embodiment, the source region 61 may be omitted, and a horizontal source line (e.g., direct strap contact) may contact a side of the lower portion of the semiconductor channel 60. In another alternative embodiment, the peripheral device region 700 may be located on a separate substrate which is subsequently bonded to the memory array region 100.

Figure 15A:
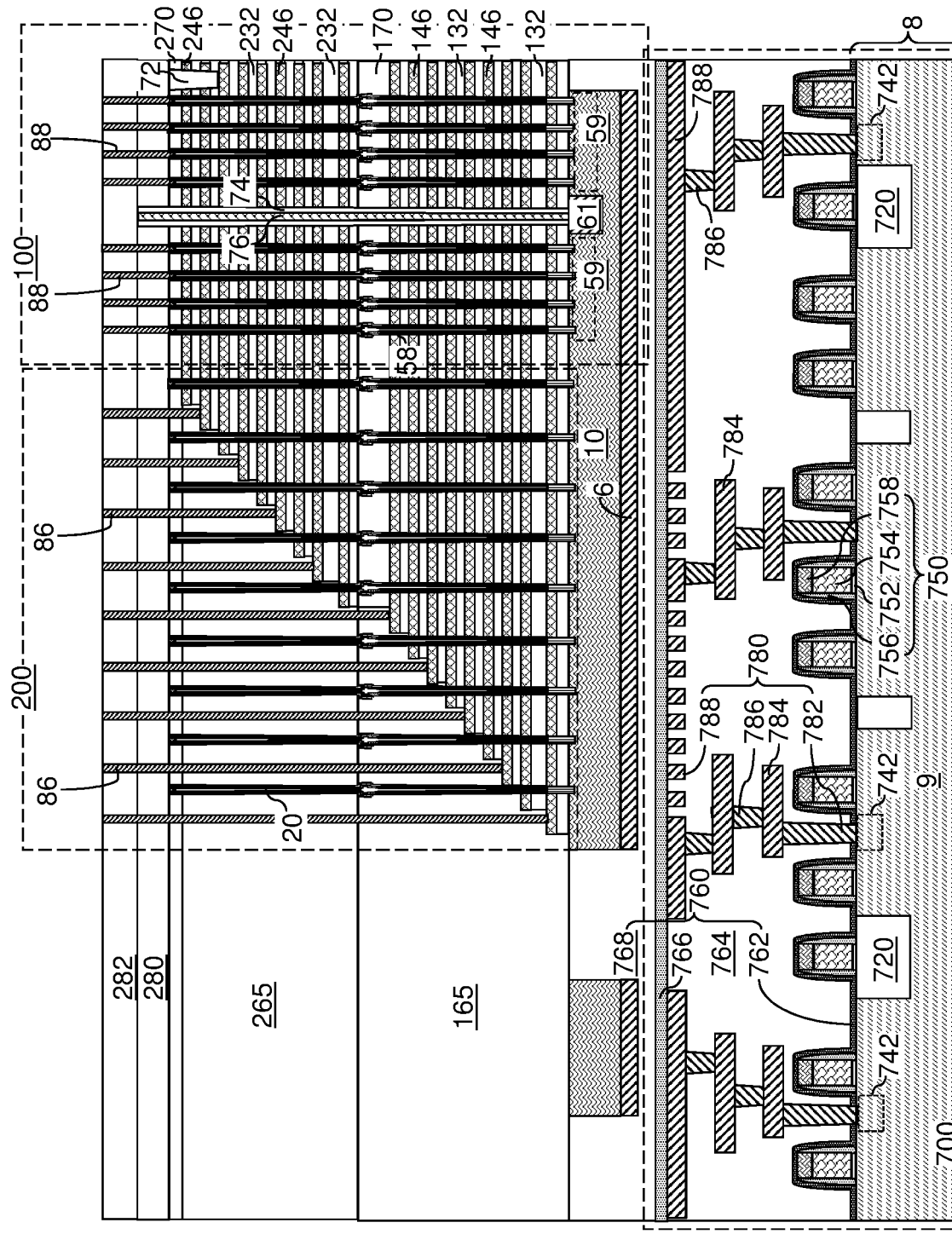
FIG. 15A is a vertical cross-sectional view of the first exemplary structure after formation of drain contact via structures and word line contact via structures according to the first embodiment of the present disclosure.
Figure 15B:
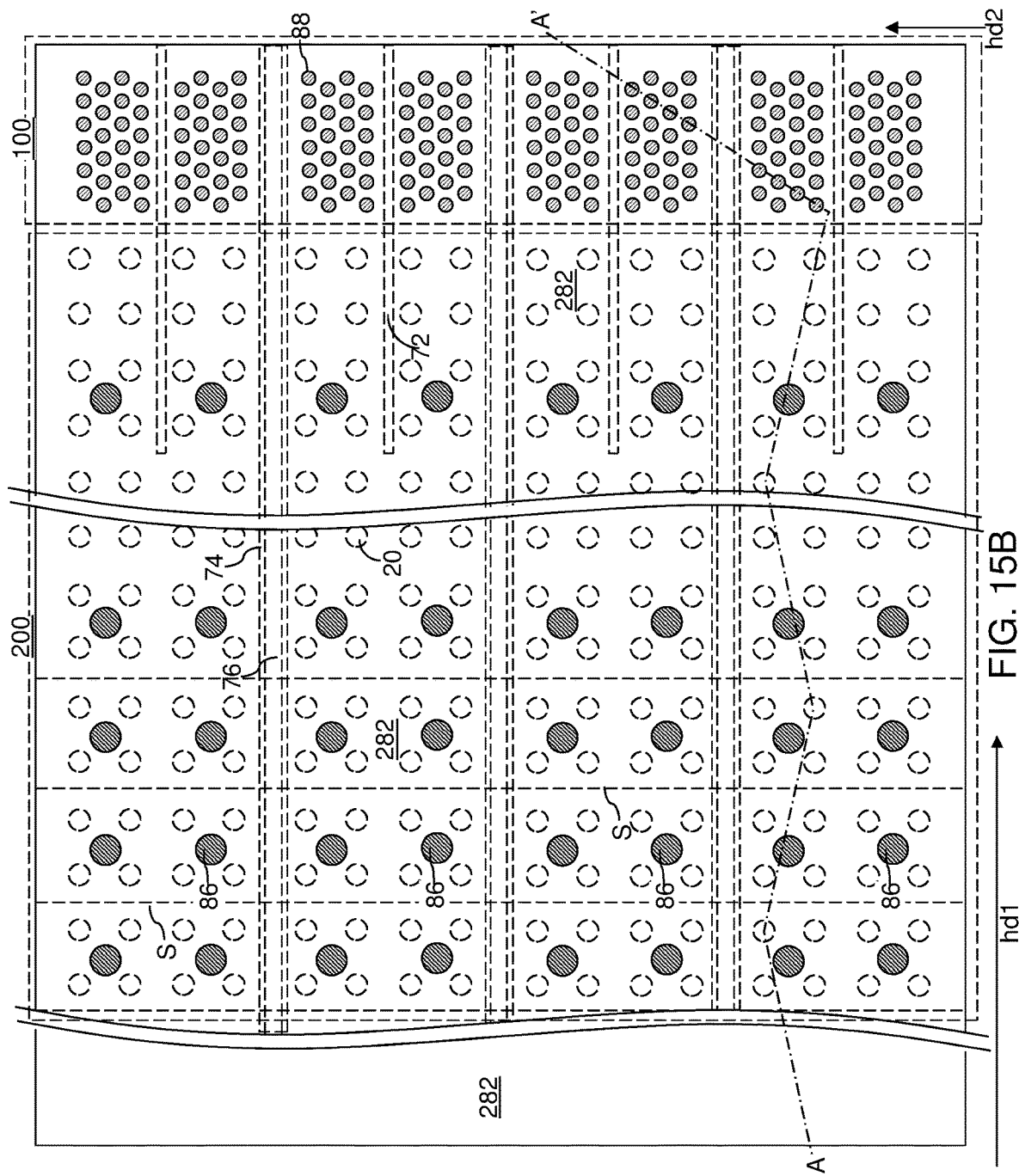
FIG. 15B is a top view of the first exemplary structure along the horizontal plane B-B' of FIG. 15A. The zig-zag vertical plane A-A' corresponds to the plane of the vertical cross-sectional view of FIG. 15A.

Referring to FIGS. 15A and 15B, a second contact-level dielectric layer 282 may be formed over the first contact-level dielectric layer 280. The second contact-level dielectric layer 282 includes a dielectric material such as silicon oxide, and may have a thickness in a range from 100 nm to 600 nm, although lesser and greater thicknesses may also be used.

A photoresist layer (not shown) may be applied over the second contact-level dielectric layer 282, and may be lithographically patterned to form various contact via openings. For example, openings for forming drain contact via structures may be formed in the memory array region 100, and openings for forming staircase region contact via structures may be formed in the staircase region 200. An anisotropic etch process is performed to transfer the pattern in the photoresist layer through the second and first contact-level dielectric layers (282, 280) and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146, 246) at the stepped surfaces underlying the first and second retro-stepped dielectric material portions (165, 265). The photoresist layer may be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures 55.

Figure 16A:
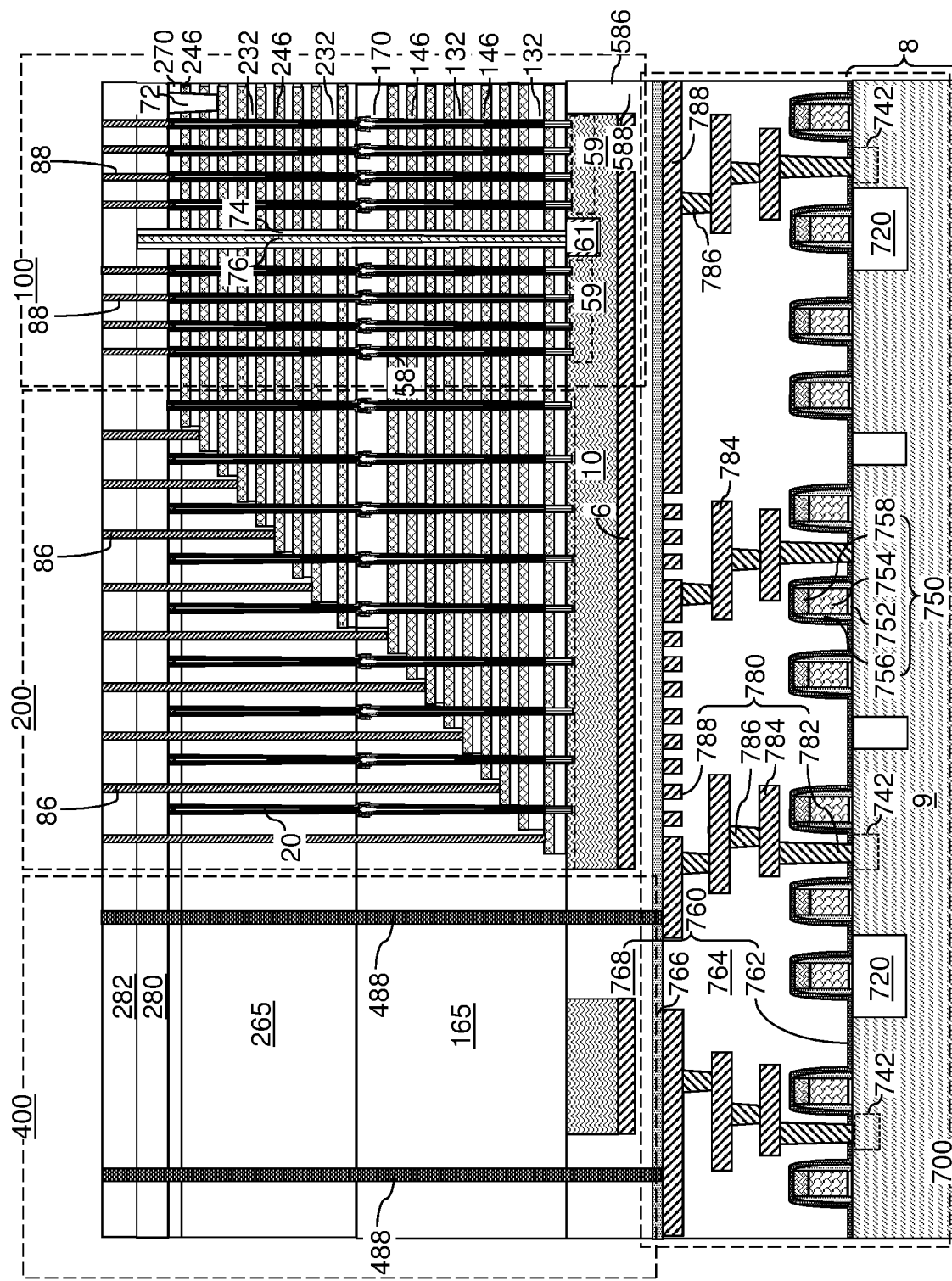
FIG. 16A is a vertical cross-sectional view of the first exemplary structure after formation of through-stack contact via structures and through-dielectric contact via structures according to the first embodiment of the present disclosure.
Figure 16B:
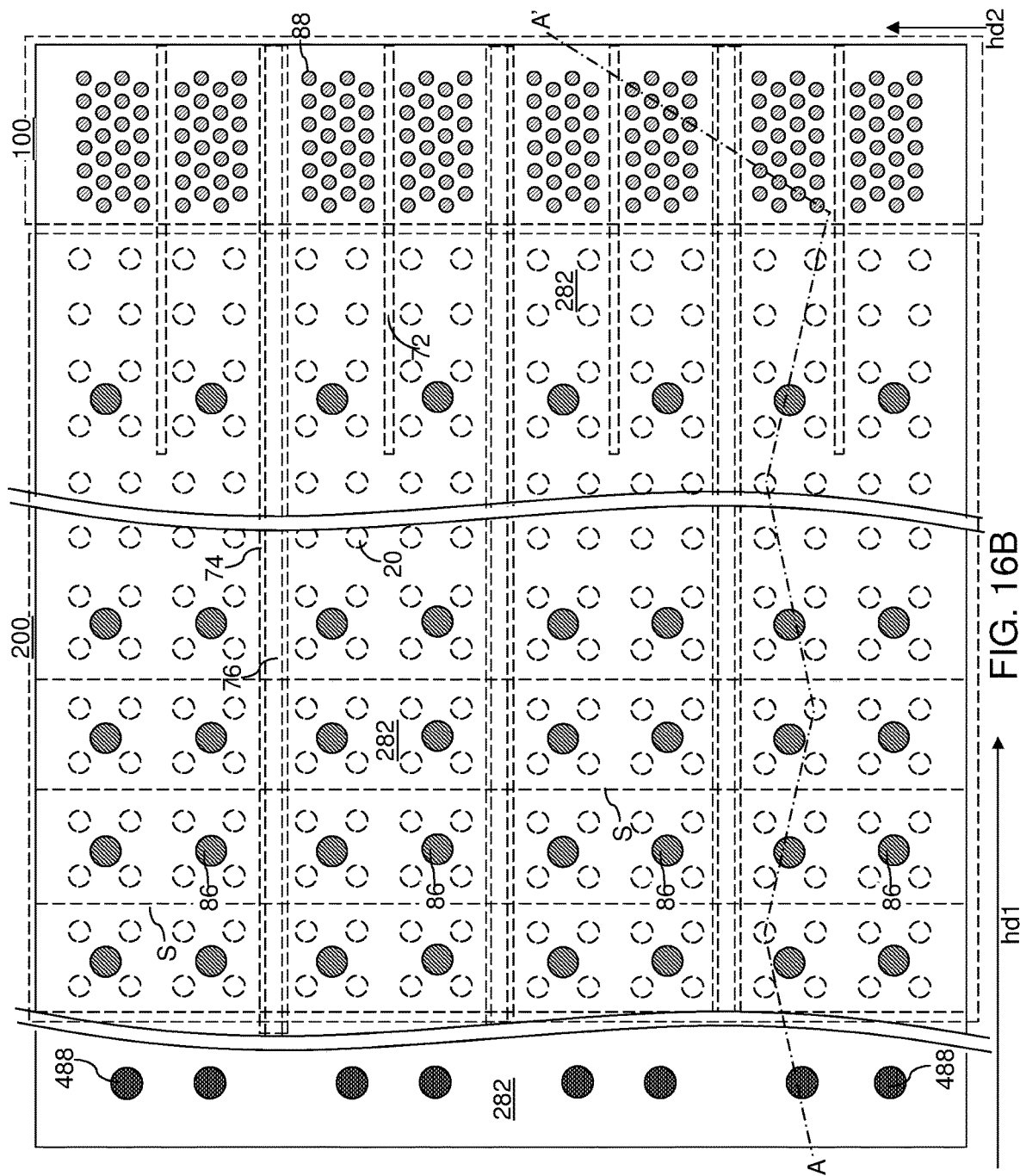
FIG. 16B is a top view of the first exemplary structure along the horizontal plane B-B' of FIG. 16A. The zig-zag vertical plane A-A' corresponds to the plane of the vertical cross-sectional view of FIG. 16A.

Referring to FIGS. 16A and 16B, peripheral-region via cavities may be formed through the second and first contact-level dielectric layers (282, 280), the second and first retro-stepped dielectric material portions (265, 165), and the at least one second dielectric layer 768 to top surfaces of a subset of the lower-level metal interconnect structure 780 in a peripheral region 400. At least one conductive material may be deposited in the peripheral-region via cavities. Excess portions of the at least one conductive material may be removed from above the horizontal plane including the top surface of the second contact-level dielectric layer 282. Each remaining portion of the at least one conductive material in a peripheral-region via cavity constitutes a peripheral-region contact via structure 488.

Figure 17:
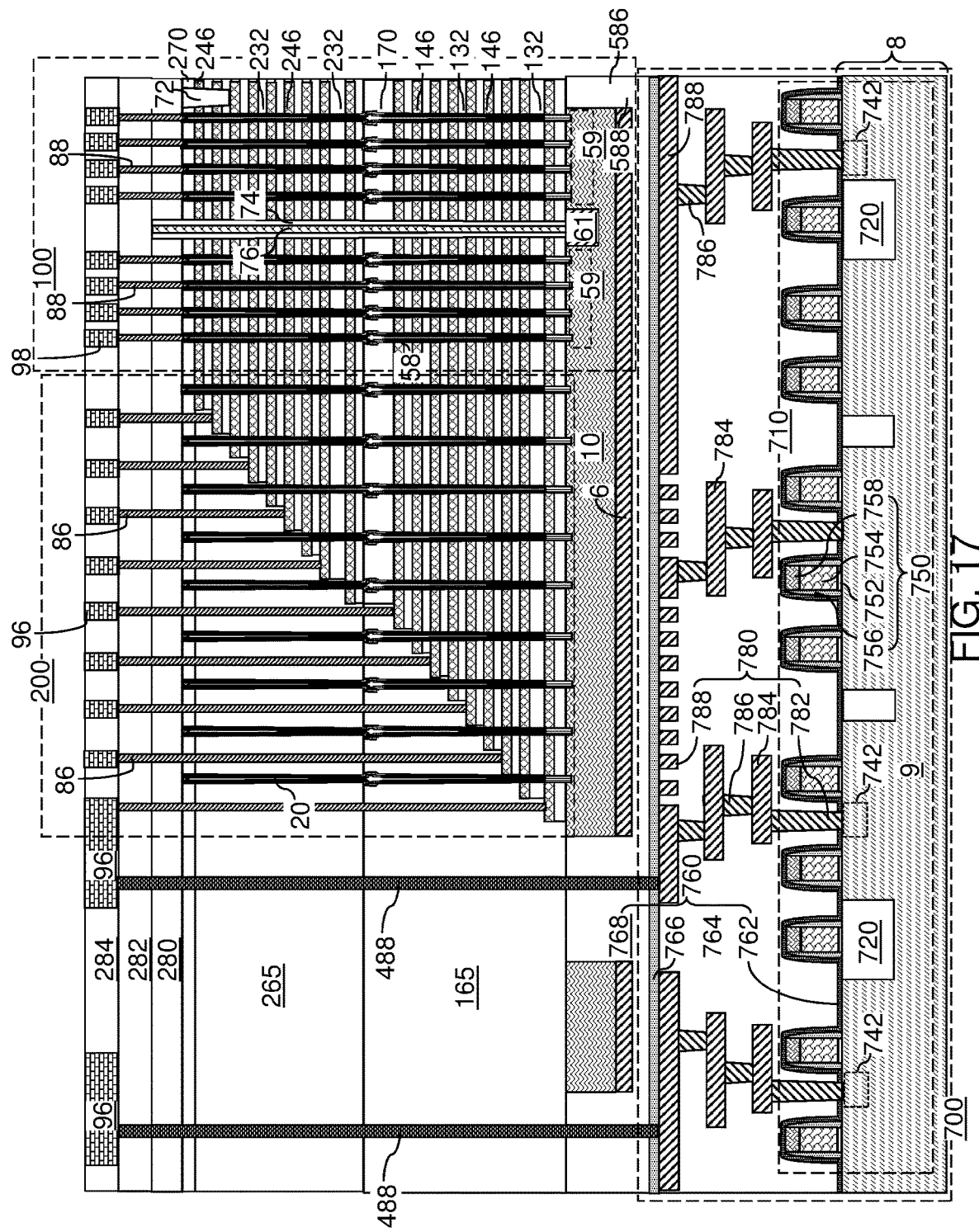
FIG. 17 is a vertical cross-sectional view of the first exemplary structure after formation of upper metal line structures according to the first embodiment of the present disclosure.

Referring to FIG. 17, at least one additional dielectric layer may be formed over the contact-level dielectric layers (280, 282), and additional metal interconnect structures (herein referred to as upper-level metal interconnect structures) may be formed in the at least one additional dielectric layer. For example, the at least one additional dielectric layer may include a line-level dielectric layer 290 that is formed over the contact-level dielectric layers (280, 282). The upper-level metal interconnect structures may include bit lines 98 contacting a respective one of the drain contact via structures 88, and interconnection line structures 96 contacting, and/or electrically connected to, at least one of the staircase-region contact via structures 86 and/or the peripheral-region contact via structures 488. The word line contact via structures (which are provided as a subset of the staircase-region contact via structures 86) may be electrically connected to the word line driver circuit through a subset of the lower-level metal interconnect structures 780 and through a subset of the peripheral-region contact via structures 488.

FIGS. 18A-18G are sequential vertical cross-sectional views of a region of a second exemplary structure during formation of sacrificial memory opening fill structures and an inter-tier dielectric layer according to a second embodiment of the present disclosure.

Figure 18A:
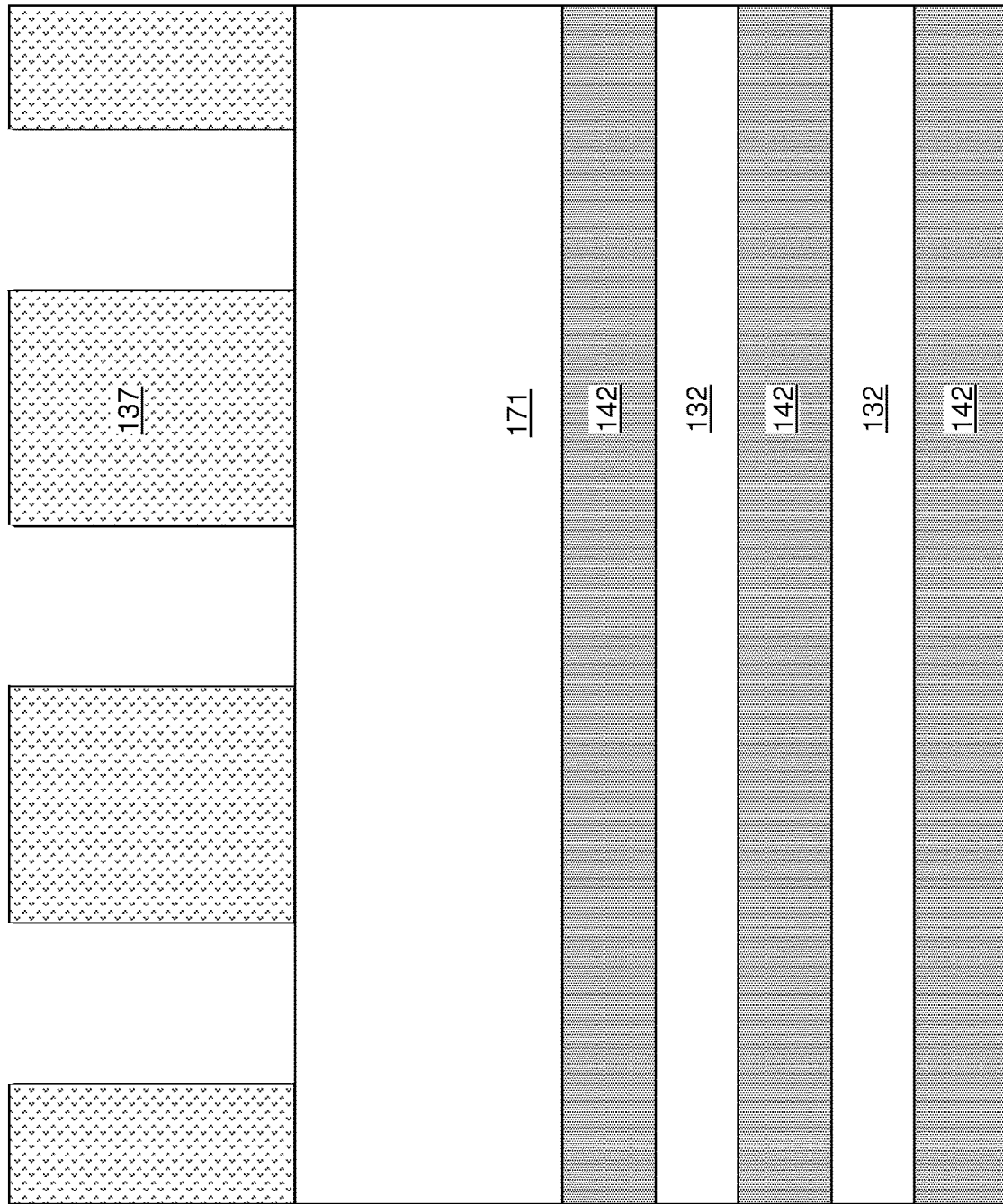
FIGS. 18A-18G are sequential vertical cross-sectional views of a region of a second exemplary structure during formation of sacrificial memory opening fill structures and an inter-tier dielectric layer according to a second embodiment of the present disclosure.

Referring to FIG. 18A, the second exemplary structure according to a second embodiment can be derived from the first exemplary structure illustrated in FIG. 3 forming an etch mask layer 137 over the first inter-tier dielectric layer 171. In one embodiment, the etch mask layer 137 may comprise a patterned photoresist layer and an optional hard mask layer. The etch mask layer 137 includes a pattern of openings, which may be the same as the pattern of the first-tier memory openings 149 and the first-tier support openings 119 illustrated in FIGS. 4A and 4B. A top surface of the first inter-tier dielectric layer 171 can be physically exposed underneath each opening in the etch mask layer 137.

Figure 18B:
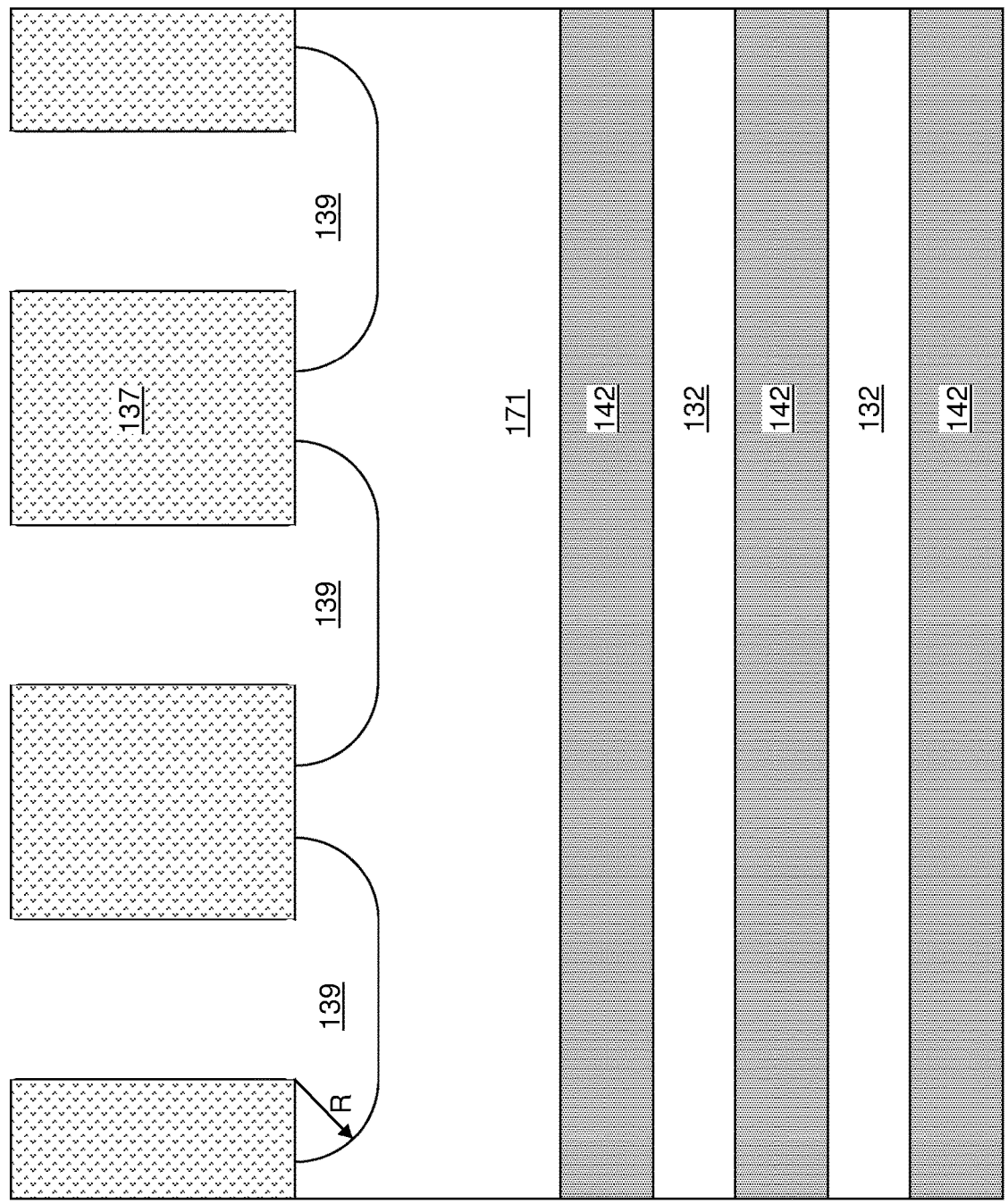

Referring to FIG. 18B, an isotropic etch process can be performed. The isotropic etch process isotropically recesses the material of the first inter-tier dielectric layer 171 from underneath the opening in the etch mask layer 137. The isotropic etch process may be a selective etch process that etches the material of the first inter-tier dielectric layer 171 selective to the material of the etch mask layer 137, which functions as an etch mask during the isotropic etch process. The isotropic etch process isotropically recesses the material of the first inter-tier dielectric layer 171 by a uniform recess distance R' that is less than the thickness of the first inter-tier dielectric layer 171. In an illustrative example, the first inter-tier dielectric layer 171 comprises undoped silicate glass, and the isotropic etch process may comprise a wet etch process employing dilute hydrofluoric acid. The isotropic etch process forms discrete cavities 139 having a respective horizontal bottom surface and a respective annular concave surface adjoined to the periphery of the respective horizontal bottom surface. In one embodiment, the entirety of the annular concave surface may have a uniform radius of curvature that is the same as the uniform recess distance R'. In one embodiment, the discrete openings in the etch mask layer 137 may have a respective horizontal cross-sectional shape of a circle or an ellipse, and each of the discrete cavities 139 may have a respective circular horizontal cross-sectional shape or a respective elliptical horizontal cross-sectional shape. The area of each circular or elliptical horizontal cross-sectional shape may increase with a vertical distance from the substrate 8.

Figure 18C:
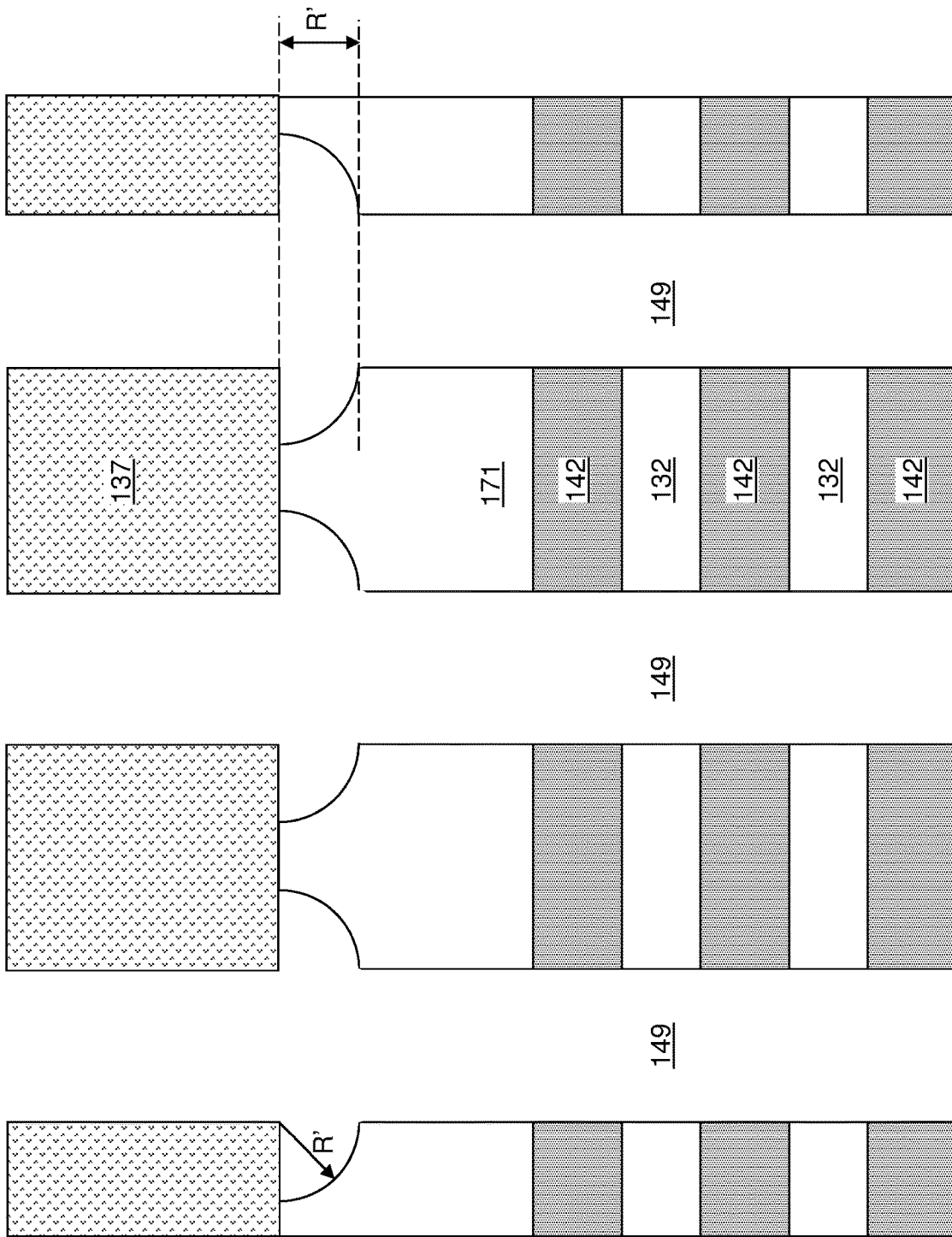

Referring to FIG. 18C, an anisotropic etch process can be performed while the etch mask layer 137 is present on the first inter-tier dielectric layer 171. The etch mask layer 137 is employed as an etch mask during the anisotropic etch process. Thus, the etch mask layer 137 is employed as an etch mask during the isotropic etch process of FIG. 18B and during the anisotropic etch process of FIG. 18C. The anisotropic etch process forms a cylindrical cavity vertically extending through a lower portion of the first inter-tier dielectric layer 171 and the first alternating stack (132, 142) underneath each opening in the etch mask layer 137. A first-tier memory opening 149 is formed underneath each opening in the etch mask layer 137. Each first-tier memory opening 149 includes volumes of a cylindrical cavity that vertically extends through a lower portion of the first inter-tier dielectric layer 171 and the first alternating stack (132, 142) and includes a discrete cavity 139 as formed at the processing steps of FIG. 18B.

Figure 18D:
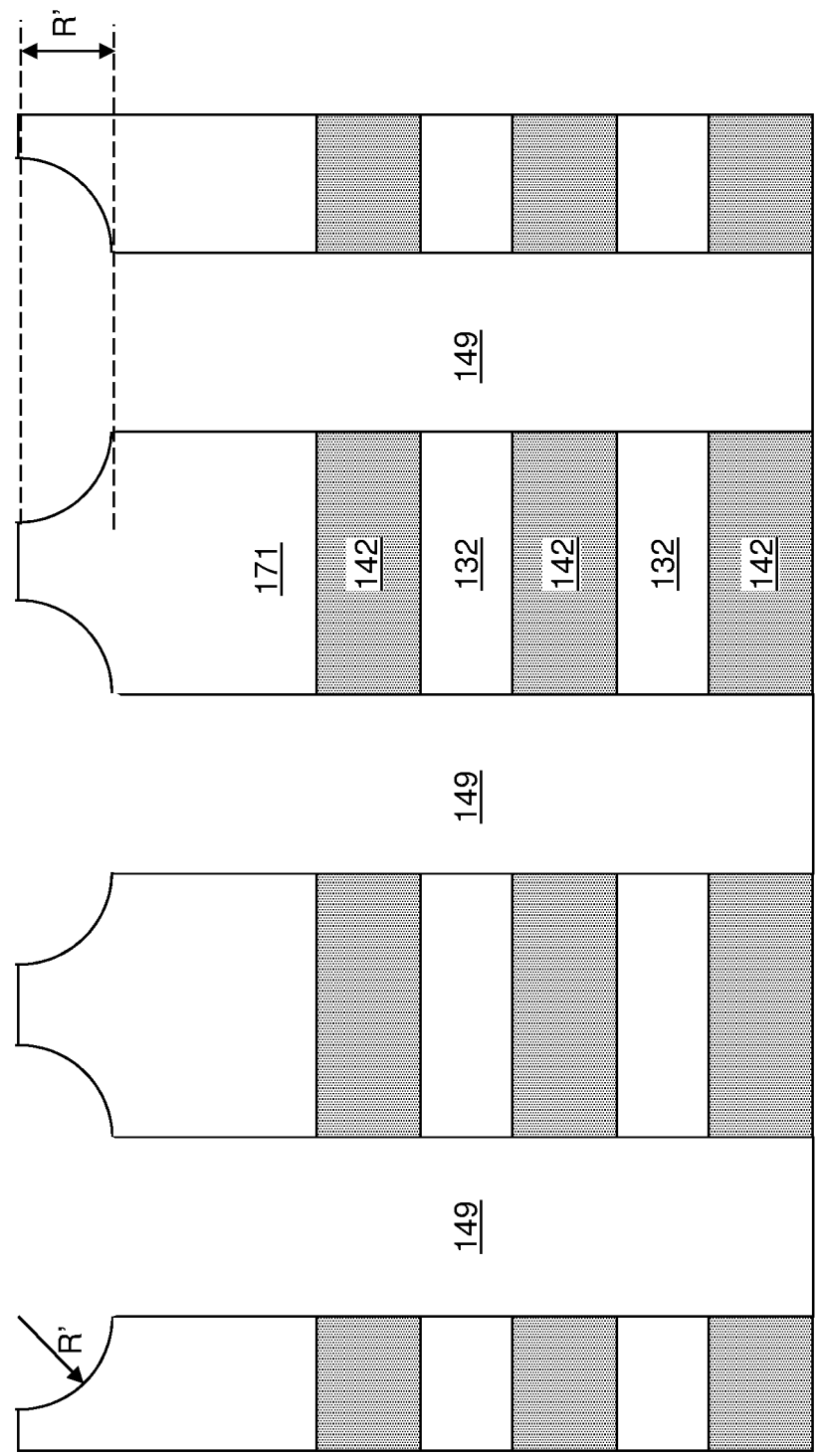

Referring to FIG. 18D, the etch mask layer 137 can be removed selective to the materials of the first inter-tier dielectric layer 171 and the first alternating stack (132, 142). In case the etch mask layer 137 comprises a patterned photoresist layer, an ashing process may be performed to remove the etch mask layer 137. If a hard mask is present, then it may be removed by selective etching.

Figure 18E:
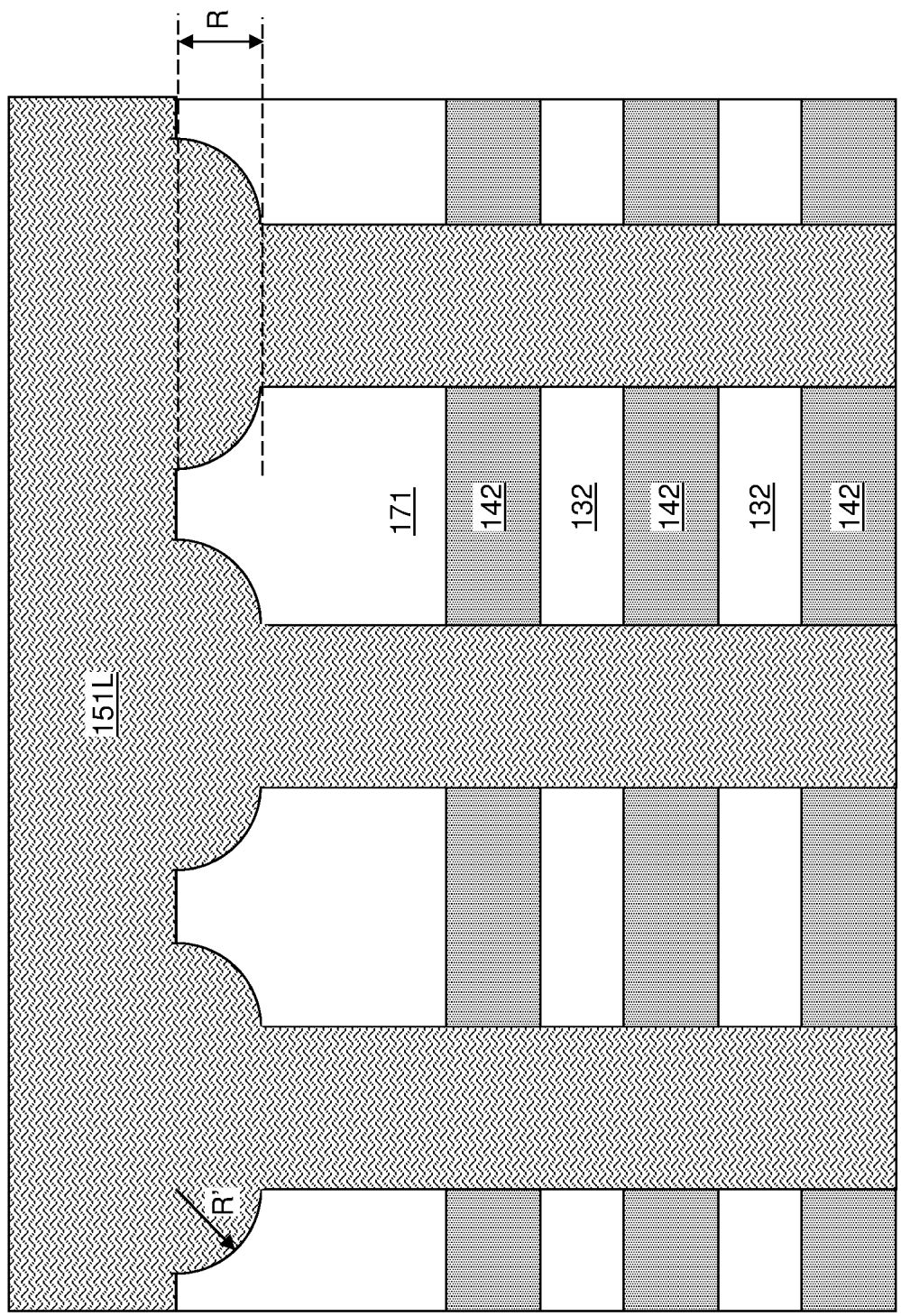

Referring to FIG. 18E, the processing steps of FIGS. 6 and 6A can be performed to form a sacrificial fill material layer 151L. The sacrificial fill material layer 151L fills the volumes of the first-tier memory openings 149 and the first-tier support openings 119.

Figure 18F:
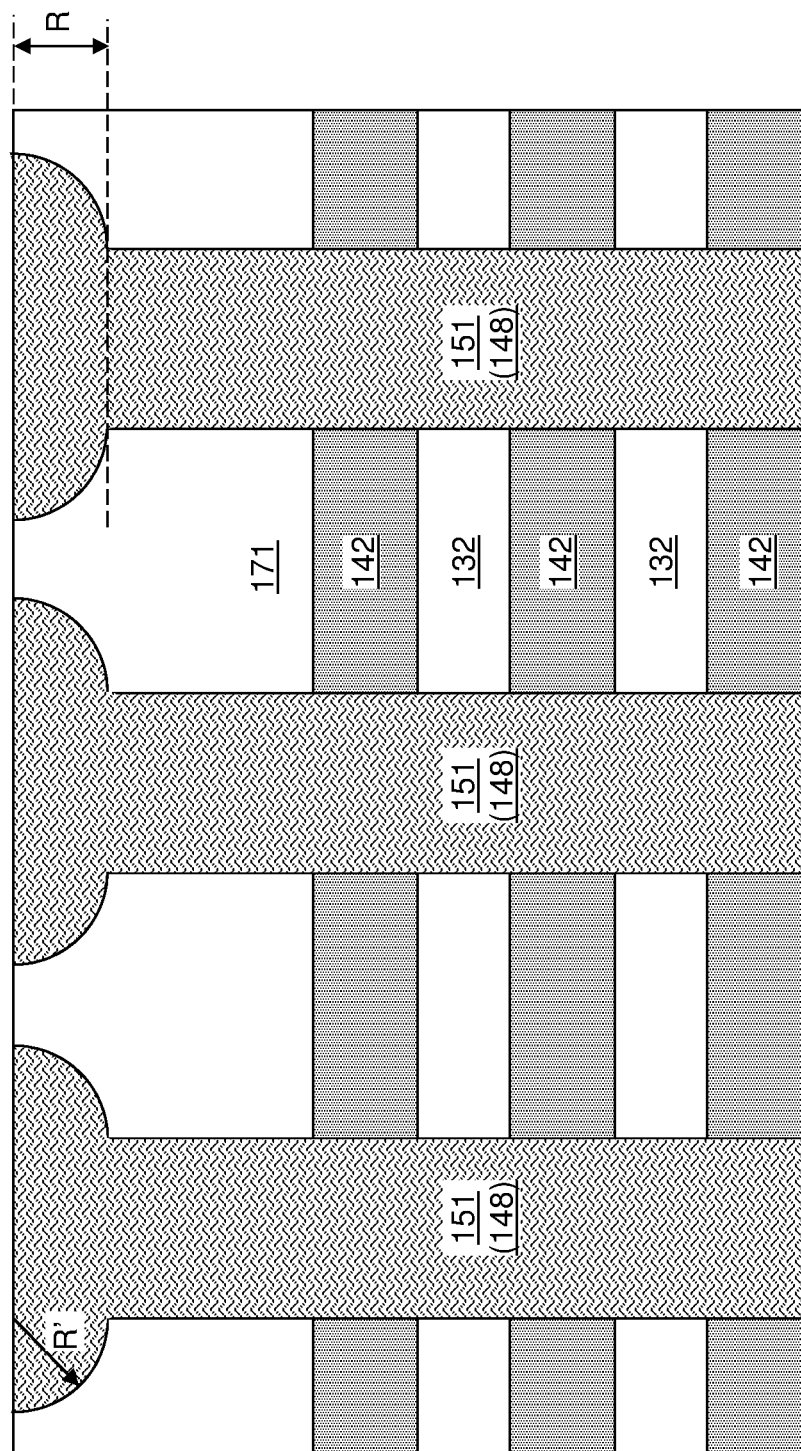

Referring to FIG. 18F, a planarization process can be performed to remove portions of the sacrificial fill material layer 151L that overlie the horizontal plane including the top surface of the first inter-tier dielectric layer 171. For example, a chemical mechanical polishing (CMP) process can be performed to remove portions of the sacrificial fill material layer 151L from above the horizontal plane including the top surface of the first inter-tier dielectric layer 171. Each remaining portion of the sacrificial fill material layer 151L comprises a semiconductor fill material portion 151. Each semiconductor fill material portion 151 that fills a first-tier memory opening 149 constitutes a sacrificial memory opening fill structure 148. Each semiconductor fill material portion 151 that fills a first-tier support opening 119 constitutes a sacrificial support opening fill structure. In one embodiment, the top surfaces of the sacrificial memory opening fill structure 151 and the sacrificial support opening fill structures can be formed within the horizontal plane including the top surface of the first inter-tier dielectric layer 171.

Figure 18G:
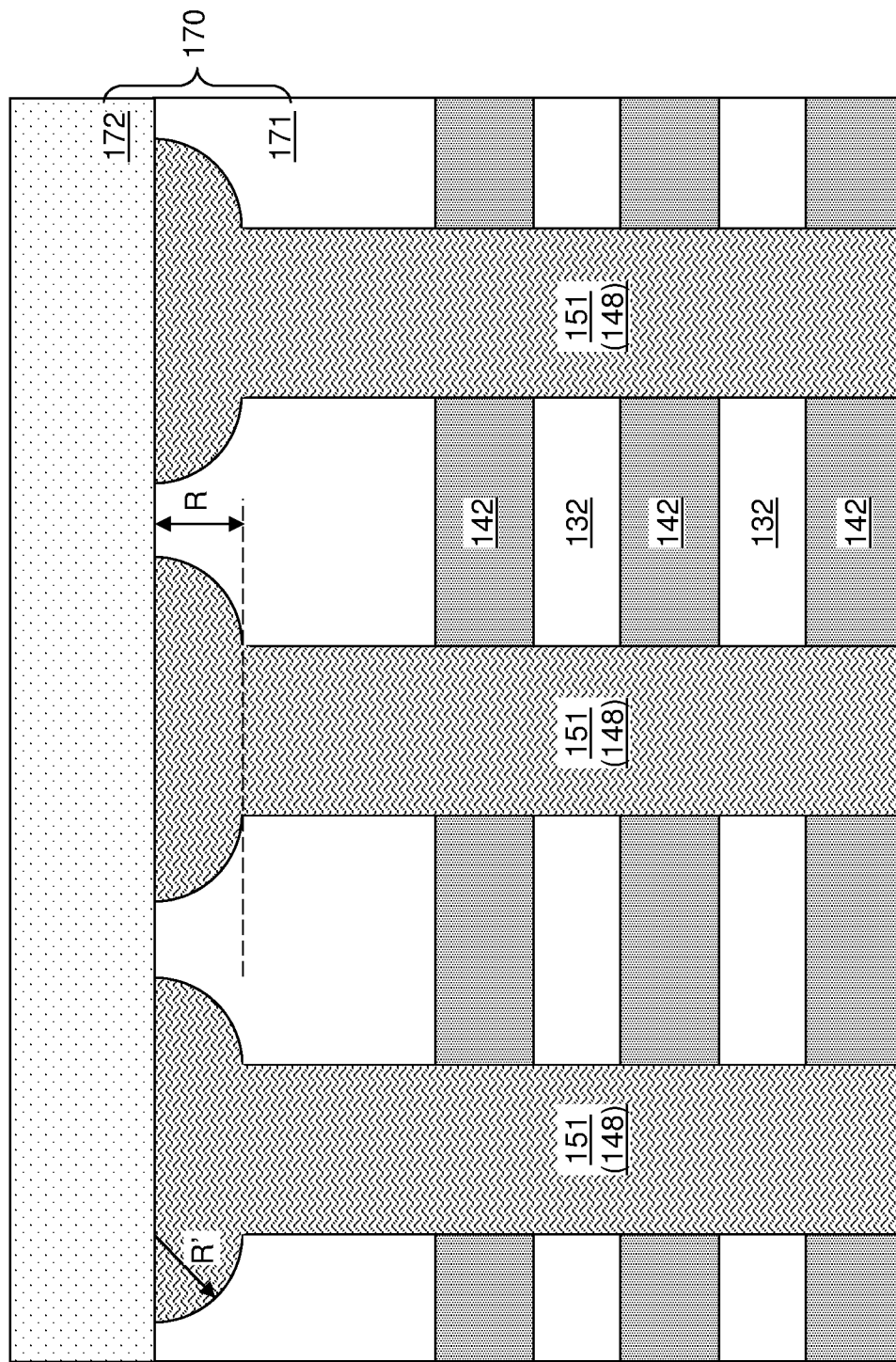

Referring to FIG. 18G, the processing steps of FIG. 6G can be performed to form a second inter-tier dielectric layer 172. The thickness of the inter-tier dielectric layer 172 may be in a range from 20 nm to 300 nm, such as from 40 nm to 150 nm, although lesser and greater thicknesses may also be employed. In one embodiment, the second inter-tier dielectric layer 172 comprises a second silicon oxide material. In one embodiment, the second silicon oxide material may have a different material composition than the first silicon oxide material of the first inter-tier dielectric layer 171 such that an etch rate of the second silicon oxide material in 100:1 dilute hydrofluoric acid at room temperature is greater than an etch rate of the first silicon oxide material in the 100:1 dilute hydrofluoric acid at room temperature by a factor in a range from 2 to 1,000. In one embodiment, the first inter-tier dielectric layer 171 comprises undoped silicate glass, and the second inter-tier dielectric layer 172 comprises a doped silicate glass such as phosphosilicate glass, borosilicate glass, borosilicate glass, or organosilicate glass. The combination of the first inter-tier dielectric layer 171 and the second inter-tier dielectric layer 172 is herein referred to as inter-tier dielectric layers 170, or more generally as at least one inter-tier dielectric layer.

Subsequently, the processing steps of FIGS. 7, 8A, and 8B can be performed to form a second alternating stack (232, 242), the insulating cap layer 270, the second-tier memory openings 249, and the second-tier support openings 219. In this case, the etch chemistry and/or the duration of the anisotropic etch process employed to etch the second-tier memory openings 249 and the second-tier support openings 219 may be modified in view of the lack of metallic fill material portions 153. For example, the chemistry of the anisotropic etch process may be selective to the material of the sacrificial memory opening fill structures 148.

FIGS. 19A-19D are sequential vertical cross-sectional views of a region of the second exemplary structure during formation of inter-tier memory openings according to the second embodiment of the present disclosure.

Figure 19A:
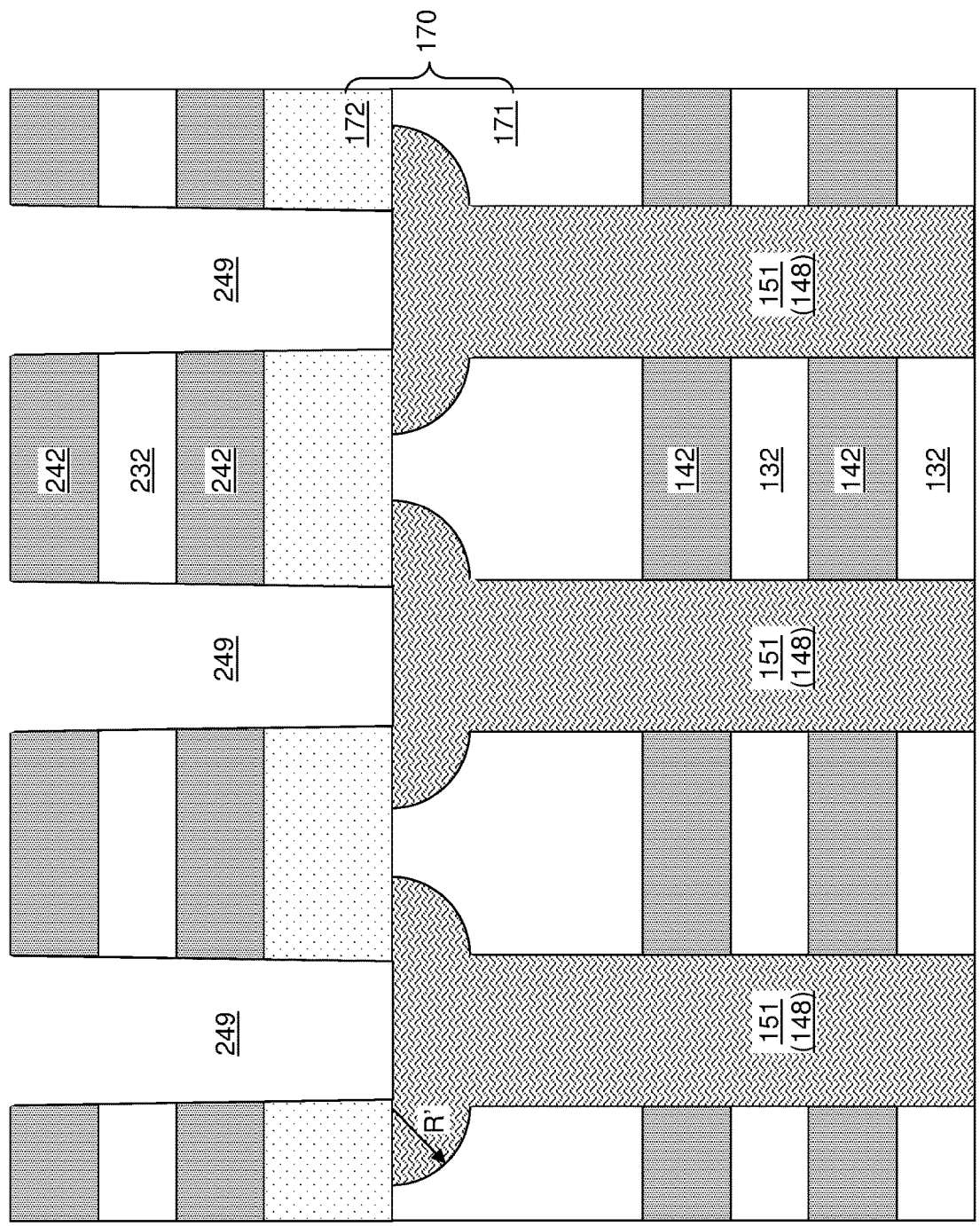
FIGS. 19A-19D are sequential vertical cross-sectional views of a region of the second exemplary structure during formation of inter-tier memory openings according to the second embodiment of the present disclosure.

Referring to FIG. 19A, a region of the second exemplary structure is illustrated after formation of the second-tier memory openings 249 and the second-tier support openings 219. A second-tier memory opening 249 can be formed through the second alternating stack (232, 242) on a top surface of each sacrificial memory opening fill structure 148.

Figure 19B:
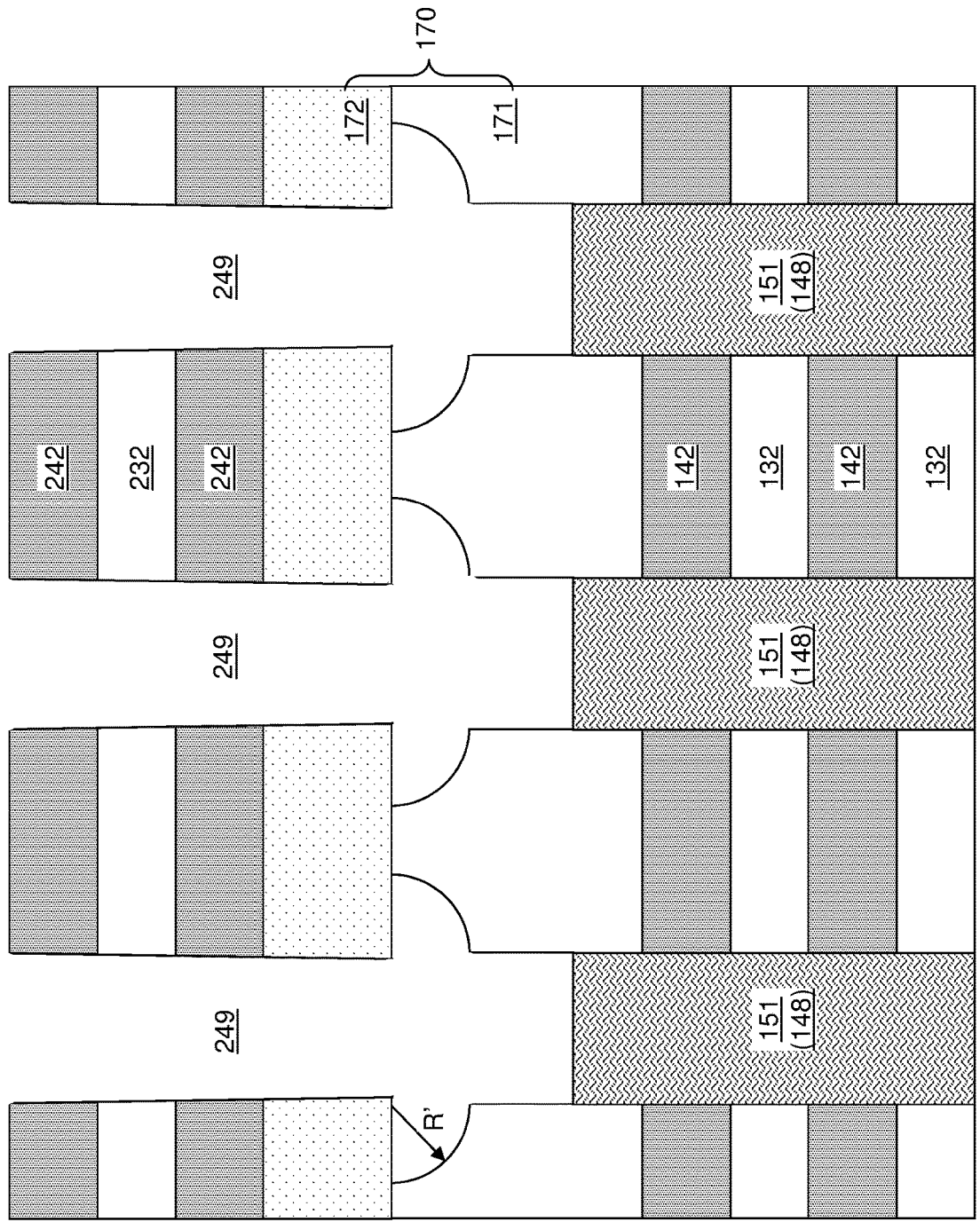

Referring to FIG. 19B, a first isotropic etch process can be performed to remove an upper portion of each sacrificial memory opening fill structure 148 located above a horizontal plane including a topmost surface of the first alternating stack (132, 142). For example, a timed wet etch process employing hot trimethyl-2 hydroxyethyl ammonium hydroxide ("hot TMY") or tetramethyl ammonium hydroxide (TMAH) may be performed to remove an upper portion of each sacrificial memory opening fill structure 148 selective to the material of the first inter-tier dielectric layer 171. The top surface of each remaining portion of the sacrificial memory opening fill structure 148 may be formed at or above the horizontal plane including the topmost surface of the first alternating stack (132, 142).

Figure 19C:
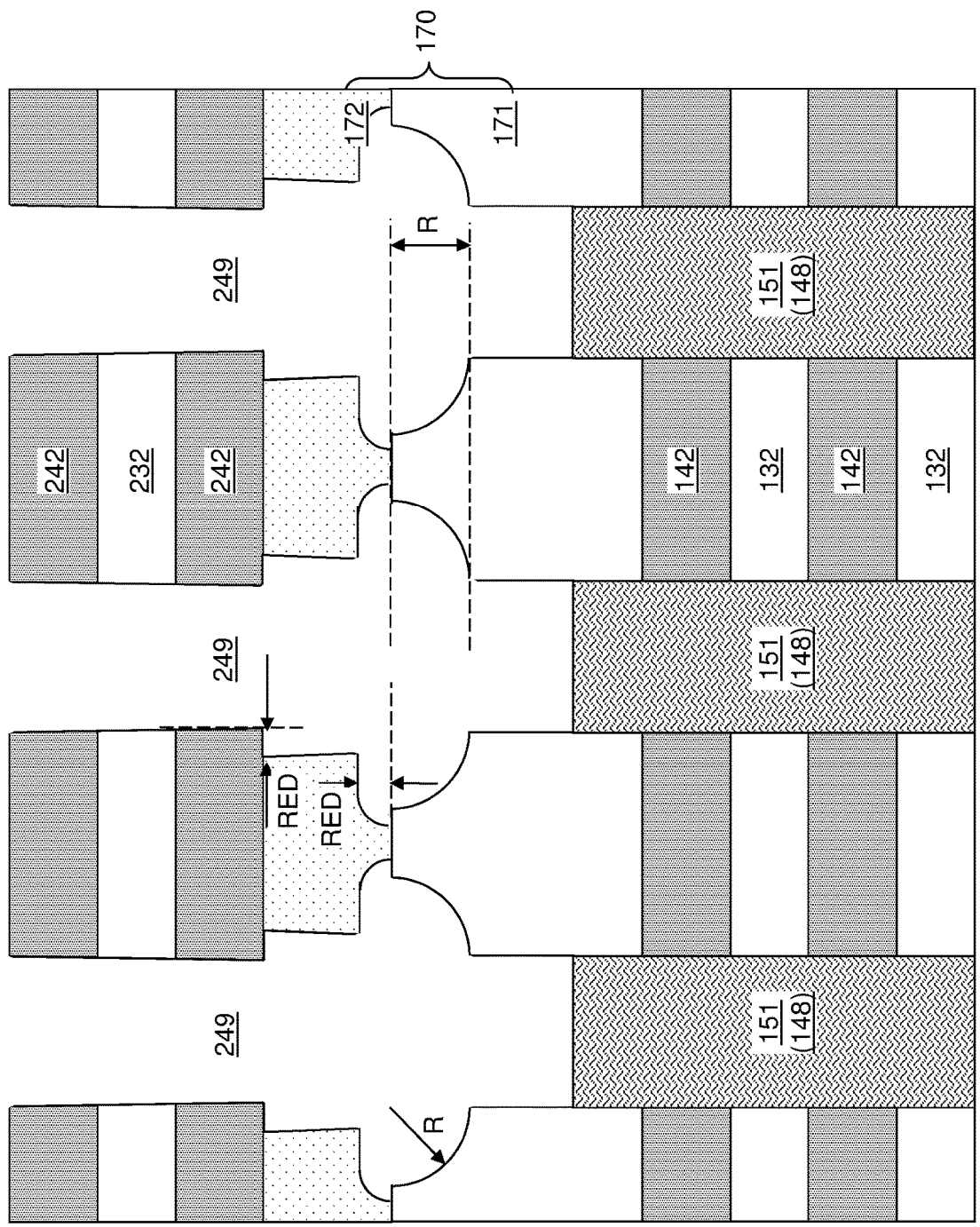

Referring to FIG. 19C, a second isotropic etch process can be performed to etch the material of the second inter-tier dielectric layer 172. In one embodiment, the first inter-tier dielectric layer 171 may comprise a first silicon oxide material having a first etch rate in 100:1 dilute hydrofluoric acid at room temperature, and the second inter-tier dielectric layer 172 may comprise a second silicon oxide material having a second etch rate in 100:1 dilute hydrofluoric acid at room temperature. In one embodiment, the ratio of the second etch rate to the first etch rate may be in a range from 2 to 1,000, such as from 10 to 300, although lesser and greater ratios may also be employed. In one embodiment, the first inter-tier dielectric layer 171 may comprise undoped silicate glass, and the second inter-tier dielectric layer 172 may comprise a doped silicate glass (such as borosilicate glass) or organosilicate glass. The duration of the second isotropic etch process may be selected such that the second isotropic etch process isotropically recesses physically exposed surfaces of the second inter-tier dielectric layer 172 by a recess etch distance RED. The lateral recess etch distance of the cylindrical sidewalls of the second inter-tier dielectric layer 172 and the isotropic etch distance of concave surface segments of the second inter-tier dielectric layer 172 may be the same as the recess etch distance RED. In one embodiment, the recess etch distance RED may be in a range from 1 nm to 100 nm, such as from 3 nm to 30 nm, although lesser and greater recess etch distances may also be employed. Concave annular surfaces of the first inter-tier dielectric layer 171 can be collaterally isotropically etched. In this case, the radius of curvature R of the concave annular surfaces of the first inter-tier dielectric layer 171 may be greater than the uniform recess distance R' described with reference to FIG. 18B.

Figure 19D:
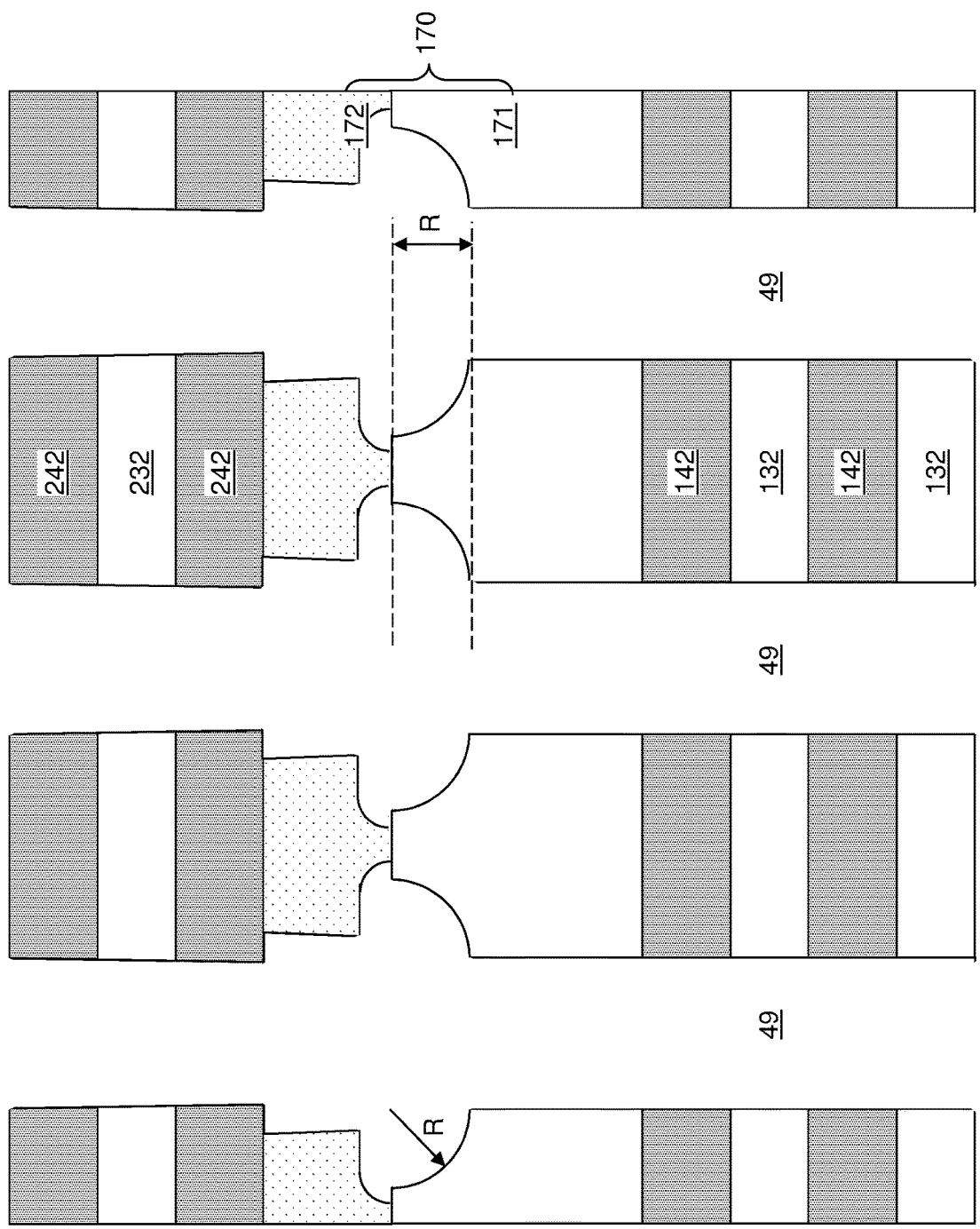

Referring to FIG. 19D, a third isotropic etch process may be performed to remove remaining portions of the sacrificial memory opening fill structures 148. For example, if the sacrificial memory opening fill structures 148 comprise a semiconductor material such as amorphous silicon or polysilicon, the third isotropic etch process may comprise a wet etch process employing hot trimethyl-2 hydroxyethyl ammonium hydroxide ("hot TMY") or tetramethyl ammonium hydroxide (TMAH).

FIGS. 20A-20H are sequential vertical cross-sectional views of an inter-tier memory opening in the second exemplary structure during formation of a memory opening fill structure according to the second embodiment of the present disclosure.

Referring to FIG. 20A, a memory opening in the second exemplary structure as formed at the processing steps of FIG. 19D is illustrated.

Referring to FIG. 20B, the processing steps of FIG. 11B can be performed to form a pedestal channel portion 11 at the bottom of each memory opening 49.

Referring to FIG. 20C, the processing steps of FIG. 11C can be performed to form a stack of layers including a blocking dielectric layer 52, a charge storage layer 54, a tunneling dielectric layer 56, and an optional first semiconductor channel material layer 601 in each memory openings 49.

Referring to FIG. 20D, the processing steps of FIG. 11D can be performed to remove horizontally-extending portions of the deposited material layers (52, 54, 56, 601).

Figure 20E:
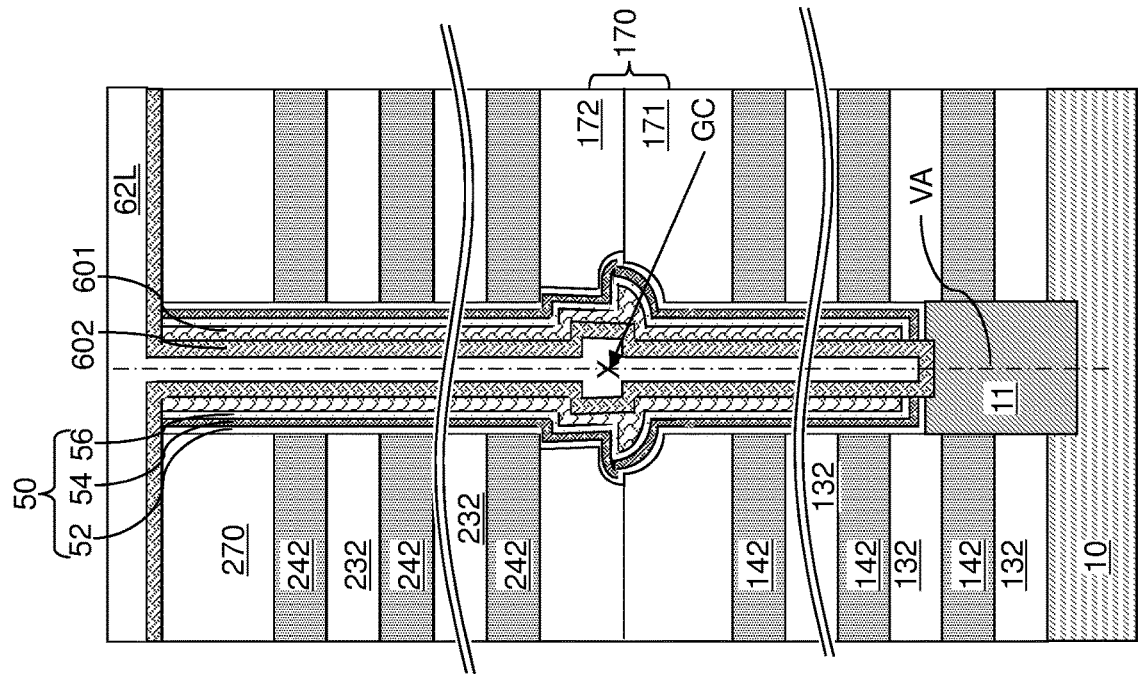

Referring to FIG. 20E, the processing steps of FIG. 11E can be performed to form a second semiconductor channel material layer 602.

Figure 20F:
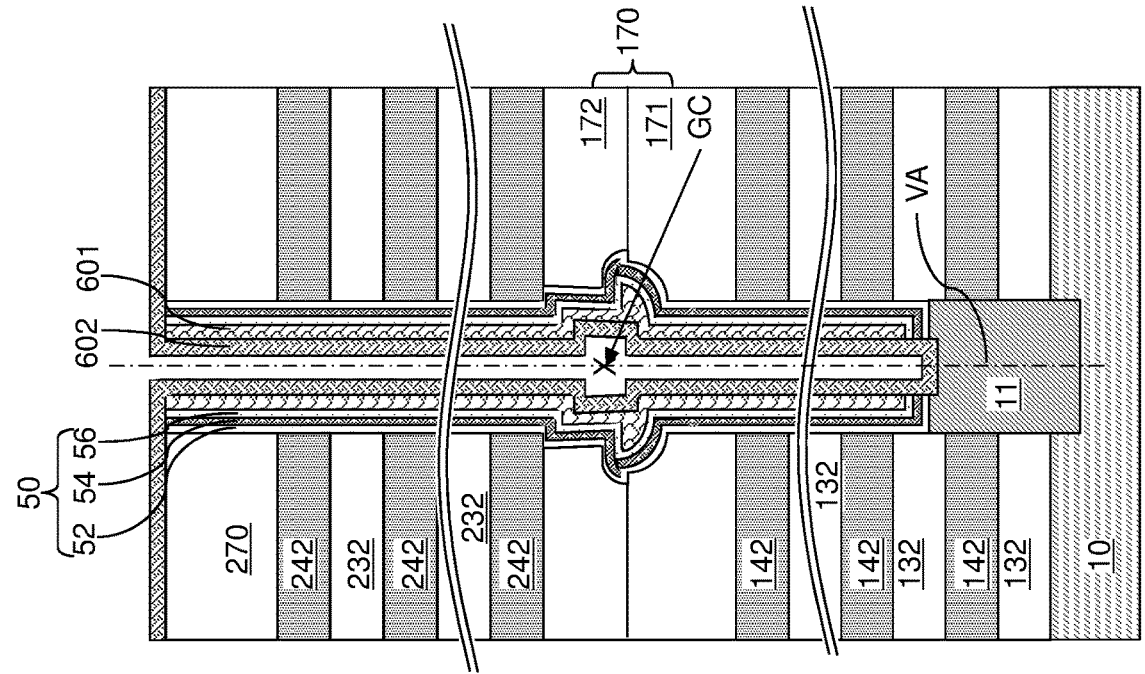

Referring to FIG. 20F, the processing steps of FIG. 11F can be performed to form a dielectric core layer 62L.

Referring to FIG. 20G, the processing steps of FIG. 11G can be performed to form a dielectric core 62 within each memory opening 49.

Referring to FIG. 20H, the processing steps of FIG. 11H can be performed to form a drain region 63 and a vertical semiconductor channel 60 within each memory opening 49. A memory opening fill structure 58 can be formed within the volume of each contiguous set of a first-tier memory opening 149 and a second-tier memory opening 249. The memory opening fill structure 58 can be located in the memory opening 49, and can comprise a memory film 50 and a vertical semiconductor channel 60.

In one embodiment, a first portion MP1 of the memory opening fill structure 58 laterally protrudes outward from a vertical axis VA passing through a geometrical center GC of the memory opening fill structure 58 more than a sidewall of a portion of the memory opening fill structure 58 located within the first alternating stack (132, 142). In one embodiment, a top periphery of a convex annular sidewall 727 of the first portion MP of the memory opening fill structure 58 is adjoined to a top surface of the first inter-tier dielectric layer 171. In one embodiment, a bottom periphery of the convex annular sidewall 727 of the first portion MP1 of the memory opening fill structure 58 is adjoined to a top periphery of a straight cylindrical sidewall 728 of the memory opening fill structure 58 that vertically extends through the first alternating stack (132, 142). In one embodiment, an entirety of the convex annular sidewall 727 of the first portion MP1 of the memory opening fill structure 58 has a uniform radius of curvature R that equals a vertical distance between a horizontal plane including the top periphery of the convex annular sidewall 727 of the first portion MP1 and a horizontal plane including the bottom periphery of the convex annular sidewall 727 of the first portion MP1.

In one embodiment, the second exemplary structure comprises a layer stack of the first inter-tier dielectric layer 171 and the second inter-tier dielectric layer 172. The first portion MP1 of the memory opening fill structure 58 laterally protrudes into an upper portion of the first inter-tier dielectric layer 171, and a second portion MP2 of the memory opening fill structure 58 located in an upper portion of the second inter-tier dielectric layer 172 comprises a cylindrical sidewall 721 that is laterally offset from the vertical axis VA by a greater lateral distance than a sidewall of a portion of the memory opening fill structure 58 located within the second alternating stack (132, 142).

In one embodiment, a third portion MP3 of the memory opening fill structure 58 located in a lower portion of the second inter-tier dielectric layer 172 laterally protrudes from a bottom periphery of the second portion MP2 of the memory opening fill structure 58, and comprises a planar annular bottom surface 724 that contacts an annular segment of a top surface of the first inter-tier dielectric layer 171.

Figure 21:
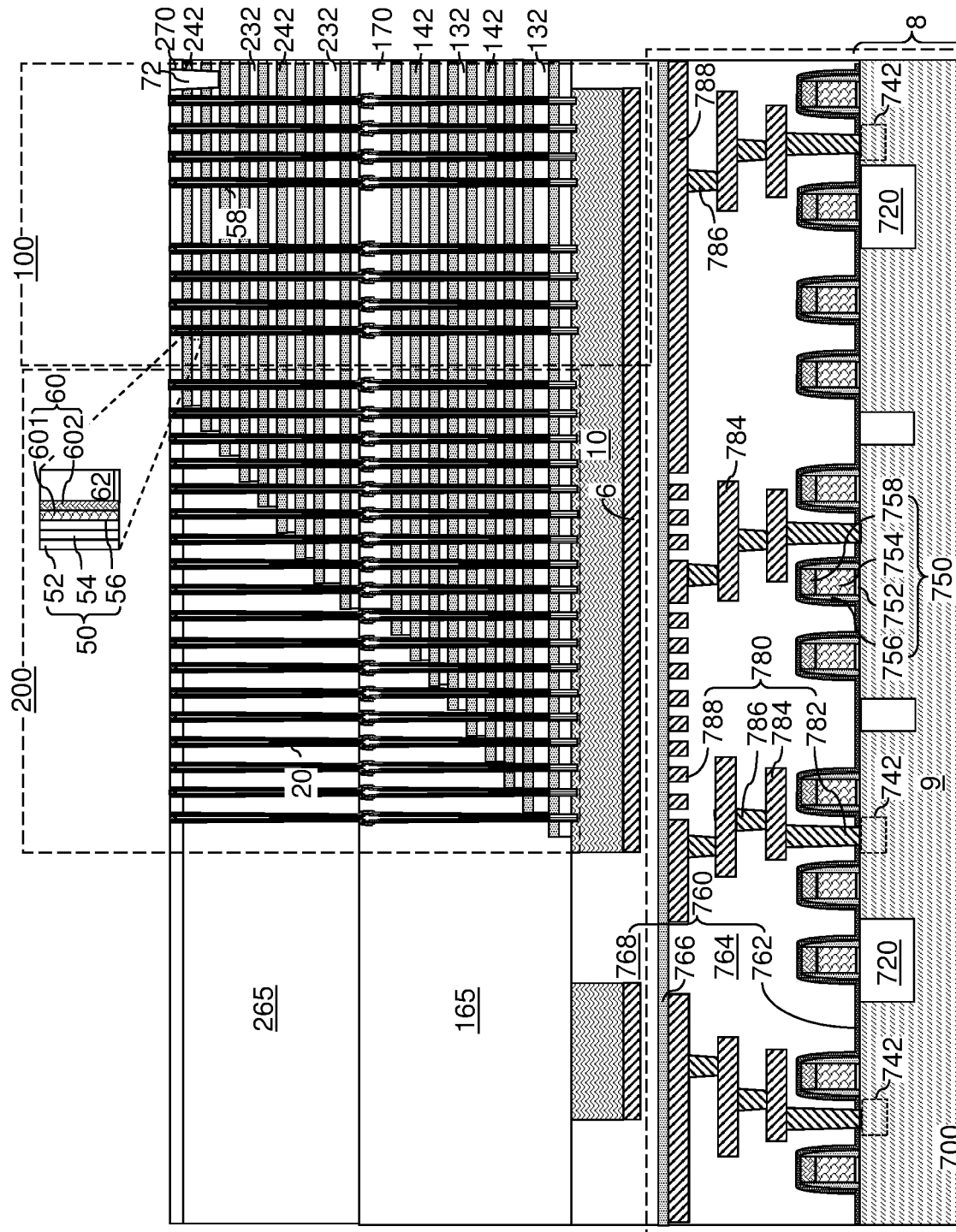
FIG. 21 is a vertical cross-sectional view of the second exemplary structure after formation of memory opening fill structures and support pillar structures according to the second embodiment of the present disclosure.

FIG. 21 is a vertical cross-sectional view of the second exemplary structure after formation of memory opening fill structures 58 and support pillar structures 20 after the processing steps of FIG. 20H.

Subsequently, the processing steps of FIGS. 13A and 13B, 14A-14C, 15A and 15B, 16A-16B, and 17 can be performed.

Figure 22:
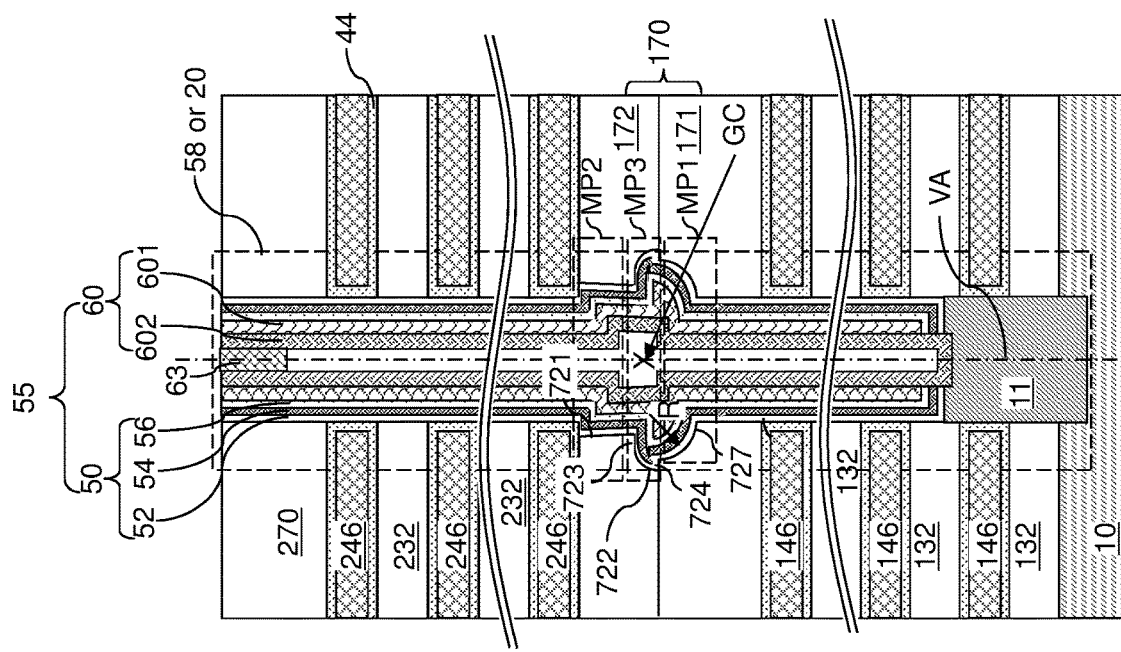
FIG. 22 is a vertical cross-sectional view of a region including a memory opening fill structure in the second exemplary structure after replacement of the sacrificial material layers with electrically conductive layers according to the second embodiment of the present disclosure.

FIG. 22 is a vertical cross-sectional view of a region including a memory opening fill structure 58 in the second exemplary structure at a processing step that corresponds to the processing step of FIG. 17.

Figure 23A:
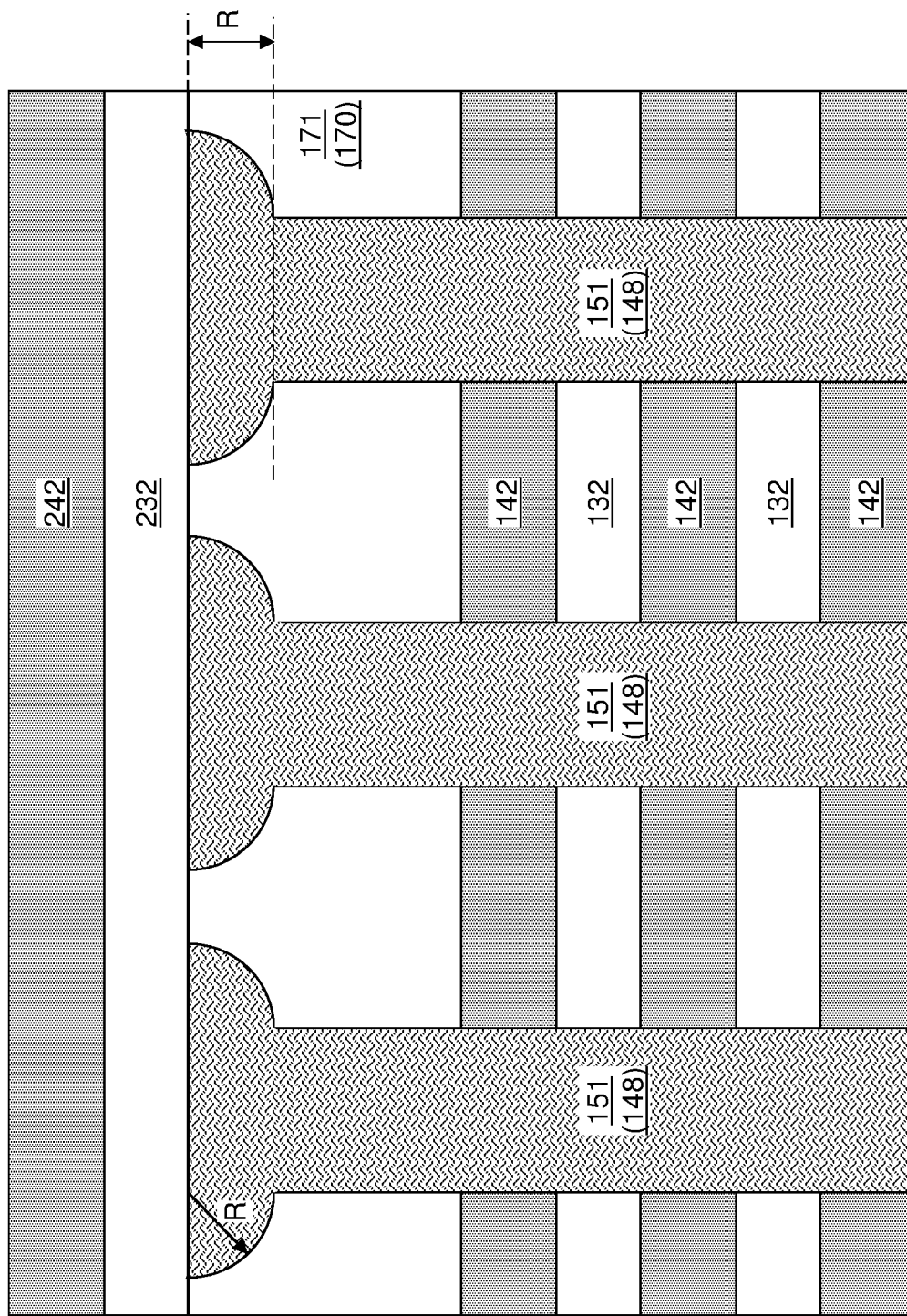
FIGS. 23A-23C are sequential vertical cross-sectional views of a region of a third exemplary structure during formation of inter-tier memory openings according to a third embodiment of the present disclosure.
Figure 23B:
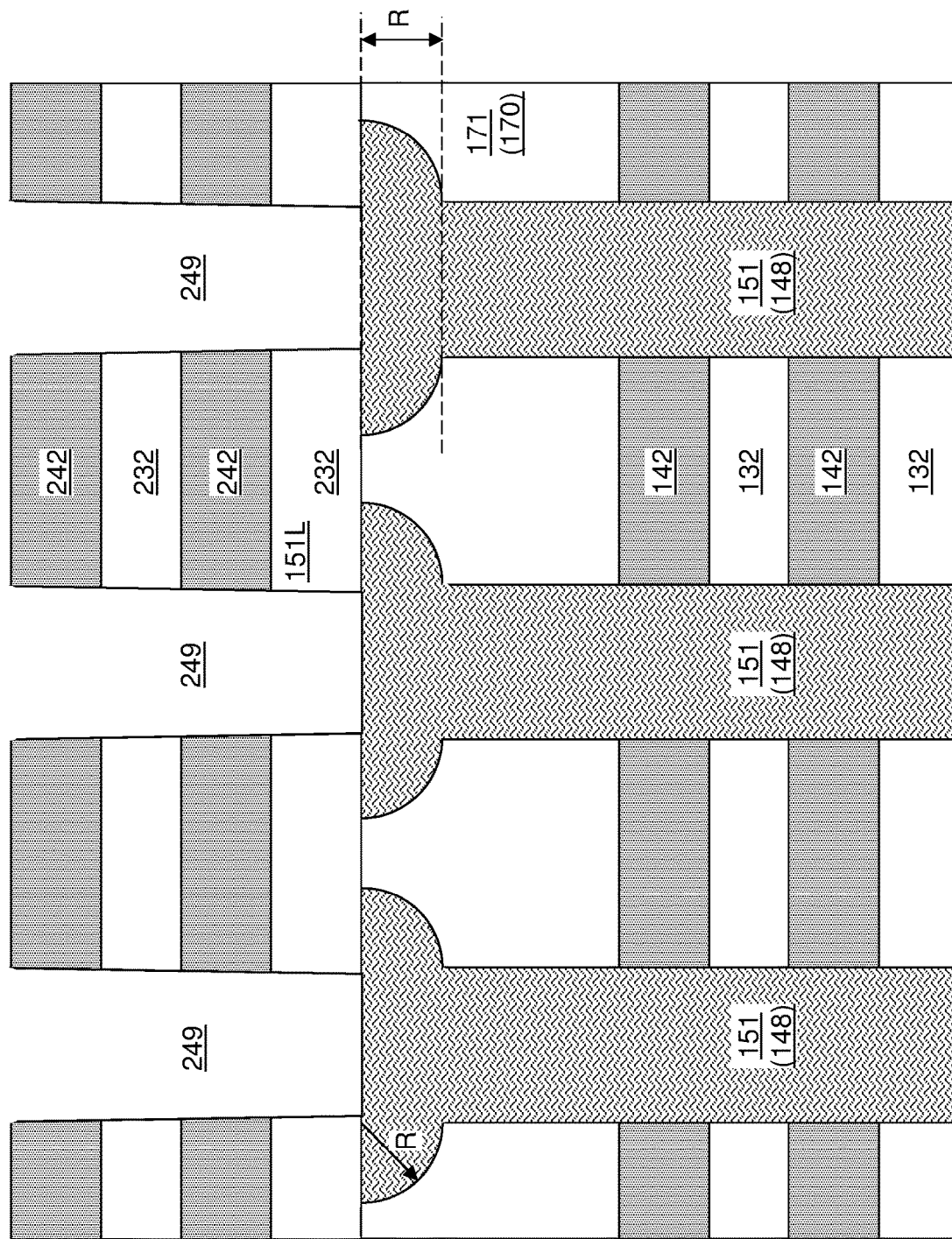
Figure 23C:
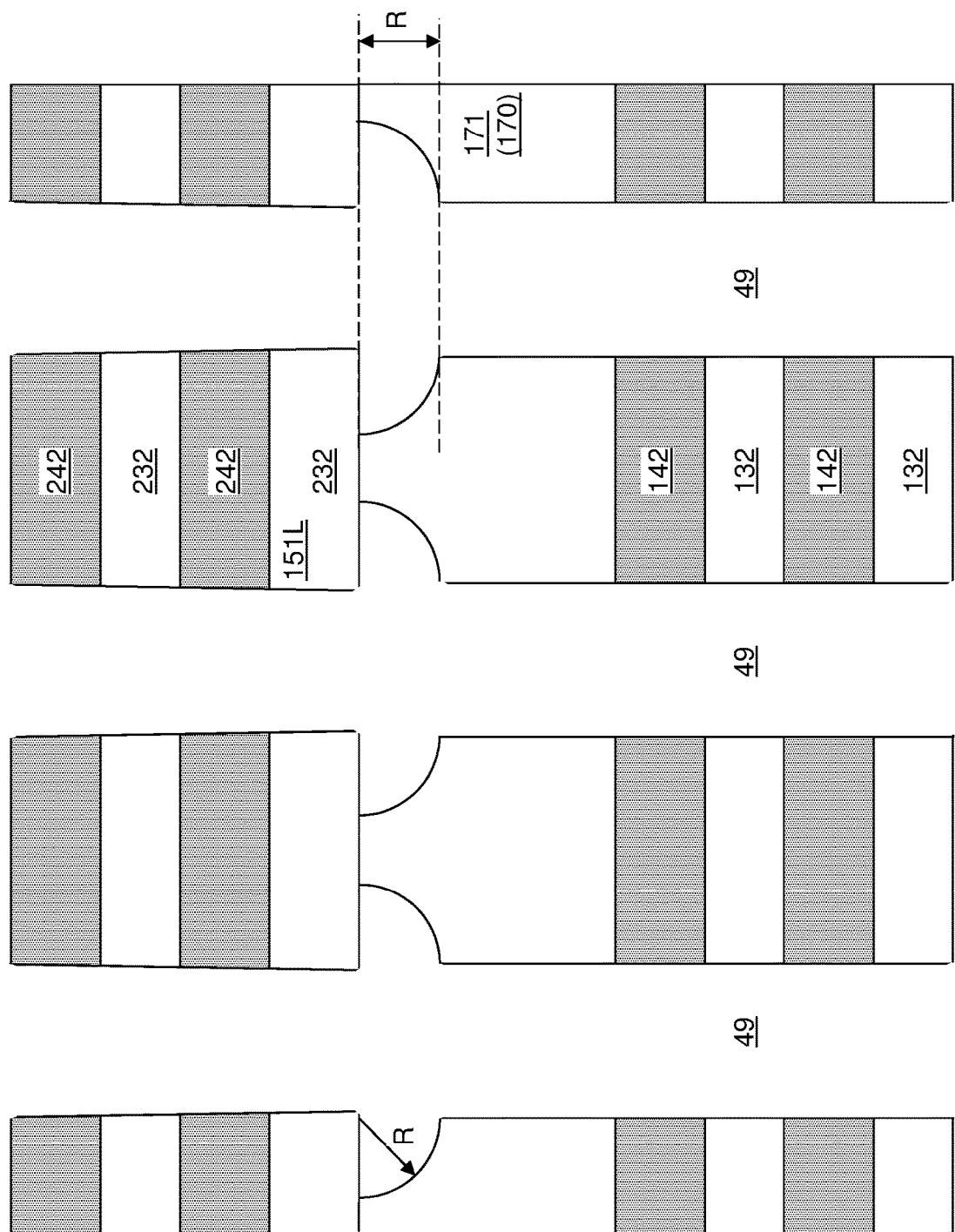

FIGS. 23A-23C are sequential vertical cross-sectional views of a region of a third exemplary structure during formation of inter-tier memory openings according to a third embodiment of the present disclosure. The third embodiment differs from the second embodiment by omitting the second inter-tier dielectric layer 172.

Referring to FIG. 23A, a third exemplary structure according to a third embodiment of the present disclosure can be derived from the second exemplary structure illustrated in FIG. 18F by performing the processing steps of FIG. 7 to form a second alternating stack (232, 242) and an insulating cap layer 270 on the first inter-tier dielectric layer 171 while omitting formation of the second inter-tier dielectric layer 172 on first inter-tier dielectric layer 171. In one embodiment, each of the sacrificial memory opening fill structures 148 may have a respective annular concave surface adjoined to a top periphery of a cylindrical vertical surface. In one embodiment, the entirety of the annular concave surface may have a uniform radius of curvature R.

Referring to FIG. 23B, the processing steps of FIGS. 8A and 8B can be performed with any needed changes to form second-tier memory openings 249 and the second-tier support openings 219. In this case, the etch chemistry and/or the duration of the anisotropic etch process employed to etch the second-tier memory openings 249 and the second-tier support openings 219 may be modified in view of the lack of metallic fill material portions 153. For example, the chemistry of the anisotropic etch process may be selective to the material of the sacrificial memory opening fill structures 148.

Referring to FIG. 23C, an isotropic etch process may be performed to remove the sacrificial memory opening fill structures 148. For example, if the sacrificial memory opening fill structures 148 comprise a semiconductor material such as amorphous silicon or polysilicon, the isotropic etch process may comprise a wet etch process employing hot trimethyl-2 hydroxyethyl ammonium hydroxide ("hot TMY") or tetramethyl ammonium hydroxide (TMAH).

FIGS. 24A-24H are sequential vertical cross-sectional views of an inter-tier memory opening in the third exemplary structure during formation of a memory opening fill structure according to the third embodiment of the present disclosure.

Referring to FIG. 24A, a memory opening in the third exemplary structure as formed at the processing steps of FIG. 23C is illustrated.

Referring to FIG. 24B, the processing steps of FIG. 11B can be performed to form a pedestal channel portion 11 at the bottom of each memory opening 49.

Referring to FIG. 24C, the processing steps of FIG. 11C can be performed to form a stack of layers including a blocking dielectric layer 52, a charge storage layer 54, a tunneling dielectric layer 56, and a first semiconductor channel material layer 601 in each memory openings 49.

Referring to FIG. 24D, the processing steps of FIG. 11D can be performed to remove horizontally-extending portions of the deposited material layers (52, 54, 56, 601).

Referring to FIG. 24E, the processing steps of FIG. 11E can be performed to form a second semiconductor channel material layer 602.

Referring to FIG. 24F, the processing steps of FIG. 11F can be performed to form a dielectric core layer 62L.

Referring to FIG. 24G, the processing steps of FIG. 11G can be performed to form a dielectric core 62 within each memory opening 49.

Referring to FIG. 24H, the processing steps of FIG. 11H can be performed to form a drain region 63 and a vertical semiconductor channel 60 within each memory opening 49. A memory opening fill structure 58 can be formed within the volume of each contiguous set of a first-tier memory opening 149 and a second-tier memory opening 249. The memory opening fill structure 58 can be located in the memory opening 49, and can comprise a memory film 50 and a vertical semiconductor channel 60.

In one embodiment, a first portion MP1 of the memory opening fill structure 58 laterally protrudes outward from a vertical axis VA passing through a geometrical center GC of the memory opening fill structure 58 more than a sidewall of a portion of the memory opening fill structure 58 located within the first alternating stack (132, 142). In one embodiment, a top periphery of a convex annular sidewall 727 of the first portion MP of the memory opening fill structure 58 is adjoined to a top surface of the first inter-tier dielectric layer 171. In one embodiment, a bottom periphery of the convex annular sidewall 727 of the first portion MP1 of the memory opening fill structure 58 is adjoined to a top periphery of a straight cylindrical sidewall 728 of the memory opening fill structure 58 that vertically extends through the first alternating stack (132, 142). In one embodiment, an entirety of the convex annular sidewall 727 of the first portion MP1 of the memory opening fill structure 58 has a uniform radius of curvature R that equals a vertical distance between a horizontal plane including the top periphery of the convex annular sidewall 727 of the first portion MP1 and a horizontal plane including the bottom periphery of the convex annular sidewall 727 of the first portion MP1.

In one embodiment, the first portion MP1 of the memory opening fill structure 58 comprises an annular planar top surface 729 that is located entirely within the horizontal plane including the top periphery of the convex annular sidewall 727 of the first portion MP1. In one embodiment, an inner periphery of the annular planar top surface 729 of the first portion MP1 of the memory opening fill structure 58 is adjoined to a bottom periphery of a straight sidewall segment of the memory opening fill structure 58 that vertically extends through each layer within the second alternating stack (132, 142). In one embodiment, the annular planar top surface 729 of the first portion MP1 of the memory opening fill structure 58 contacts a bottommost one of the second insulating layers 232.

Figure 25:
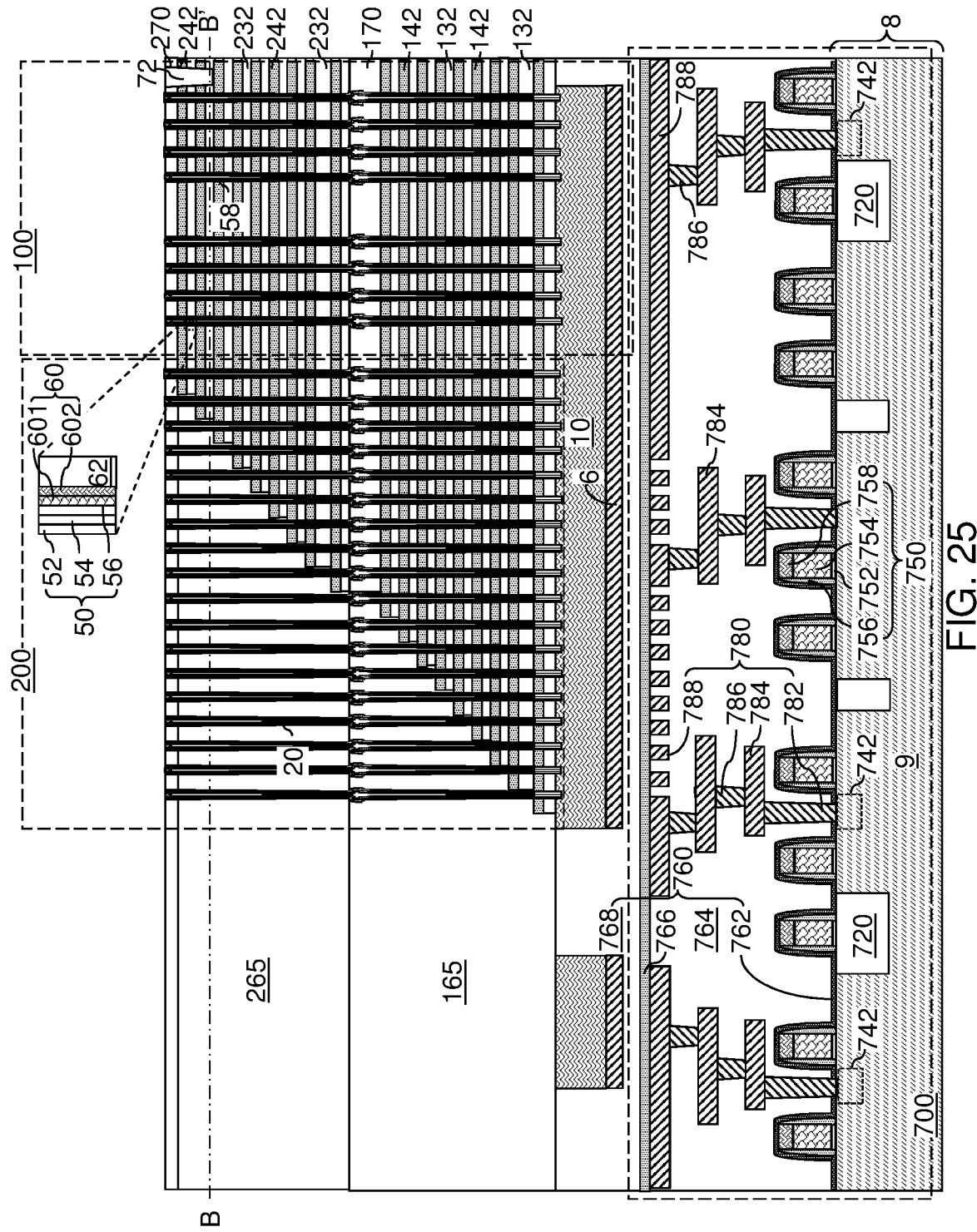
FIG. 25 is a vertical cross-sectional view of the third exemplary structure after formation of memory opening fill structures and support pillar structures according to the third embodiment of the present disclosure.

FIG. 25 is a vertical cross-sectional view of the third exemplary structure after formation of memory opening fill structures 58 and support pillar structures 20 after the processing steps of FIG. 24H.

Subsequently, the processing steps of FIGS. 13A and 13B, 14A-14C, 15A and 15B, 16A-16B, and 17 can be performed.

Figure 26:
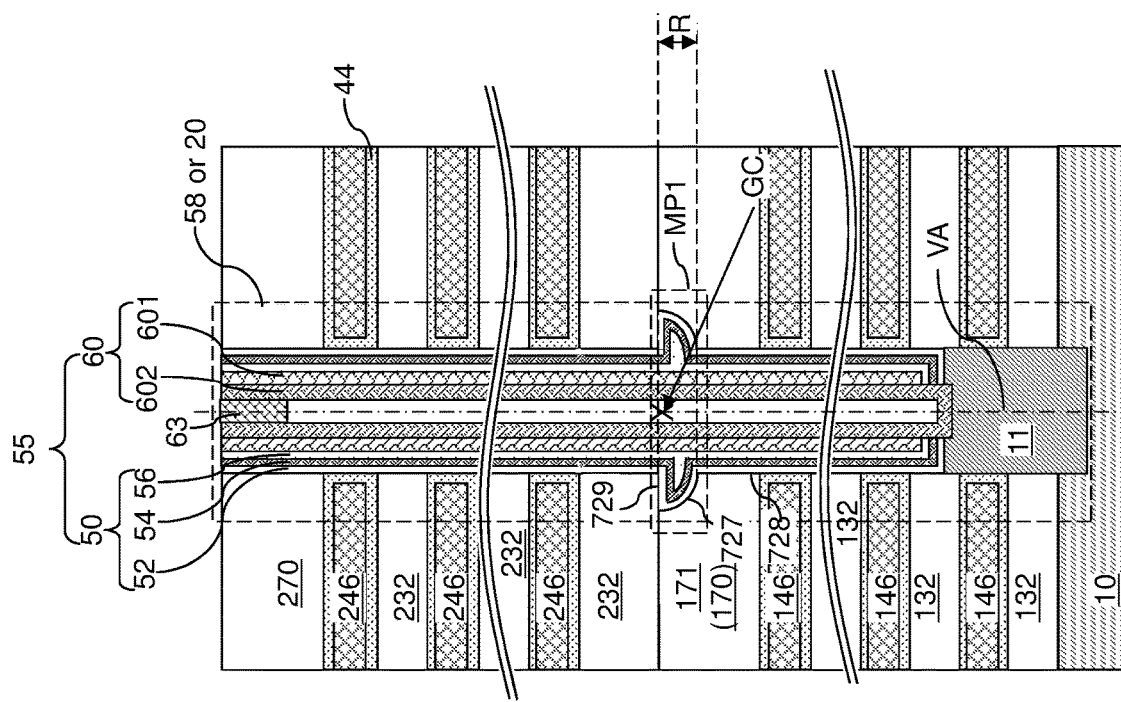
FIG. 26 is a vertical cross-sectional view of a region including a memory opening fill structure in the third exemplary structure after replacement of the sacrificial material layers with electrically conductive layers according to the third embodiment of the present disclosure.

FIG. 26 is a vertical cross-sectional view of a region including a memory opening fill structure 58 in the third exemplary structure at a processing step that corresponds to the processing step of FIG. 17.

Figure 27:
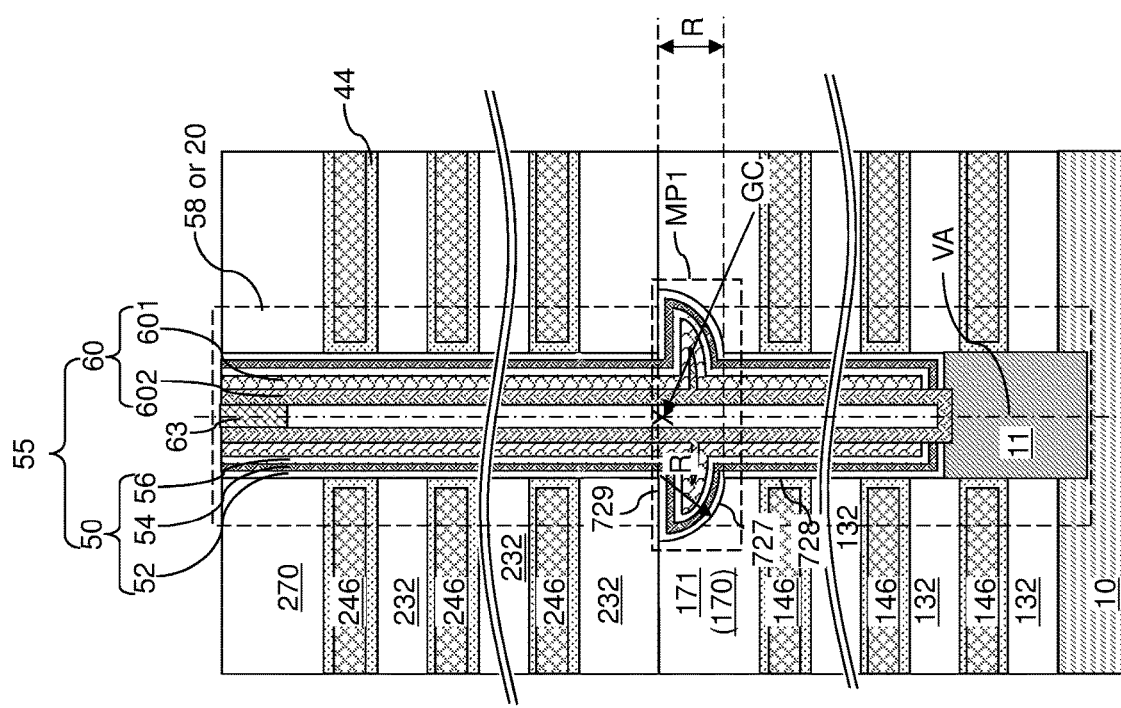
FIG. 27 is a vertical cross-sectional view of a region including a memory opening fill structure in an alternative configuration of the third exemplary structure after replacement of the sacrificial material layers with electrically conductive layers according to the third embodiment of the present disclosure.

FIG. 27 is a vertical cross-sectional view of a region including a memory opening fill structure 58 in an alternative configuration of the third exemplary structure at a processing step that corresponds to the processing step of FIG. 17. In the alternative configuration, the radius of curvature R may be greater than the thickness of the memory film 50, and may be greater than the sum of the thickness of the memory film 50 and the thickness of the first semiconductor channel material layer 601. In some embodiments, the radius of curvature R may be greater than the sum of the thickness of the memory film 50, the first semiconductor channel material layer 601, and the second semiconductor channel material layer 602. In this configuration, the vertical semiconductor channel 60 extends into the laterally protruding first portion MP1 of the memory opening fill structure 58 and has lateral protrusions 60P in the joint region. The lateral protrusions 60P have a convex tapered shape on the bottom adjoined to a flat horizontal surface on the top.

Figure 28A:
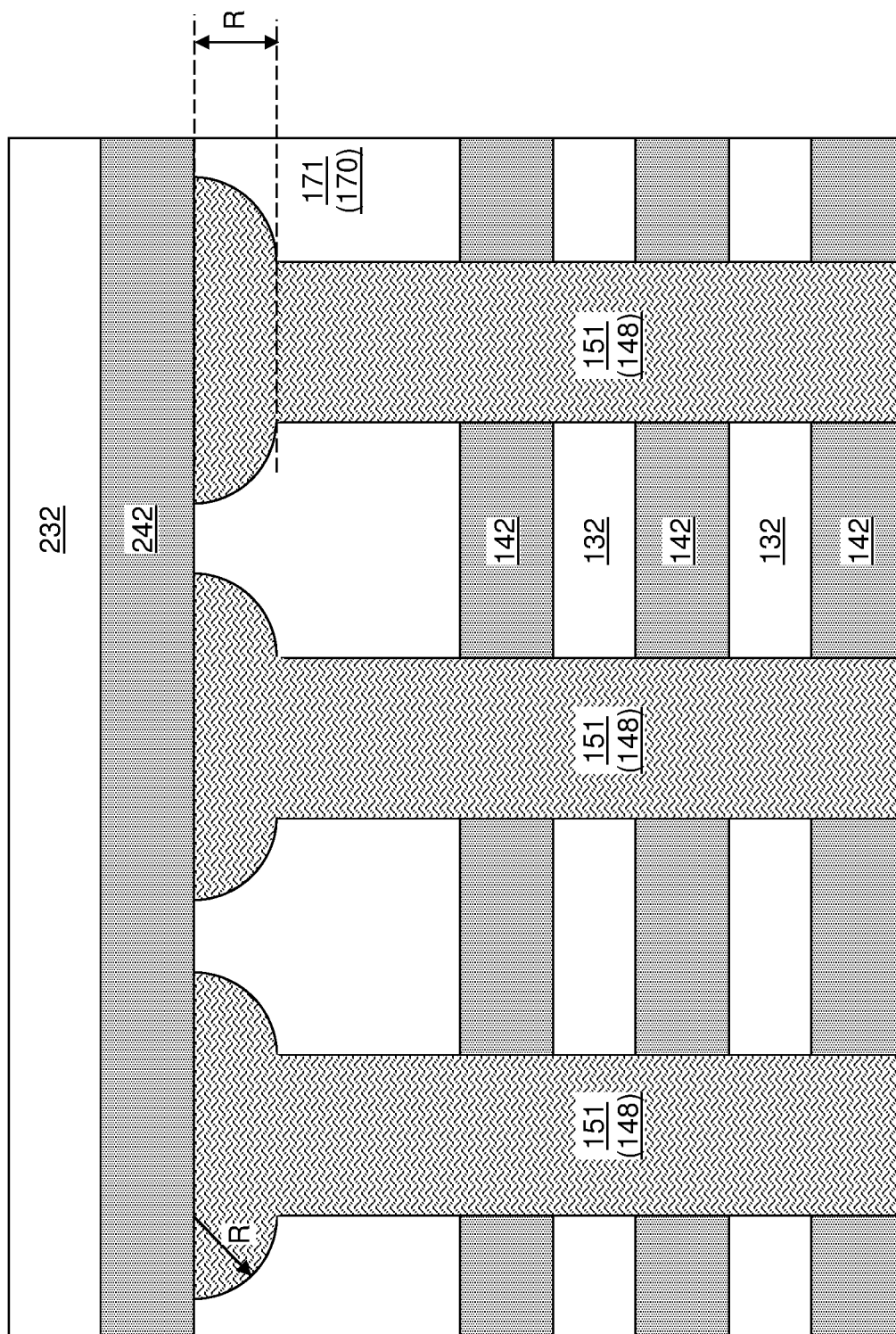
FIGS. 28A-28C are sequential vertical cross-sectional views of a region of a fourth exemplary structure during formation of inter-tier memory openings according to a fourth embodiment of the present disclosure.
Figure 28B:
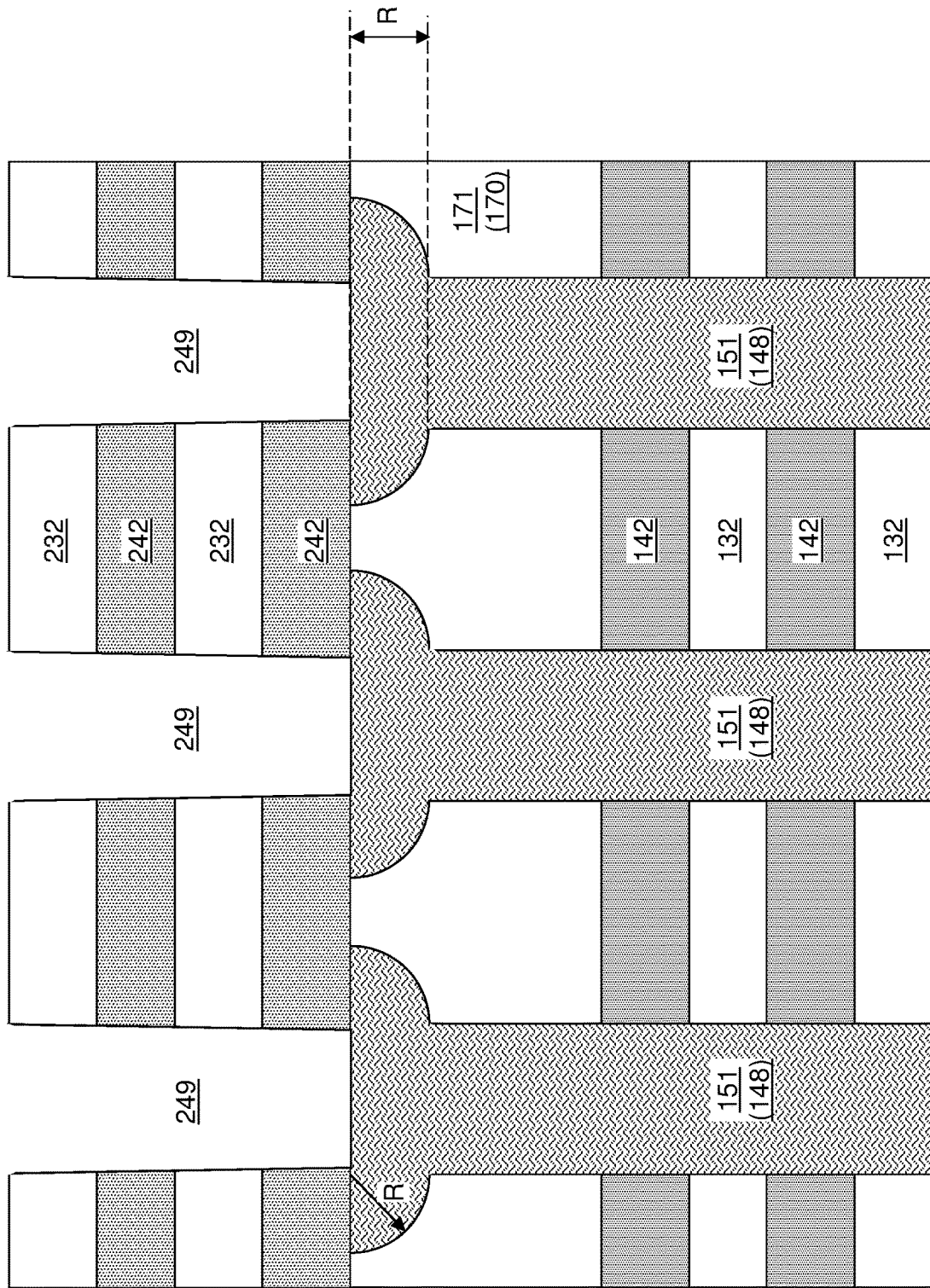
Figure 28C:
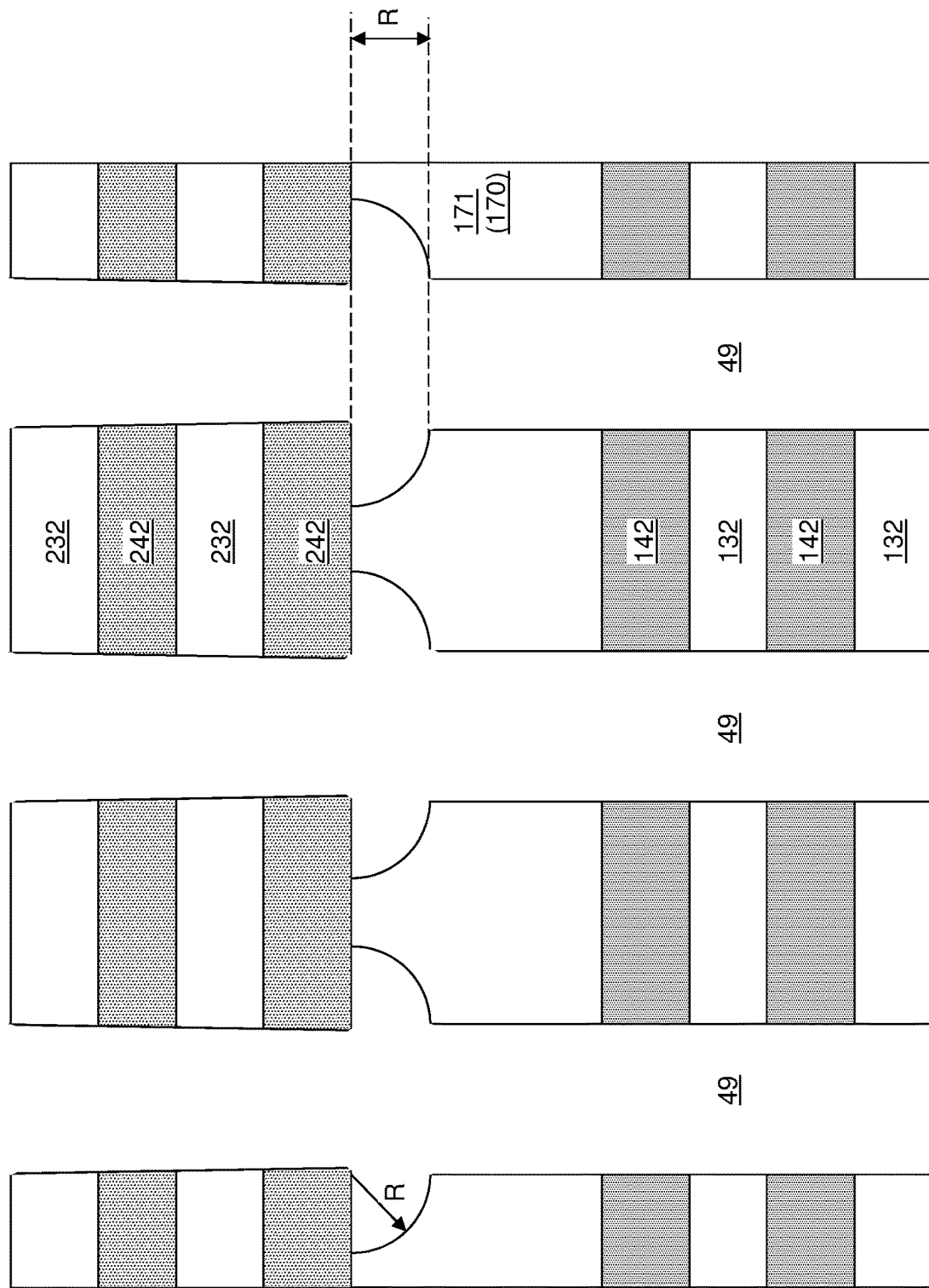

FIGS. 28A-28C are sequential vertical cross-sectional views of a region of a fourth exemplary structure during formation of inter-tier memory openings according to a fourth embodiment of the present disclosure.

Referring to FIG. 28A, a fourth exemplary structure according to a fourth embodiment of the present disclosure can be derived from the fourth exemplary structure illustrated in FIG. 23A by forming the second alternating stack (232, 242) such that the bottommost layer of the second alternating stack (232, 242) is a second sacrificial material layer 242. Thus, the bottommost second sacrificial layer 242 contacts the top surface of the first inter-tier dielectric layer 170 and the sacrificial memory opening fill structures 148. In one embodiment, each of the sacrificial memory opening fill structures 148 may have a respective annular concave surface adjoined to a top periphery of a cylindrical vertical surface. In one embodiment, the entirety of the annular concave surface may have a uniform radius of curvature R.

Referring to FIG. 28B, the processing steps of FIGS. 8A and 8B can be performed with any needed changes to form second-tier memory openings 249 and the second-tier support openings 219. In this case, the etch chemistry and/or the duration of the anisotropic etch process employed to etch the second-tier memory openings 249 and the second-tier support openings 219 may be modified in view of the lack of metallic fill material portions 153. For example, the chemistry of the anisotropic etch process may be selective to the material of the sacrificial memory opening fill structures 148.

Referring to FIG. 28C, an isotropic etch process may be performed to remove the sacrificial memory opening fill structures 148. For example, if the sacrificial memory opening fill structures 148 comprise a semiconductor material such as amorphous silicon or polysilicon, the isotropic etch process may comprise a wet etch process employing hot trimethyl-2 hydroxyethyl ammonium hydroxide ("hot TMY") or tetramethyl ammonium hydroxide (TMAH).

FIGS. 29A-29H are sequential vertical cross-sectional views of an inter-tier memory opening in the fourth exemplary structure during formation of a memory opening fill structure according to the fourth embodiment of the present disclosure.

Referring to FIG. 29A, a memory opening in the fourth exemplary structure as formed at the processing steps of FIG. 28C is illustrated.

Referring to FIG. 29B, the processing steps of FIG. 11B can be performed to form a pedestal channel portion 11 at the bottom of each memory opening 49.

Referring to FIG. 29C, the processing steps of FIG. 11C can be performed to form a stack of layers including a blocking dielectric layer 52, a charge storage layer 54, a tunneling dielectric layer 56, and a first semiconductor channel material layer 601 in each memory openings 49.

Referring to FIG. 29D, the processing steps of FIG. 11D can be performed to remove horizontally-extending portions of the deposited material layers (52, 54, 56, 601).

Referring to FIG. 29E, the processing steps of FIG. 11E can be performed to form a second semiconductor channel material layer 602.

Referring to FIG. 29F, the processing steps of FIG. 11F can be performed to form a dielectric core layer 62L.

Referring to FIG. 29G, the processing steps of FIG. 11G can be performed to form a dielectric core 62 within each memory opening 49.

Referring to FIG. 29H, the processing steps of FIG. 11H can be performed to form a drain region 63 and a vertical semiconductor channel 60 within each memory opening 49. A memory opening fill structure 58 can be formed within the volume of each contiguous set of a first-tier memory opening 149 and a second-tier memory opening 249. The memory opening fill structure 58 can be located in the memory opening 49, and can comprise a memory film 50 and a vertical semiconductor channel 60.

In one embodiment, a first portion MP1 of the memory opening fill structure 58 laterally protrudes outward from a vertical axis VA passing through a geometrical center GC of the memory opening fill structure 58 more than a sidewall of a portion of the memory opening fill structure 58 located within the first alternating stack (132, 142). In one embodiment, a top periphery of a convex annular sidewall 727 of the first portion MP of the memory opening fill structure 58 is adjoined to a top surface of the first inter-tier dielectric layer 171. In one embodiment, a bottom periphery of the convex annular sidewall 727 of the first portion MP1 of the memory opening fill structure 58 is adjoined to a top periphery of a straight cylindrical sidewall 728 of the memory opening fill structure 58 that vertically extends through the first alternating stack (132, 142). In one embodiment, an entirety of the convex annular sidewall 727 of the first portion MP1 of the memory opening fill structure 58 has a uniform radius of curvature R that equals a vertical distance between a horizontal plane including the top periphery of the convex annular sidewall 727 of the first portion MP1 and a horizontal plane including the bottom periphery of the convex annular sidewall 727 of the first portion MP1.

In one embodiment, the first portion MP1 of the memory opening fill structure 58 comprises an annular planar top surface 729 that is located entirely within the horizontal plane including the top periphery of the convex annular sidewall 727 of the first portion MP1. In one embodiment, an inner periphery of the annular planar top surface 729 of the first portion MP1 of the memory opening fill structure 58 is adjoined to a bottom periphery of a straight sidewall segment of the memory opening fill structure 58 that vertically extends through each layer within the second alternating stack (132, 142). In one embodiment, the annular planar top surface 729 of the first portion MP1 of the memory opening fill structure 58 contacts a bottommost one of the second sacrificial material layers 242.

Figure 30:
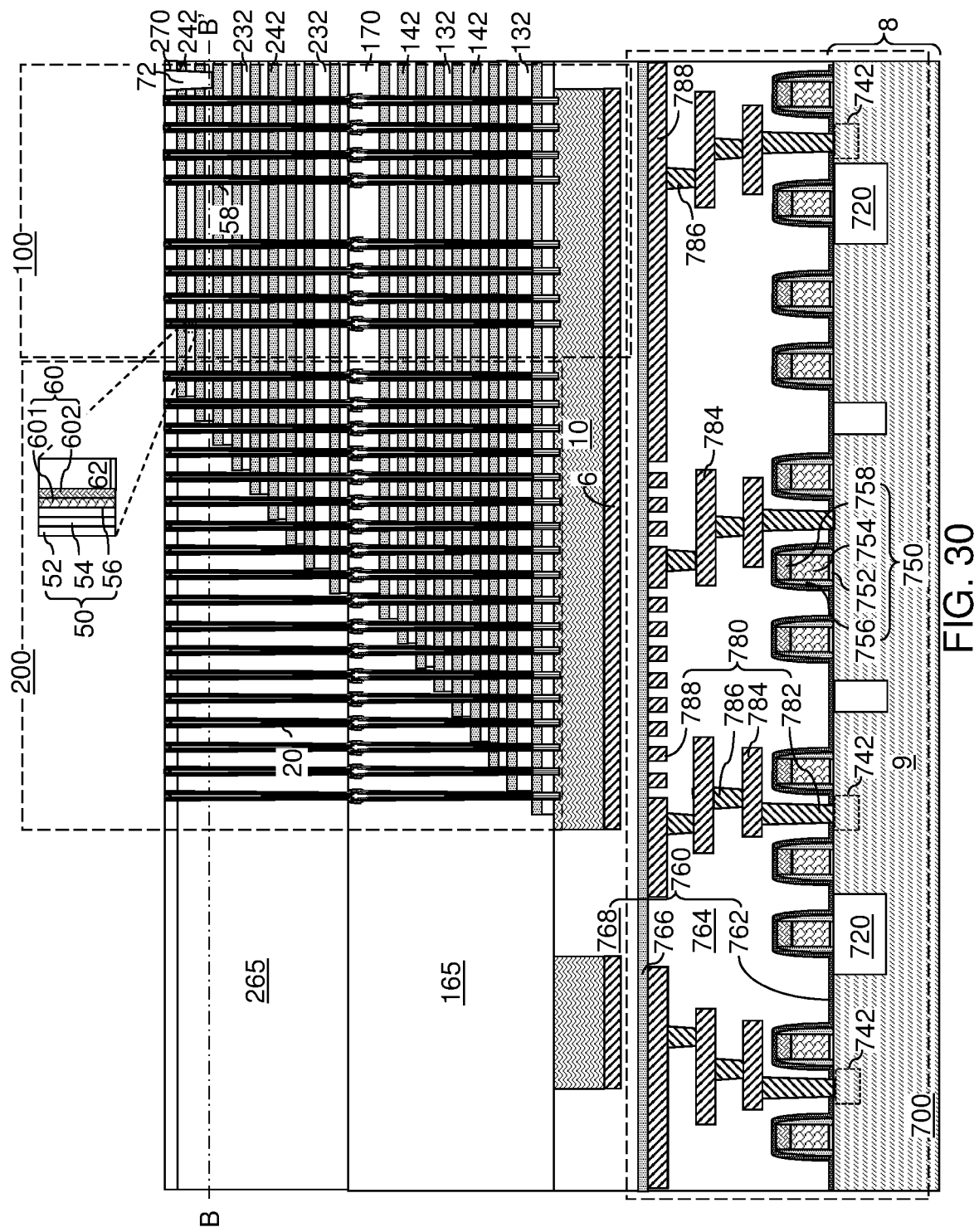
FIG. 30 is a vertical cross-sectional view of the fourth exemplary structure after formation of memory opening fill structures and support pillar structures according to the fourth embodiment of the present disclosure.

FIG. 30 is a vertical cross-sectional view of the fourth exemplary structure after formation of memory opening fill structures 58 and support pillar structures 20 after the processing steps of FIG. 29H.

Subsequently, the processing steps of FIGS. 13A and 13B, 14A-14C, 15A and 15B, 16A-16B, and 17 can be performed.

Figure 31:
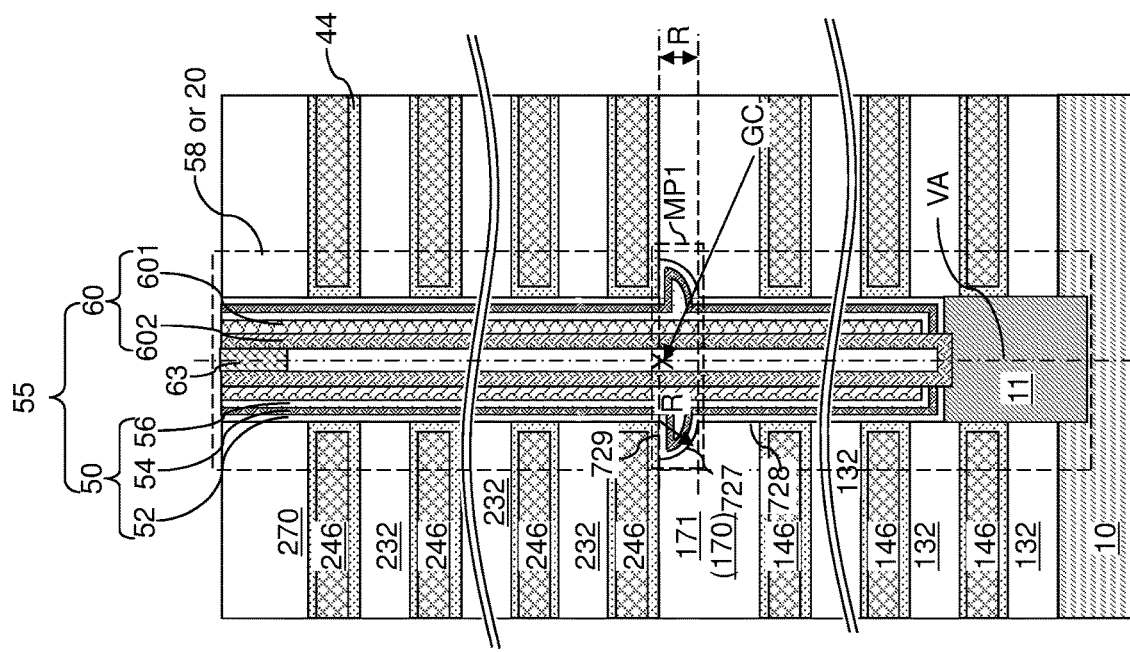
FIG. 31 is a vertical cross-sectional view of a region including a memory opening fill structure in the fourth exemplary structure after replacement of the sacrificial material layers with electrically conductive layers according to the fourth embodiment of the present disclosure.

FIG. 31 is a vertical cross-sectional view of a region including a memory opening fill structure 58 in the fourth exemplary structure at a processing step that corresponds to the processing step of FIG. 17. In one embodiment, the annular planar top surface of the first portion MP1 of the memory opening fill structure 58 contacts a backside blocking dielectric layer 44 embedding a bottommost one of the second electrically conductive layers 246.

Figure 32:
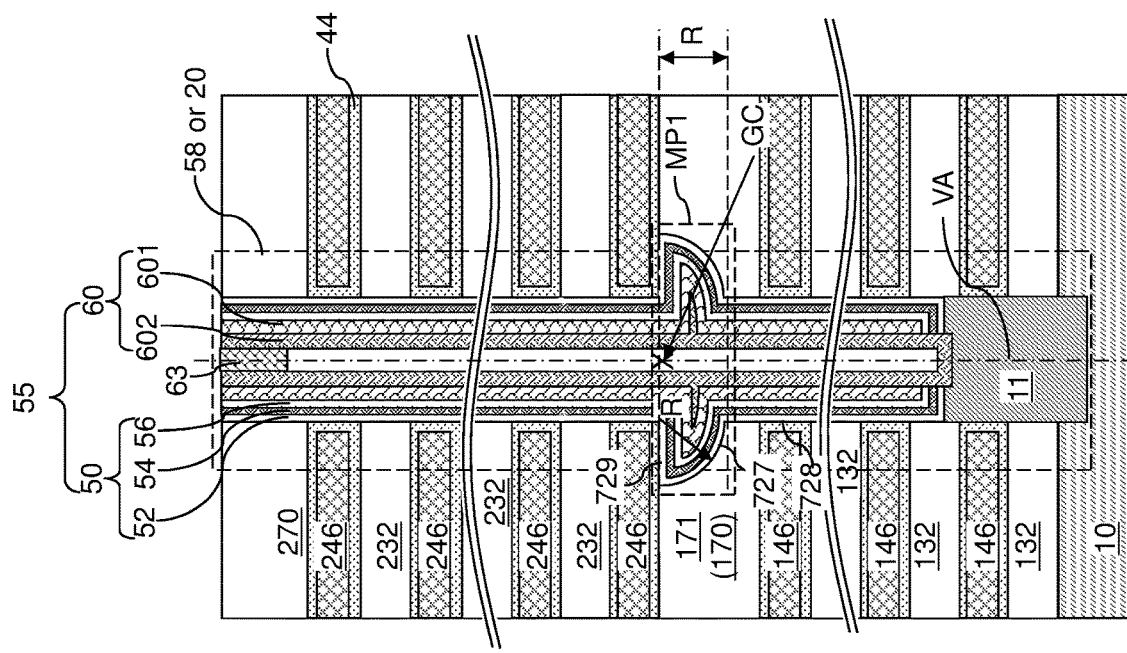
FIG. 32 is a vertical cross-sectional view of a region including a memory opening fill structure in a first alternative configuration of the fourth exemplary structure after replacement of the sacrificial material layers with electrically conductive layers according to the fourth embodiment of the present disclosure.

FIG. 32 is a vertical cross-sectional view of a region including a memory opening fill structure 58 in a first alternative configuration of the fourth exemplary structure at a processing step that corresponds to the processing step of FIG. 17. In the alternative configuration, the radius of curvature R may be greater than the thickness of the memory film 50, and may be greater than the sum of the thickness of the memory film 50 and the thickness of the first semiconductor channel material layer 601. In some embodiments, the radius of curvature R may be greater than the sum of the thickness of the memory film 50, the first semiconductor channel material layer 601, and the second semiconductor channel material layer 602. In this configuration, the vertical semiconductor channel 60 extends into the laterally protruding first portion MP1 of the memory opening fill structure 58 and has lateral protrusions 60P in the joint region. The lateral protrusions 60P have a convex tapered shape on the bottom adjoined to a flat horizontal surface on the top.

Figure 33:
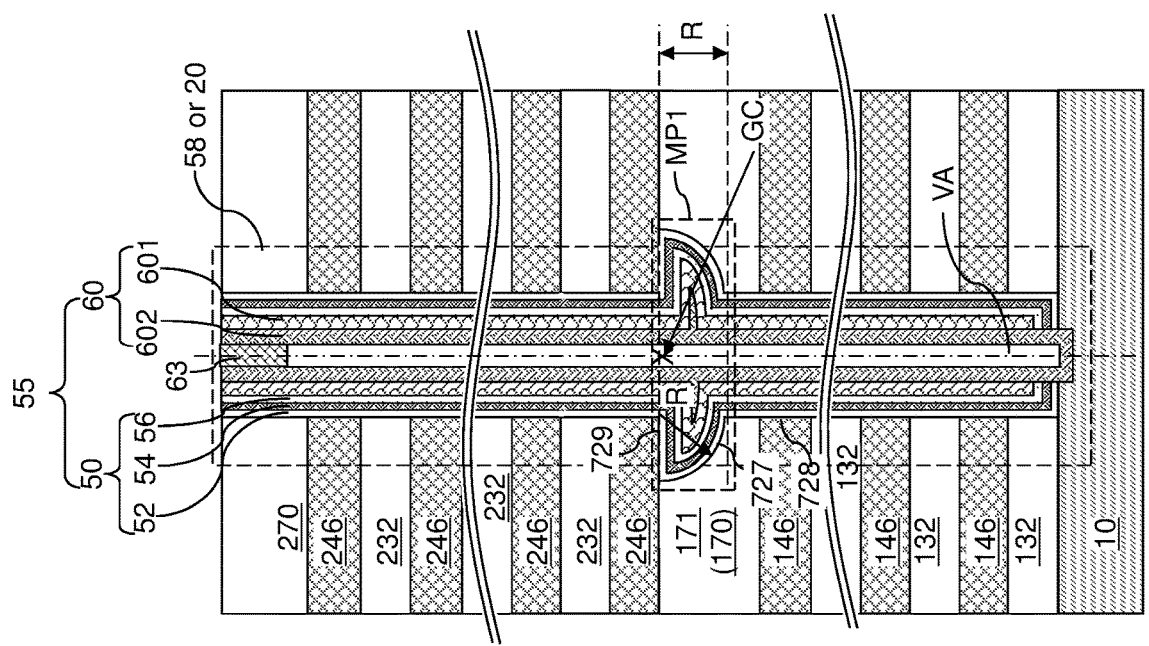
FIG. 33 is a vertical cross-sectional view of a region including a memory opening fill structure in a second alternative configuration of the fourth exemplary structure after replacement of the sacrificial material layers with electrically conductive layers according to the fourth embodiment of the present disclosure.

FIG. 33 is a vertical cross-sectional view of a region including a memory opening fill structure 58 in a second alternative configuration of the fourth exemplary structure at a processing step that corresponds to the processing step of FIG. 17. In this configuration, the backside blocking dielectric layers 44 and the pedestal channel portions 11 are omitted. The annular planar top surface 729 of the first portion MP1 of each memory opening fill structure 58 contact the bottommost one of the second electrically conductive layers 248.

The methods of the second, third and fourth embodiments reduce the number of steps used to form the discrete cavities 139 compared to the method of the first embodiment.

Referring to FIGS. 1 to 22 and according to the first and second embodiments of the present disclosure, a memory device is provided, which comprises: a first alternating stack (132, 146) of first insulating layers 132 and first electrically conductive layers 146; a layer stack of a first inter-tier dielectric layer 171 and a second inter-tier dielectric layer 172 located over the first alternating stack (132, 146); a second alternating stack (232, 246) of second insulating layers 232 and second electrically conductive layers 246 located over the second inter-tier dielectric layer 172; a memory opening 49 vertically extending through the second alternating stack (232, 246), the second inter-tier dielectric layer 172, the first inter-tier dielectric layer 171, and the first alternating stack (132, 146); and a memory opening fill structure 58 located in the memory opening 49 and comprising a memory film 150 and a vertical semiconductor channel 60. A first portion MP1 of the memory opening fill structure 58 located in an upper portion of the first inter-tier dielectric layer 171 laterally protrudes outward from a vertical axis VA passing through a geometrical center GC of the memory opening fill structure 58 more than a sidewall of a portion of the memory opening fill structure 58 located within the first alternating stack (132, 146); and a second portion MP2 of the memory opening fill structure 58 located in an upper portion of the second inter-tier dielectric layer 172 comprises a cylindrical sidewall 721 that is laterally offset from the vertical axis VA by a greater lateral distance than a bottom periphery of a sidewall of a portion of the memory opening fill structure 58 located within the second alternating stack (232, 246).

In one embodiment, a third portion MP3 of the memory opening fill structure 58 located in a lower portion of the second inter-tier dielectric layer 172 laterally protrudes from a bottom periphery of the second portion MP2 of the memory opening fill structure 58 and comprises a planar annular bottom surface 724 that contacts an annular segment of a top surface of the first inter-tier dielectric layer 171.

In one embodiment, an outer periphery of the planar annular bottom surface 724 of the third portion MP3 of the memory opening fill structure 58 is laterally offset from the vertical axis VA by a greater lateral offset distance than a maximum lateral offset distance of the first portion MP1 of the memory opening fill structure 58 from the vertical axis VA.

In one embodiment, the third portion MP3 of the memory opening fill structure 58 comprises: a convex annular surface 722 having a bottom periphery that is adjoined to an outer periphery of the planar annular bottom surface 724 of the third portion MP3 of the memory opening fill structure 58; and a planar annular surface 723 having an outer periphery that is adjoined to an inner periphery of the convex annular surface 722 of the third portion MP3 of the memory opening fill structure 58 and having an inner periphery that is adjoined to a bottom periphery of the cylindrical sidewall 721 of the second portion MP2 of the memory opening fill structure 58.

In one embodiment, a vertical offset distance between the planar annular surface 723 of the third portion MP3 of the memory opening fill structure 58 and a horizontal plane including an interface between the first inter-tier dielectric layer 171 and the second inter-tier dielectric layer 172 is the same as a lateral offset distance between the cylindrical sidewall 721 of the second portion MP2 of the memory opening fill structure 58 and a bottom periphery of the portion of the memory opening fill structure 58 located within the second alternating stack (232, 246) within a horizontal plane including a top surface of the second inter-tier dielectric layer 172.

In one embodiment, the first inter-tier dielectric layer 171 comprises a first silicon oxide material; the second inter-tier dielectric layer 172 comprises a second silicon oxide material; and an etch rate of the second silicon oxide material in 100:1 dilute hydrofluoric acid at room temperature is greater than an etch rate of the first silicon oxide material in the 100:1 dilute hydrofluoric acid at room temperature (e.g., by a factor in a range from 2 to 1,000).

According to the second through fourth embodiments and FIGS. 18A to 33 of the present disclosure, a memory device is provided, which comprises: a first alternating stack (132, 146) of first insulating layers 132 and first electrically conductive layers 146; at least one inter-tier dielectric layer 170 located over the first alternating stack (132, 146); a second alternating stack (232, 246) of second insulating layers 232 and second electrically conductive layers 246 located over the at least one inter-tier dielectric layer 170; a memory opening 49 vertically extending through the second alternating stack (232, 246), the at least one inter-tier dielectric layer 170, and the first alternating stack (132, 146); and a memory opening fill structure 58 located in the memory opening 49 and comprising a memory film 150 and a vertical semiconductor channel 60, wherein: a first portion MP1 of the memory opening fill structure 58 laterally protrudes outward from a vertical axis VA passing through a geometrical center GC of the memory opening fill structure 58 more than a sidewall of a portion of the memory opening fill structure 58 located within the first alternating stack (132, 146); and a top periphery of a convex annular sidewall 727 of the first portion MP1 of the memory opening fill structure 58 is adjoined to a top surface of one of the at least one inter-tier dielectric layer 170 (such as a top surface of a first inter-tier dielectric layer 171 171); a bottom periphery of the convex annular sidewall 727 of the first portion MP1 of the memory opening fill structure 58 is adjoined to a top periphery of a straight cylindrical sidewall 728 of the memory opening fill structure 58 that vertically extends through the first alternating stack (132, 146); and an entirety of the convex annular sidewall 727 of the first portion MP1 of the memory opening fill structure 58 has a uniform radius of curvature R that equals a vertical distance between a horizontal plane including the top periphery of the convex annular sidewall 727 of the first portion MP1 and a horizontal plane including the bottom periphery of the convex annular sidewall 727 of the first portion MP1.

In one embodiment, the first portion MP1 of the memory opening fill structure 58 comprises an annular planar top surface 729 that is located entirely within the horizontal plane including the top periphery of the convex annular sidewall 727 of the first portion MP1.

In one embodiment, an inner periphery of the annular planar top surface 729 of the first portion MP1 of the memory opening fill structure 58 is adjoined to a bottom periphery of a straight sidewall segment of the memory opening fill structure 58 that vertically extends through each layer within the second alternating stack (232, 246).

In one embodiment, the annular planar top surface 729 of the first portion MP1 of the memory opening fill structure 58 contacts a backside blocking dielectric layer 44 embedding a bottommost one of the second electrically conductive layers 246, or contacts the bottommost one of the second electrically conductive layers 246.

In one embodiment, the annular planar top surface 729 of the first portion MP1 of the memory opening fill structure 58 contacts a bottommost one of the second insulating layers 232.

In one embodiment, the at least one inter-tier dielectric layer 170 comprises a layer stack of a first inter-tier dielectric layer 171 and a second inter-tier dielectric layer 172; the first portion MP1 of the memory opening fill structure 58 laterally protrudes into an upper portion of the first inter-tier dielectric layer 171; and a second portion MP2 of the memory opening fill structure 58 located in an upper portion of the second inter-tier dielectric layer 172 comprises a cylindrical sidewall 721 that is laterally offset from the vertical axis VA by a greater lateral distance than a sidewall of a portion of the memory opening fill structure 58 located within the second alternating stack (232, 246).

In one embodiment, a third portion MP3 of the memory opening fill structure 58 located in a lower portion of the second inter-tier dielectric layer 172 laterally protrudes from a bottom periphery of the second portion MP2 of the memory opening fill structure 58 and comprises a planar annular bottom surface 724 that contacts an annular segment of a top surface of the first inter-tier dielectric layer 171.

The various embodiments of the present disclosure facilitate formation of inter-tier memory openings 49 having a laterally expanded, tapered (e.g., rounded) joint region at the level of the at least one inter-tier dielectric layer 170. For example, in the first embodiment, the metallic fill material portion 153 can facilitate decrease or avoidance of carbon containing etch residue generated during formation of the second-tier memory openings 249. Further, isotropic recessing of the second inter-tier dielectric layer 172 can decrease damage to vertical semiconductor channels in the joint region. In another example, in the second through fourth embodiments, use of an isotropic etch process to form discrete cavities having a uniform radius of curvature (R or R') prior to formation of cylindrical portions of the first-tier memory openings 149 may be advantageously employed to form the sacrificial memory opening fill structures 148 employing a single sacrificial material deposition step. The various embodiments of the present disclosure may be employed alone or in combination.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a memory device, comprising:
   forming a first alternating stack of first insulating layers and first sacrificial material layers over a substrate;
   forming a first inter-tier dielectric layer over the first alternating stack;
   forming a first-tier memory opening through the first alternating stack;
   forming a sacrificial memory opening fill structure in the first-tier memory opening, wherein the sacrificial memory opening fill structure comprises a semiconductor fill material portion and a metallic fill material portion;
   forming a second inter-tier dielectric layer over the first inter-tier dielectric layer and the sacrificial memory opening fill structure;
   forming a second alternating stack of second insulating layers and second sacrificial material layers over the first inter-tier dielectric layer;
   forming a second-tier memory opening through the second alternating stack and exposing the metallic fill material portion;

removing the metallic fill material portion and the semiconductor fill material portion selective to the second alternating stack and the first alternating stack;

forming a memory opening fill structure in volumes of the second-tier memory opening and the first-tier memory opening; and forming a semiconductor oxide liner on a top surface of the semiconductor fill material portion prior to formation of the metallic fill material portion, wherein:

the semiconductor fill material portion is formed by depositing a semiconductor fill material in the first-tier memory opening and over the first inter-tier dielectric layer; and recessing the semiconductor fill material by performing an etch process, wherein a remaining portion of the semiconductor fill material comprises the semiconductor fill material portion;

a recess cavity is present over the top surface of the semiconductor fill material portion and underneath a horizontal plane including a top surface of the first inter-tier dielectric layer after the etch process;

the method further comprises laterally expanding the recess cavity by performing an additional etch process that etches a material of the first inter-tier dielectric layer selective to the semiconductor fill material portion;

the semiconductor oxide liner is formed by oxidation or oxidation of a surface portion of the semiconductor fill material portion;

the semiconductor fill material portion comprises amorphous silicon;

the metallic fill material portion comprises a refractory metal selected from W, Ta, Mo, or Nb;

the semiconductor oxide liner comprises silicon oxide; and the metallic fill material portion is formed over the semiconductor oxide liner and is spaced from the semiconductor fill material portion by the semiconductor oxide liner.

2. A method of forming a memory device, comprising:

forming a first alternating stack of first insulating layers and first sacrificial material layers over a substrate;

forming a first inter-tier dielectric layer over the first alternating stack;

forming a first-tier memory opening through the first alternating stack;

forming a sacrificial memory opening fill structure in the first-tier memory opening, wherein the sacrificial memory opening fill structure comprises a semiconductor fill material portion and a metallic fill material portion;

forming a second inter-tier dielectric layer over the first inter-tier dielectric layer and the sacrificial memory opening fill structure;

forming a second alternating stack of second insulating layers and second sacrificial material layers over the first inter-tier dielectric layer;

forming a second-tier memory opening through the second alternating stack and exposing the metallic fill material portion;

removing the metallic fill material portion and the semiconductor fill material portion selective to the second alternating stack and the first alternating stack; and forming a memory opening fill structure in volumes of the second-tier memory opening and the first-tier memory opening;

wherein:

the semiconductor fill material portion is formed by depositing a semiconductor fill material in the first-tier memory opening and over the first inter-tier dielectric layer; and recessing the semiconductor fill material by performing an etch process, wherein a remaining portion of the semiconductor fill material comprises the semiconductor fill material portion; and a recess cavity is present over a top surface of the semiconductor fill material portion and underneath a horizontal plane including a top surface of the first inter-tier dielectric layer after the etch process; and further comprising:

laterally expanding the recess cavity by performing an additional etch process that etches a material of the first inter-tier dielectric layer selective to the semiconductor fill material portion;

forming a semiconductor oxide liner on the top surface of the semiconductor fill material portion prior to formation of the metallic fill material portion;

performing a first isotropic etch process that etches a material of the metallic fill material portion selective to materials of the semiconductor oxide liner, the first inter-tier dielectric layer, the second inter-tier dielectric layer, the first alternating stack, and the second alternating stack;

performing a second isotropic etch process that etches the semiconductor oxide liner selective to a material of the semiconductor fill material portion, wherein the second isotropic etch process isotropically recesses physically exposed surfaces of the second inter-tier dielectric layer; and performing a third isotropic etch process that etches the material of the semiconductor fill material portion selective to the materials of the first inter-tier dielectric layer, the second inter-tier dielectric layer, the first alternating stack, and the second alternating stack.

3. The method of claim 2, wherein:

the first inter-tier dielectric layer comprises a first silicon oxide material;

the second inter-tier dielectric layer comprises a second silicon oxide material; and an etch rate of the second silicon oxide material during the second isotropic etch process is greater than an etch rate of the first silicon oxide material during the second isotropic etch process by a factor in a range from 2 to 1,000.

4. The method of claim 2, wherein physically exposed surfaces of the second inter-tier dielectric layer after the second isotropic etch process comprises:

a cylindrical sidewall that is laterally offset from a vertical axis passing through a geometrical center of the memory opening by a greater lateral distance than a bottom periphery of a sidewall of the second-tier memory opening;

a convex annular surface having a bottom periphery that is adjoined to the top surface of the first inter-tier dielectric layer; and a planar annular surface having an outer periphery that is adjoined to an inner periphery of the convex annular surface of the convex annular surface and having an inner periphery that is adjoined to a bottom periphery of the cylindrical sidewall.

5. A method of forming a memory device, comprising:

forming a first alternating stack of first insulating layers and first sacrificial material layers over a substrate;

forming a first inter-tier dielectric layer over the first alternating stack;

forming a first-tier memory opening through the first alternating stack;

forming a sacrificial memory opening fill structure in the first-tier memory opening, wherein the sacrificial memory opening fill structure comprises a semiconductor fill material portion and a metallic fill material portion;

forming a second inter-tier dielectric layer over the first inter-tier dielectric layer and the sacrificial memory opening fill structure;

forming a second alternating stack of second insulating layers and second sacrificial material layers over the first inter-tier dielectric layer;

forming a second-tier memory opening through the second alternating stack and exposing the metallic fill material portion;

removing the metallic fill material portion and the semiconductor fill material portion selective to the second alternating stack and the first alternating stack; and forming a memory opening fill structure in volumes of the second-tier memory opening and the first-tier memory opening;

wherein:

the memory opening fill structure comprises a memory film surrounding a vertical semiconductor channel;

a first portion of the memory opening fill structure located in an upper portion of the first inter-tier dielectric layer laterally protrudes outward from a vertical axis passing through a geometrical center of the memory opening fill structure more than a sidewall of a portion of the memory opening fill structure located within the first alternating stack;

a second portion of the memory opening fill structure located in an upper portion of the second inter-tier dielectric layer comprises a cylindrical sidewall that is laterally offset from the vertical axis by a greater lateral distance than a bottom periphery of a sidewall of a portion of the memory opening fill structure located within the second alternating stack;

a third portion of the memory opening fill structure located in a lower portion of the second inter-tier dielectric layer laterally protrudes from a bottom periphery of the second portion of the memory opening fill structure and comprises a planar annular bottom surface that contacts an annular segment of a top surface of the first inter-tier dielectric layer; and an outer periphery of the planar annular bottom surface of the third portion of the memory opening fill structure is laterally offset from the vertical axis by a greater lateral offset distance than a maximum lateral offset distance of the first portion of the memory opening fill structure from the vertical axis.

6. The method of claim 5, wherein the third portion of the memory opening fill structure comprises:

a convex annular surface having a bottom periphery that is adjoined to an outer periphery of the planar annular bottom surface of the third portion of the memory opening fill structure; and a planar annular surface having an outer periphery that is adjoined to an inner periphery of the convex annular surface of the third portion of the memory opening fill structure and having an inner periphery that is adjoined to a bottom periphery of the cylindrical sidewall of the second portion of the memory opening fill structure.

* * * * *